US010692884B2

United States Patent
Cui et al.

(10) Patent No.: US 10,692,884 B2
(45) Date of Patent: Jun. 23, 2020

(54) THREE-DIMENSIONAL MEMORY DEVICE INCLUDING BOTTLE-SHAPED MEMORY STACK STRUCTURES AND DRAIN-SELECT GATE ELECTRODES HAVING CYLINDRICAL PORTIONS

(71) Applicant: SANDISK TECHNOLOGIES LLC, Addison, TX (US)

(72) Inventors: Zhixin Cui, Yokkaichi (JP); Kiyohiko Sakakibara, Yokkaichi (JP); Shinsuke Yada, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/138,001

(22) Filed: Sep. 21, 2018

(65) Prior Publication Data

US 2020/0098780 A1 Mar. 26, 2020

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC ......... H01L 27/11582; H01L 27/11556; H01L 27/1157; H01L 27/11524
See application file for complete search history.

(56) References Cited

U.S. PATENT DOCUMENTS 5,915,167 A 6/1999 Leedy
9,177,966 B1 11/2015 Rabkin et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Younes Boulghassoul
(74) *Attorney, Agent, or Firm* — The Marbury Law Group PLLC

(57) ABSTRACT

A three-dimensional memory device includes an alternating stack of insulating layers and electrically conductive layers located over a substrate, drain-select-level gate electrodes located over the alternating stack, memory openings extending through the alternating stack and a respective one of the drain-select-level gate electrodes, and memory opening fill structures located in the memory openings. The memory opening fill structures can have a stepped profile to provide a smaller lateral dimension at the level of the drain-select-level gate electrodes than within the alternating stack. Each of the drain-select-level gate electrodes includes a planar portion having two sets of vertical sidewall segments, and a set of cylindrical portions vertically protruding upward from the planar portion and laterally surrounding a respective one of the memory opening fill structures. The memory opening fill structures can be formed on-pitch as a two-dimensional array.

14 Claims, 62 Drawing Sheets

(51) Int. Cl.

| | | |
|---|---|---|
| *H01L 27/11573* | (2017.01) | |
| *H01L 27/1157* | (2017.01) | |
| *H01L 29/423* | (2006.01) | |
| *H01L 27/11543* | (2017.01) | |
| *H01L 27/11556* | (2017.01) | |
| *H01L 27/11524* | (2017.01) | |
| *H01L 27/11519* | (2017.01) | |
| *H01L 21/28* | (2006.01) | |

(52) U.S. Cl.
CPC .. *H01L 27/11573* (2013.01); *H01L 29/40117* (2019.08); *H01L 29/4234* (2013.01); *H01L 27/11519* (2013.01); *H01L 27/11524* (2013.01); *H01L 27/11543* (2013.01); *H01L 27/11556* (2013.01)

(56) References Cited

U.S. PATENT DOCUMENTS

| | | | |
|---|---|---|---|
| 9,922,987 | B1 | 3/2018 | Mizutani et al. |
| 10,290,650 | B1* | 5/2019 | Iwai ................. H01L 27/11556 |
| 2011/0169072 | A1 | 7/2011 | Lim et al. |
| 2012/0231593 | A1* | 9/2012 | Joo ................... H01L 27/11556 438/264 |
| 2014/0138687 | A1* | 5/2014 | Lee .................... H01L 29/1054 257/51 |
| 2015/0123189 | A1* | 5/2015 | Sun ................... H01L 27/11556 257/321 |
| 2015/0140753 | A1* | 5/2015 | Simsek-Ege ........ H01L 27/1157 438/268 |
| 2016/0284730 | A1 | 9/2016 | Koka et al. |
| 2016/0307914 | A1 | 10/2016 | Sun et al. |
| 2017/0025421 | A1 | 1/2017 | Sakakibara et al. |
| 2017/0243886 | A1 | 8/2017 | Lee et al. |
| 2019/0326306 | A1* | 10/2019 | Mushiga ........... H01L 27/11556 |
| 2019/0326307 | A1* | 10/2019 | Mushiga ........... H01L 27/11524 |
| 2019/0326313 | A1* | 10/2019 | Cui .................. H01L 27/11519 |

OTHER PUBLICATIONS

Bassous, E. et al., "Highly Selective KOH Based Etchant for Boron Doped Silicon Structures," *Microelectronic Engineering*, vol. 9, pp. 167-170, (1989).
U.S. Appl. No. 15/704,286, filed Sep. 14, 2017, SanDisk Technologies LLC.
U.S. Appl. No. 15/784,549, dated Oct. 16, 2017, SanDisk Technologies LLC.
U.S. Appl. No. 15/818,061, dated Nov. 20, 2017, SanDisk Technologies LLC.
U.S. Appl. No. 15/818,146, dated Nov. 20, 2017, SanDisk Technologies LLC.
U.S. Appl. No. 15/888,714, dated Feb. 5, 2018, SanDisk Technologies LLC.
U.S. Appl. No. 15/906,109, dated Feb. 27, 2018, SanDisk Technologies LLC.
U.S. Appl. No. 16/023,289, dated Jun. 29, 2018, SanDisk Technologies LLC.
U.S. Appl. No. 16/023,866, dated Jun. 29, 2018, SanDisk Technologies LLC.
U.S. Appl. No. 16/024,048, dated Jun. 29, 2018, SanDisk Technologies LLC.
Notification of Transmittal of the International Search Report and Written Opinion of the International Search Authority for International Patent Application No. PCT/US2019/033607, dated Sep. 11, 2019, 9 pages.

* cited by examiner

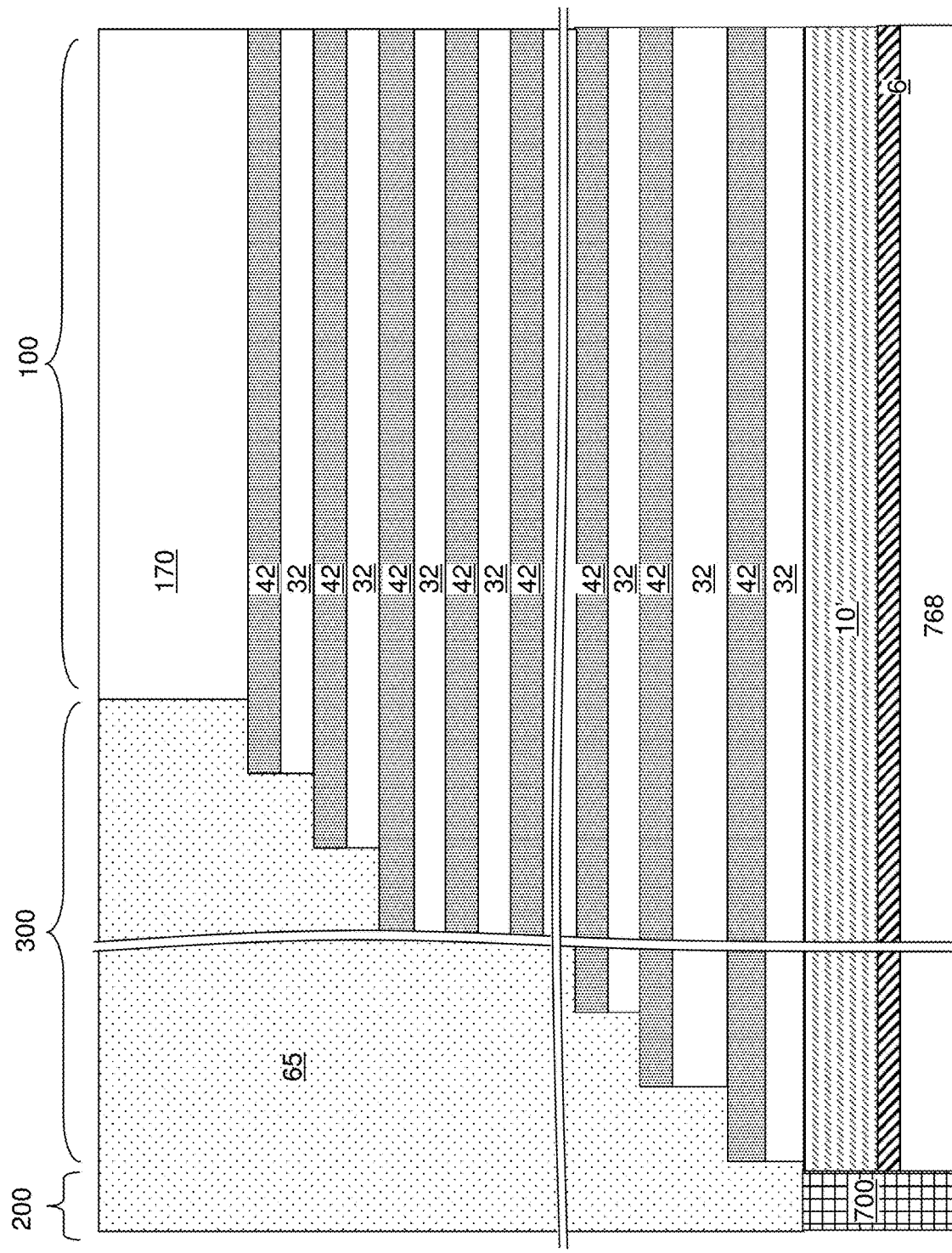

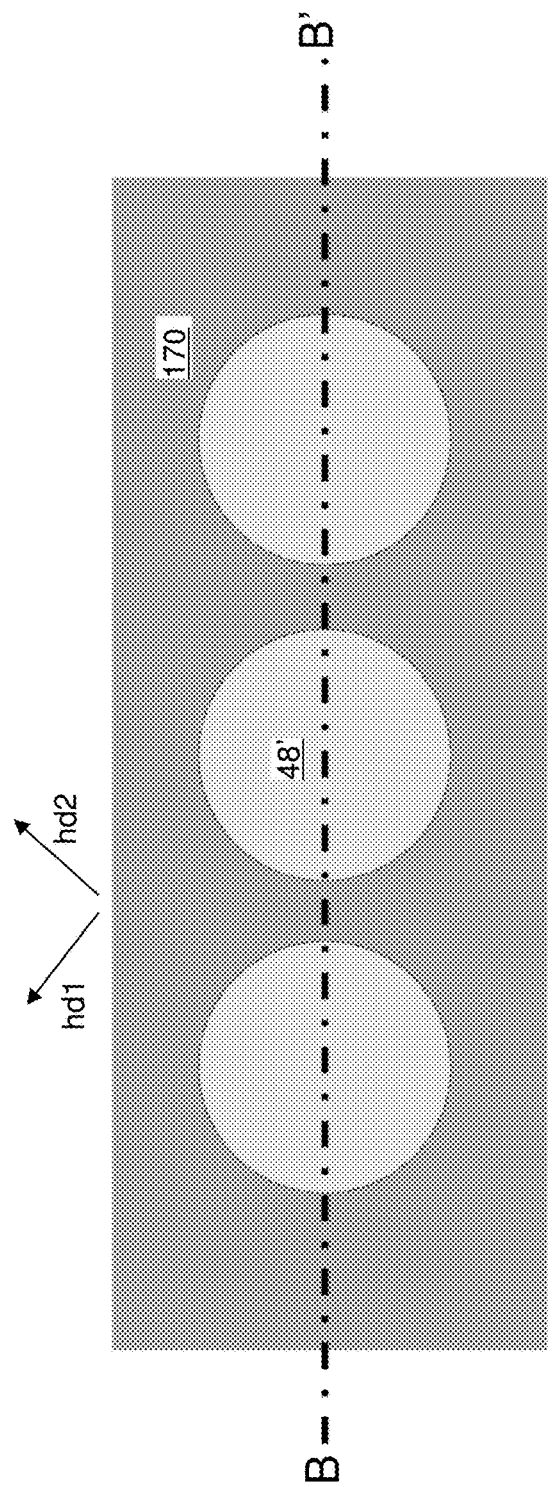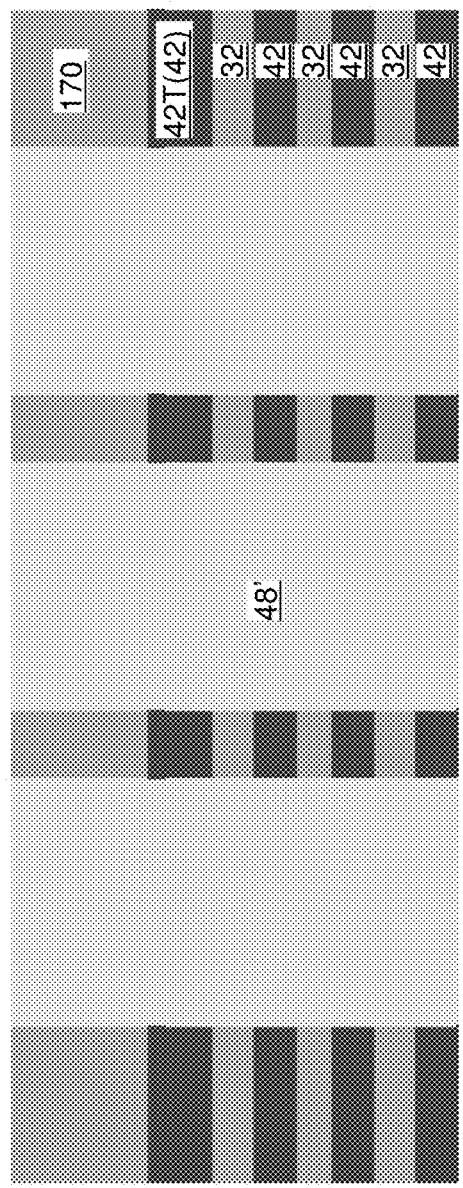

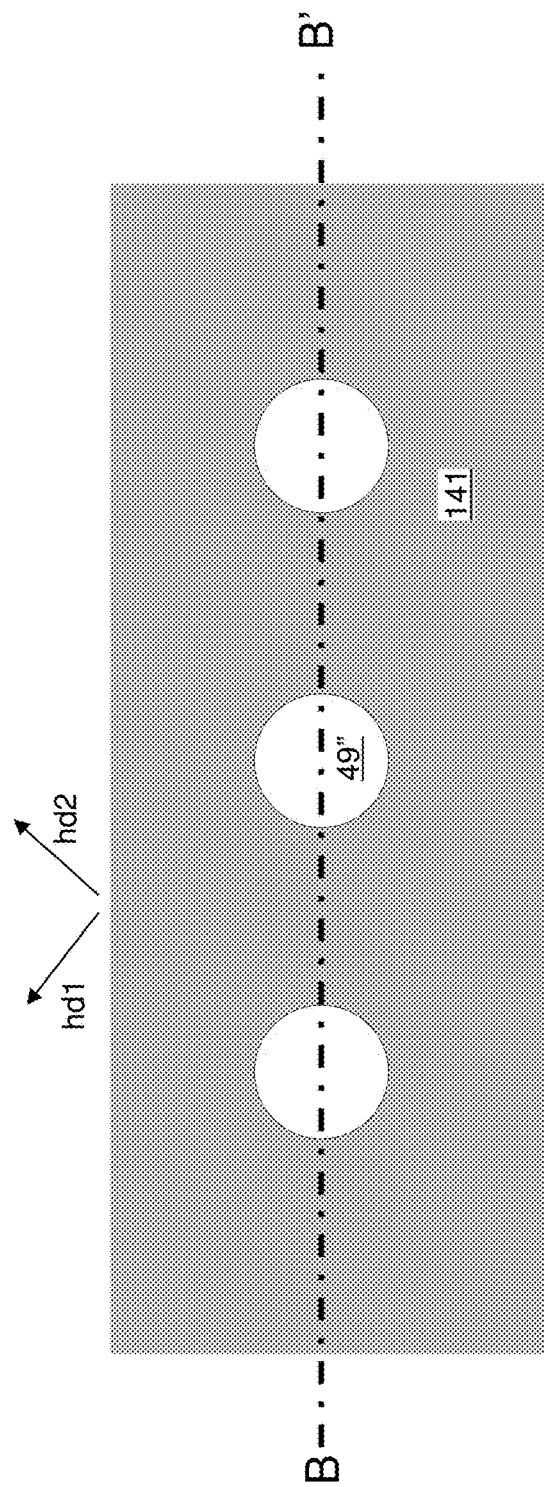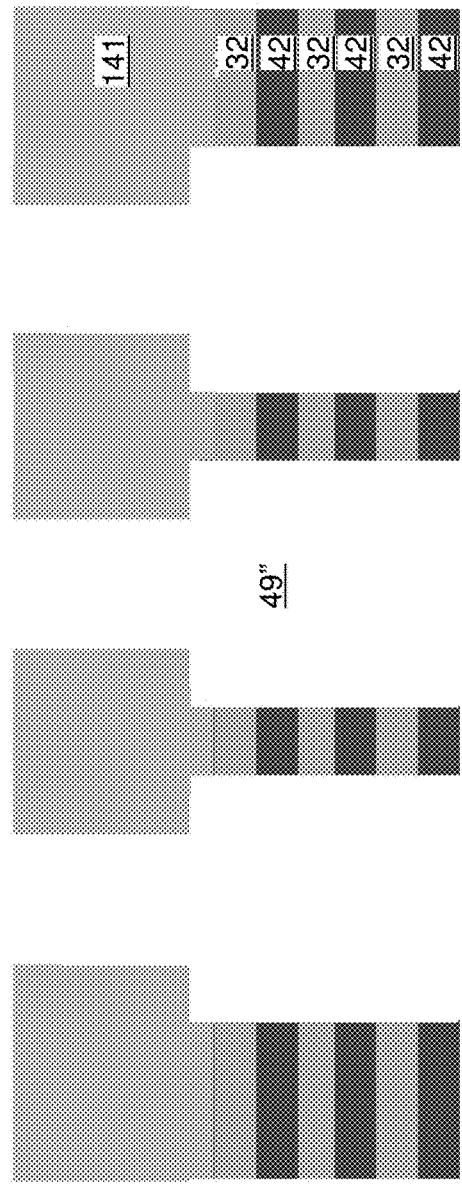

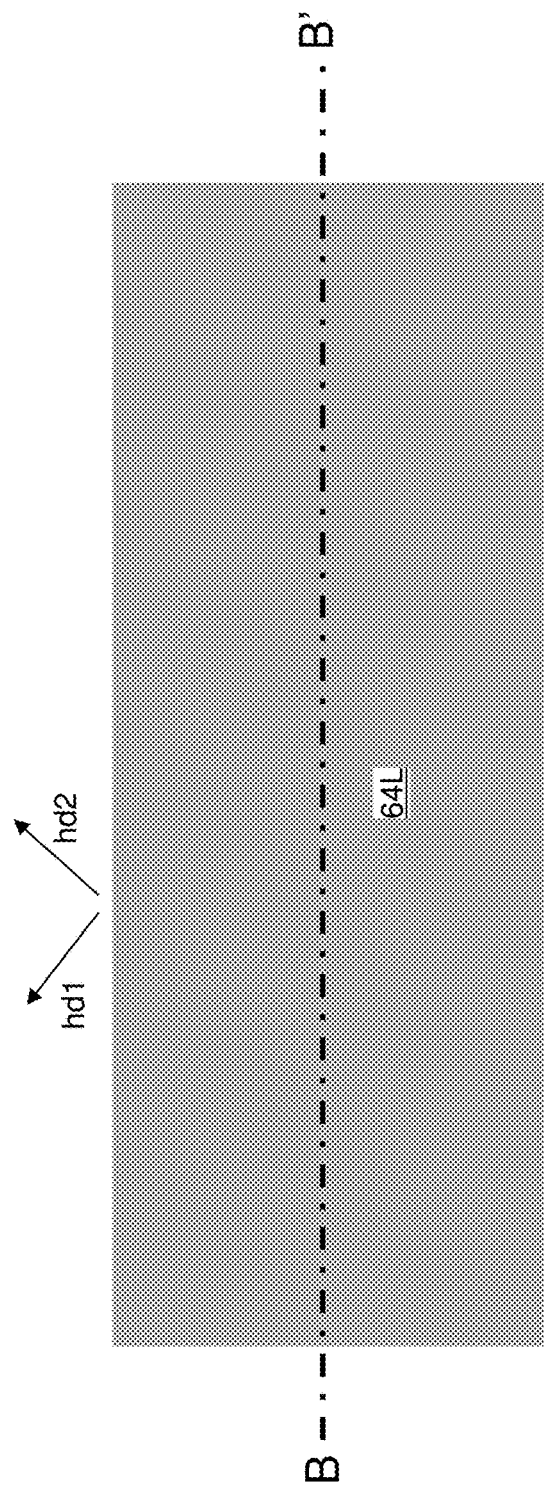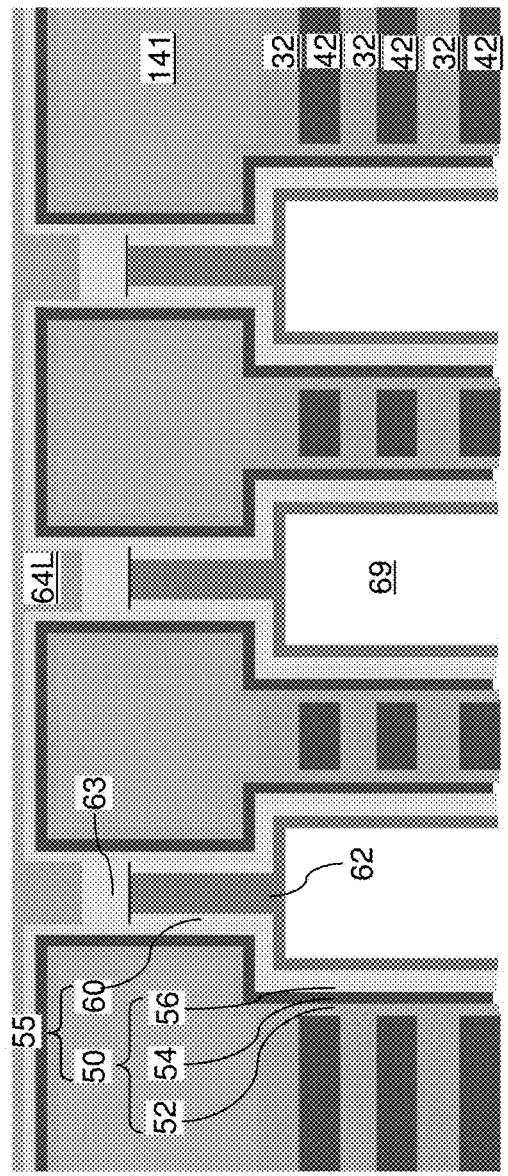

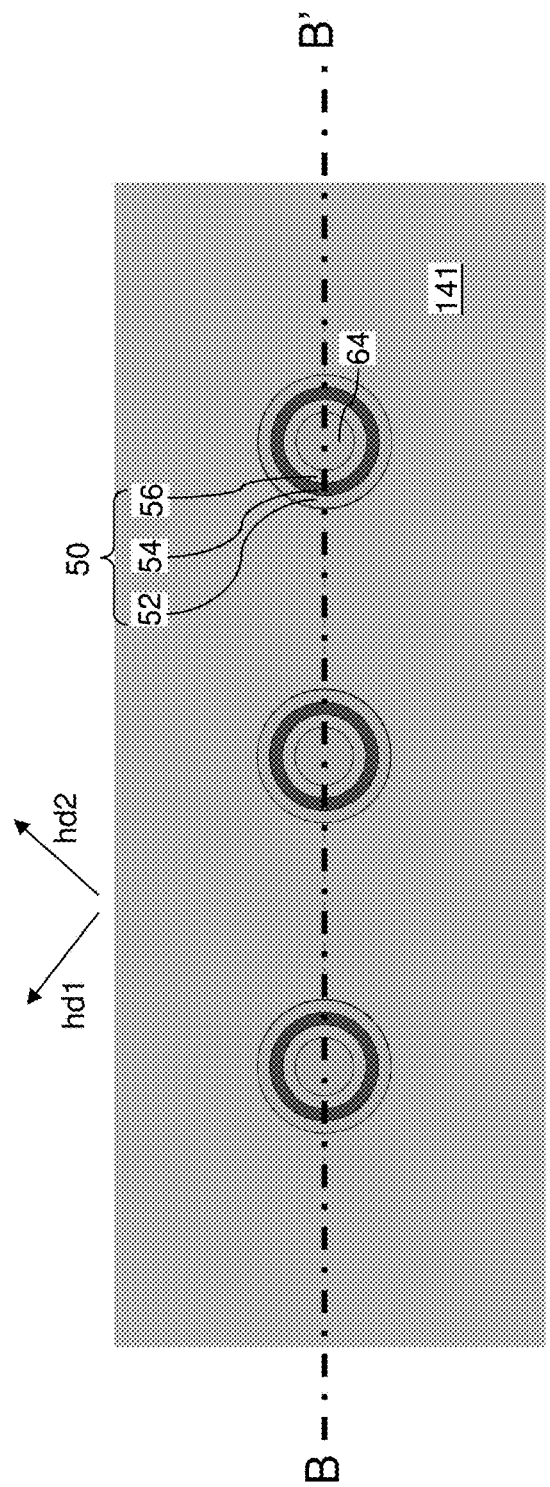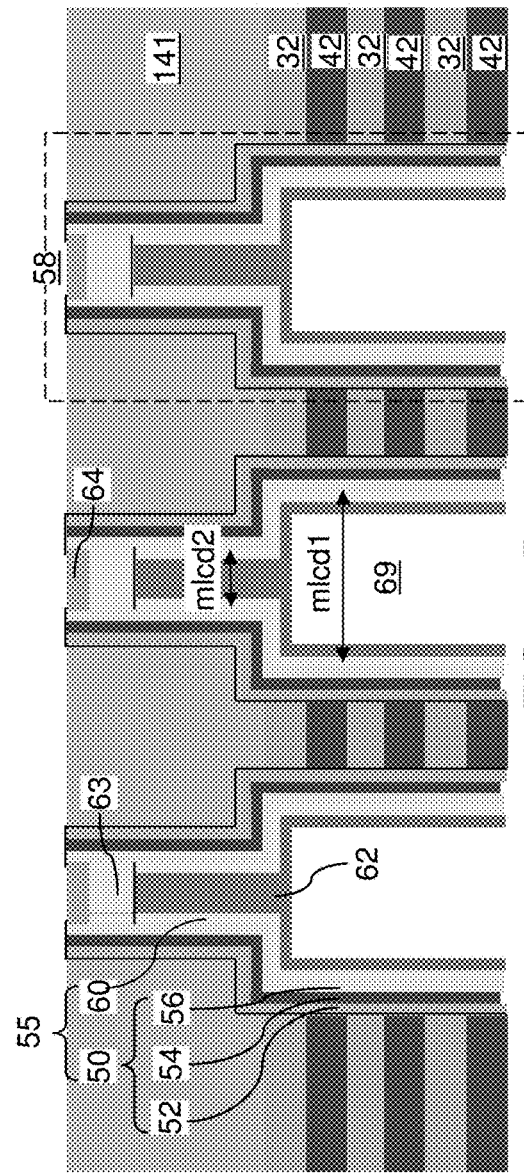
FIG. 14A
FIG. 14B

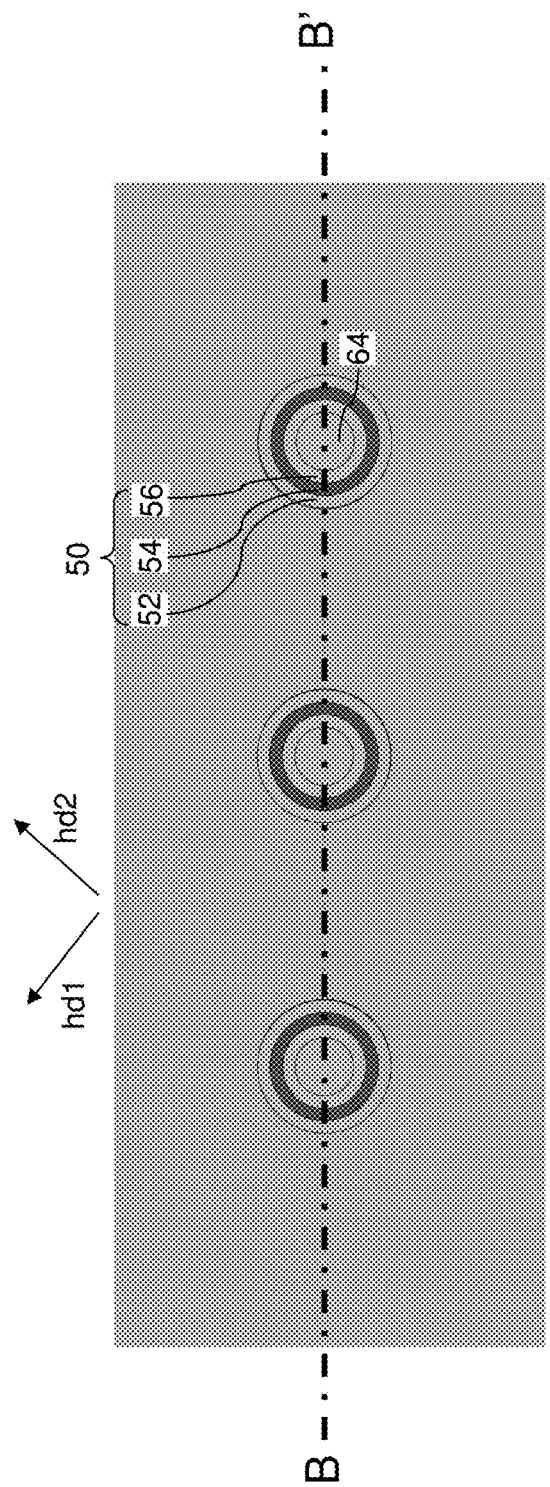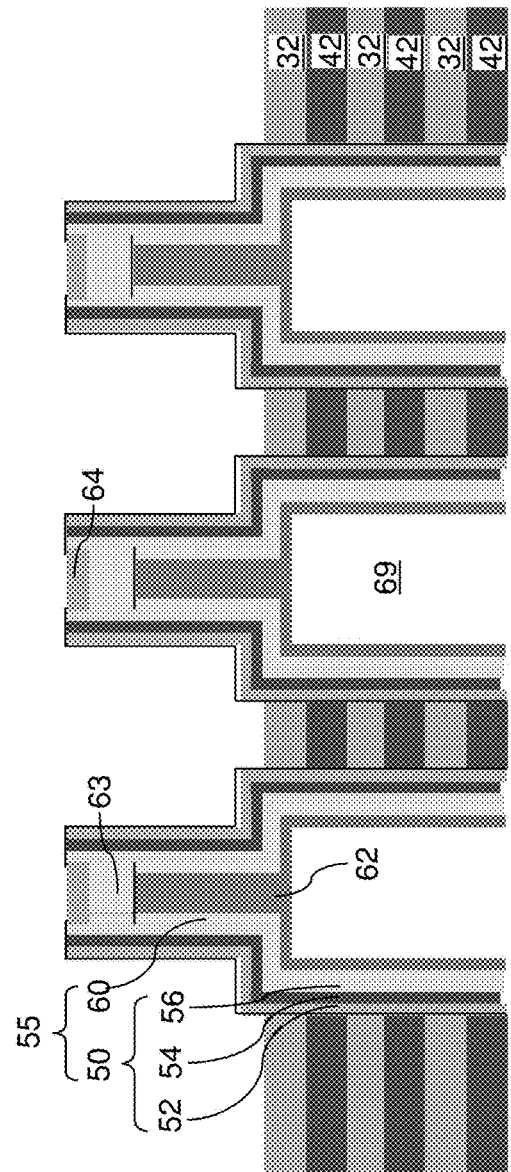
FIG. 15A
FIG. 15B

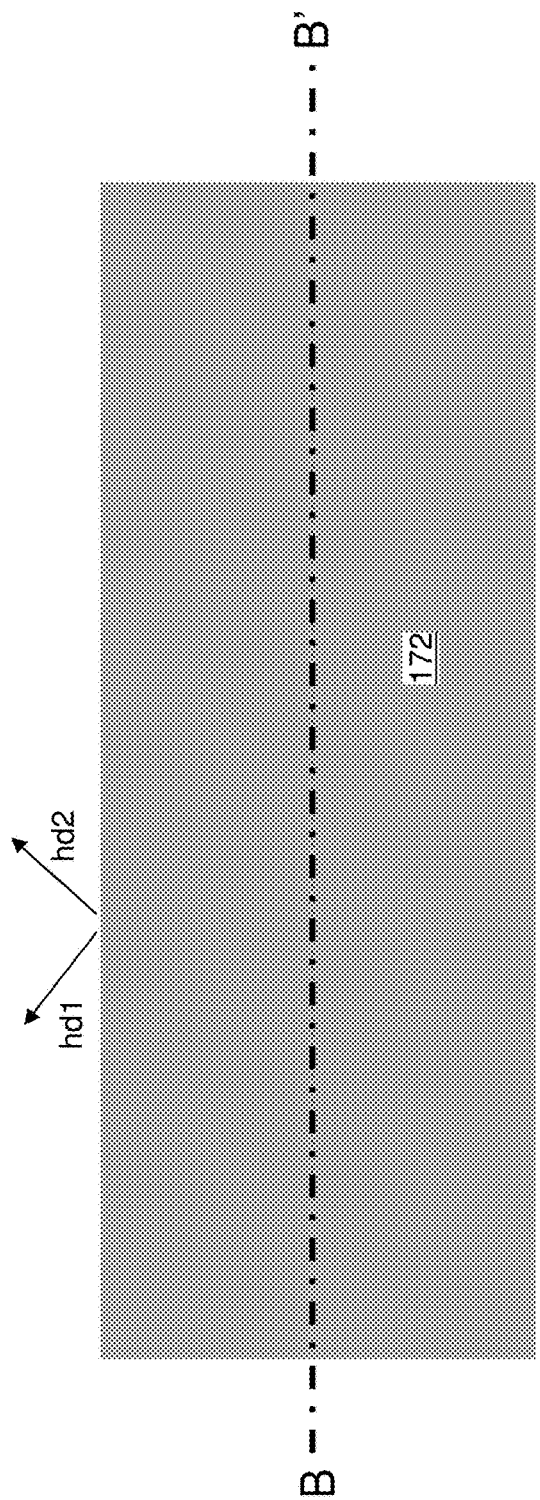
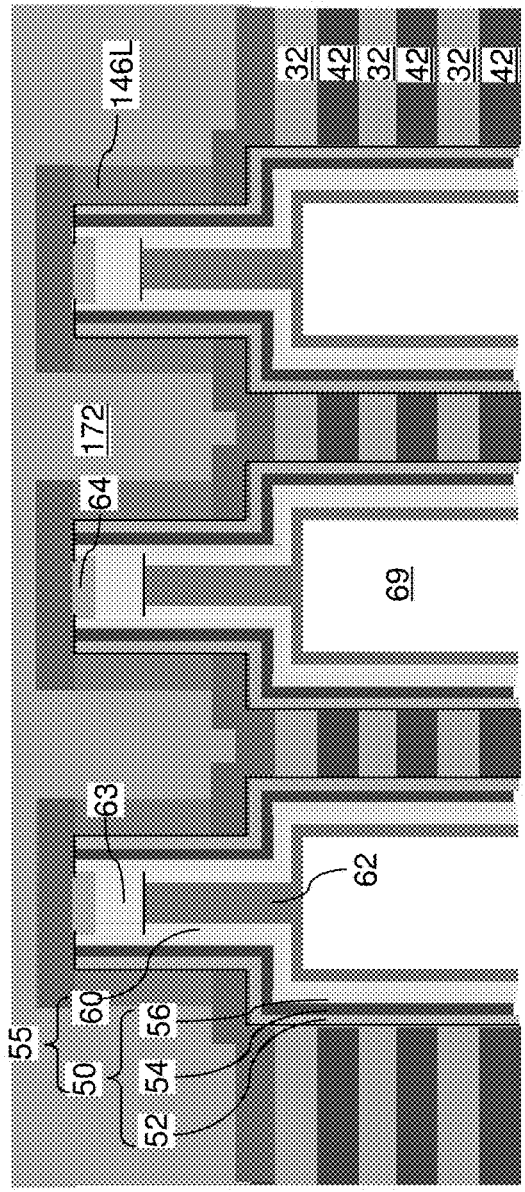
FIG. 17A
FIG. 17B

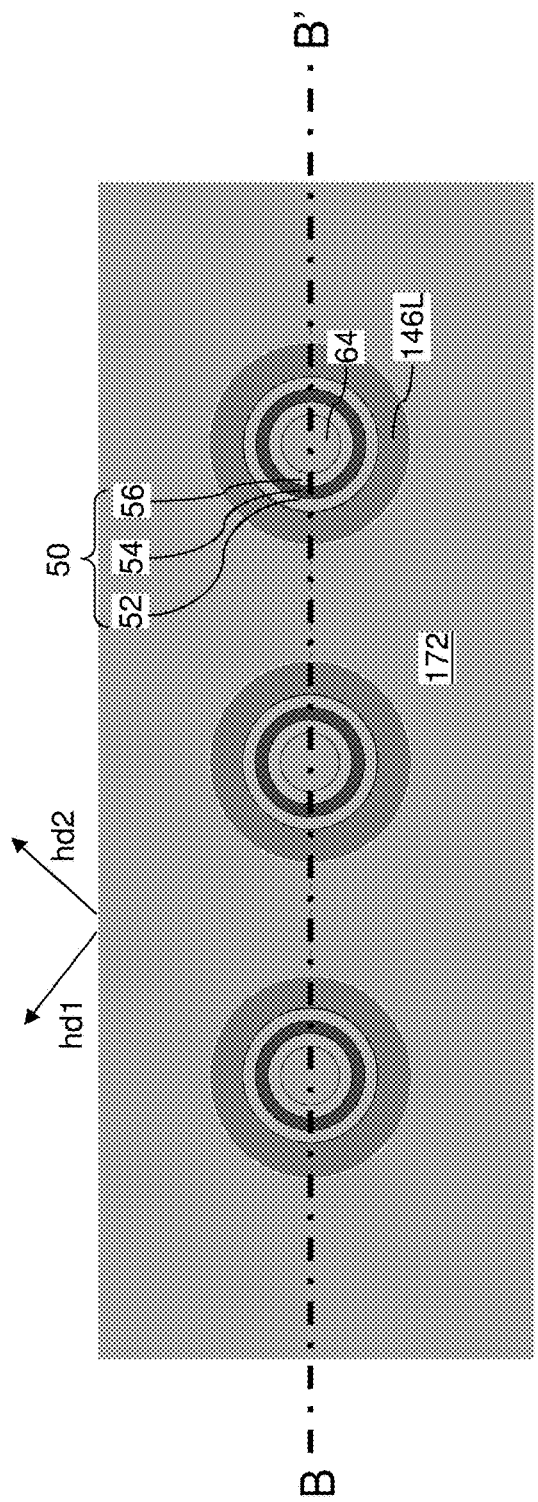
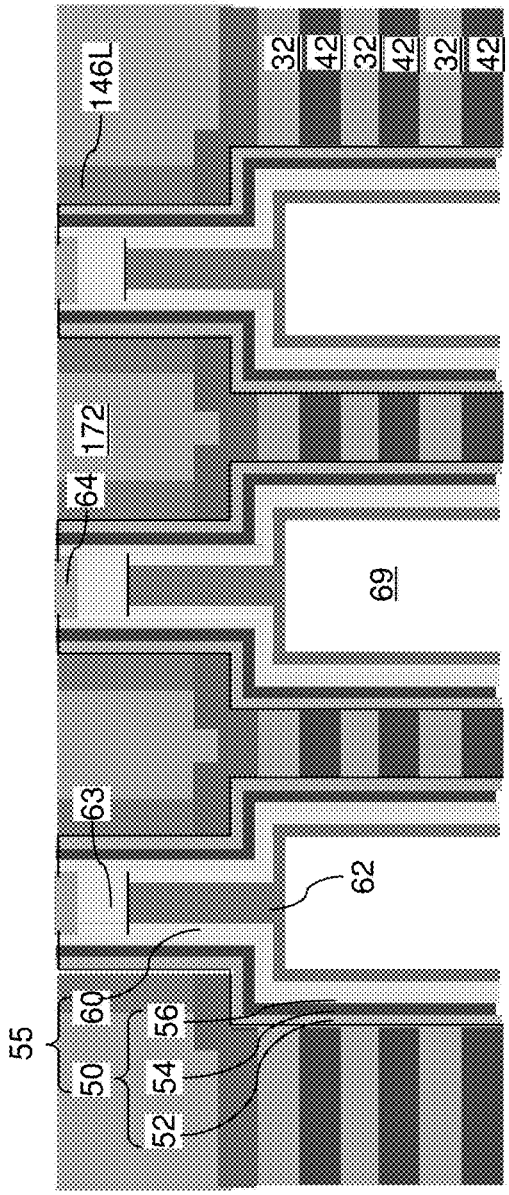
FIG. 18A
FIG. 18B

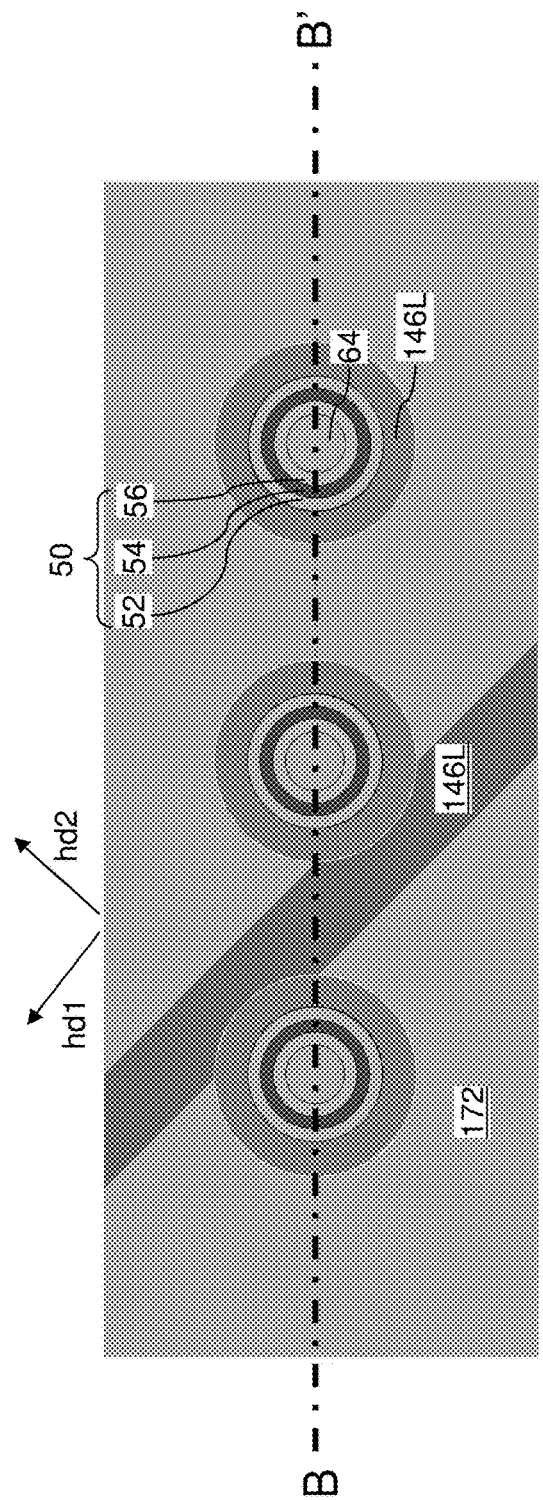
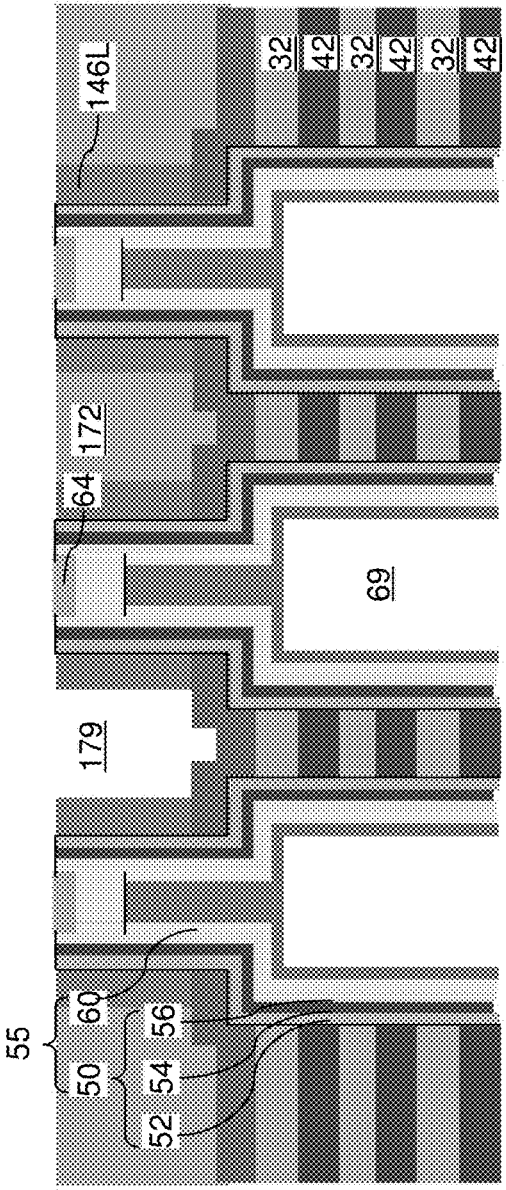
FIG. 19A
FIG. 19B

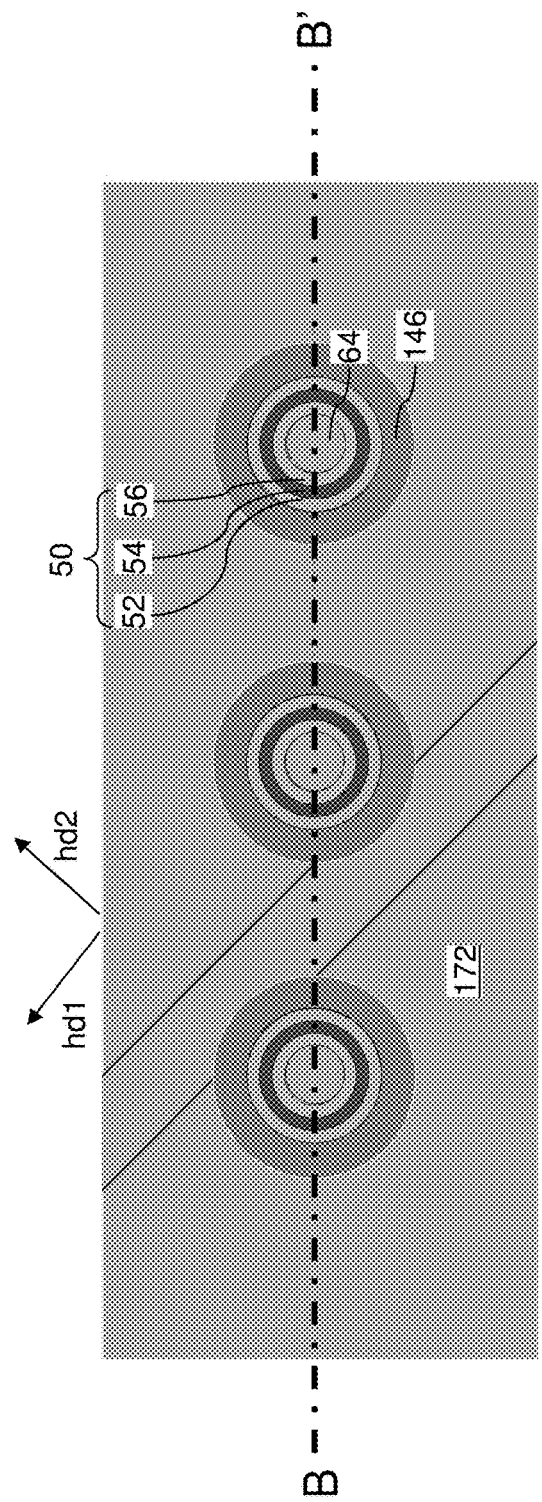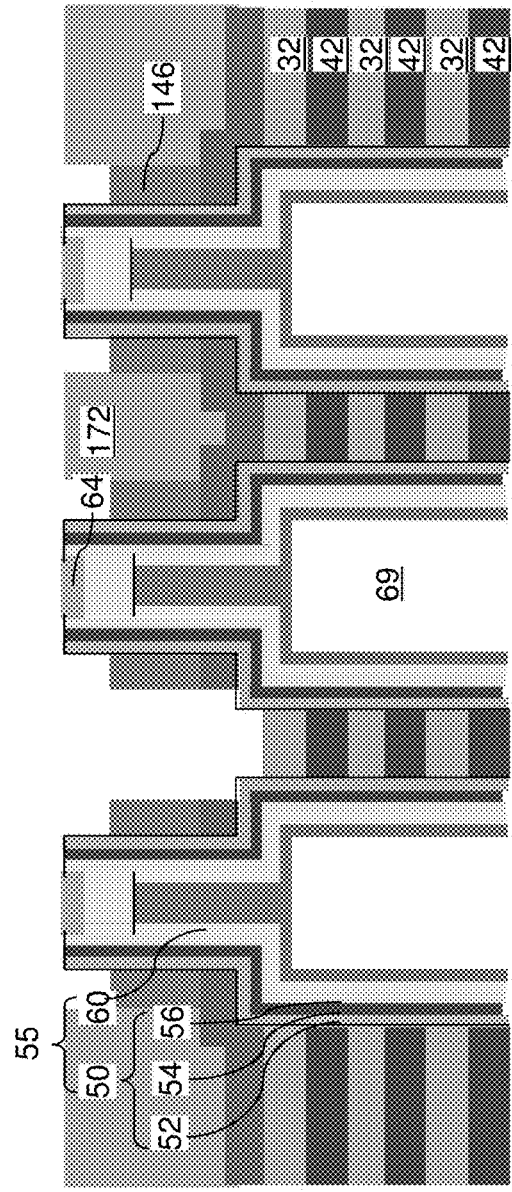
FIG. 20A
FIG. 20B

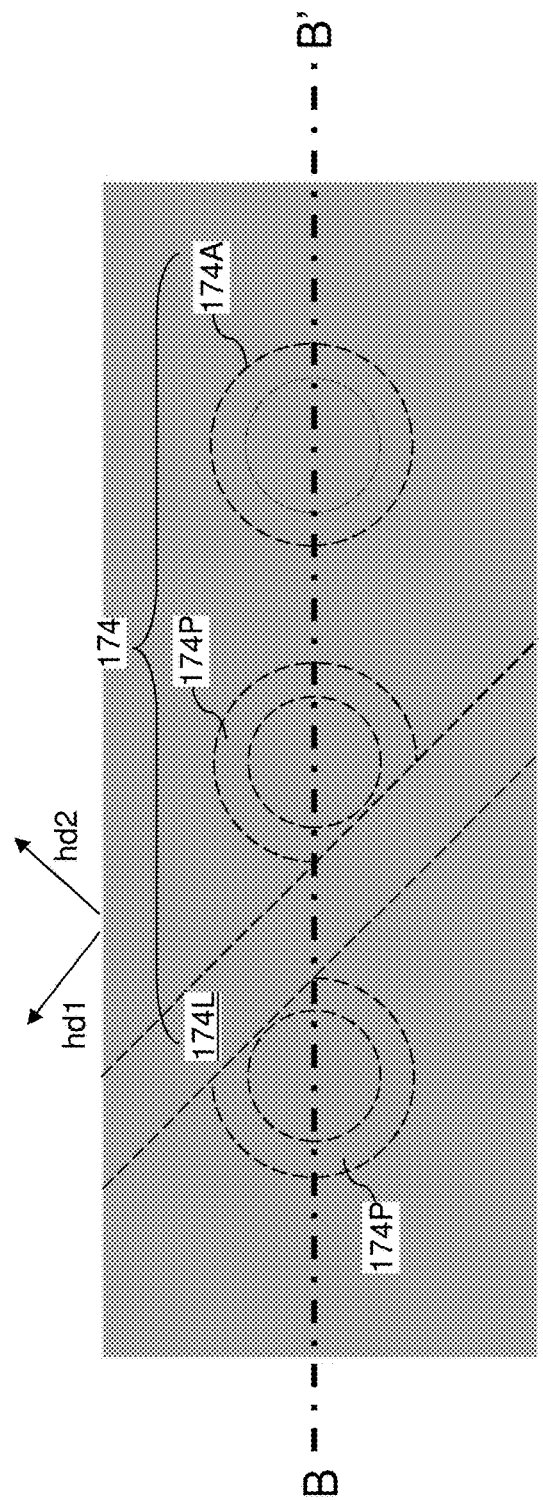
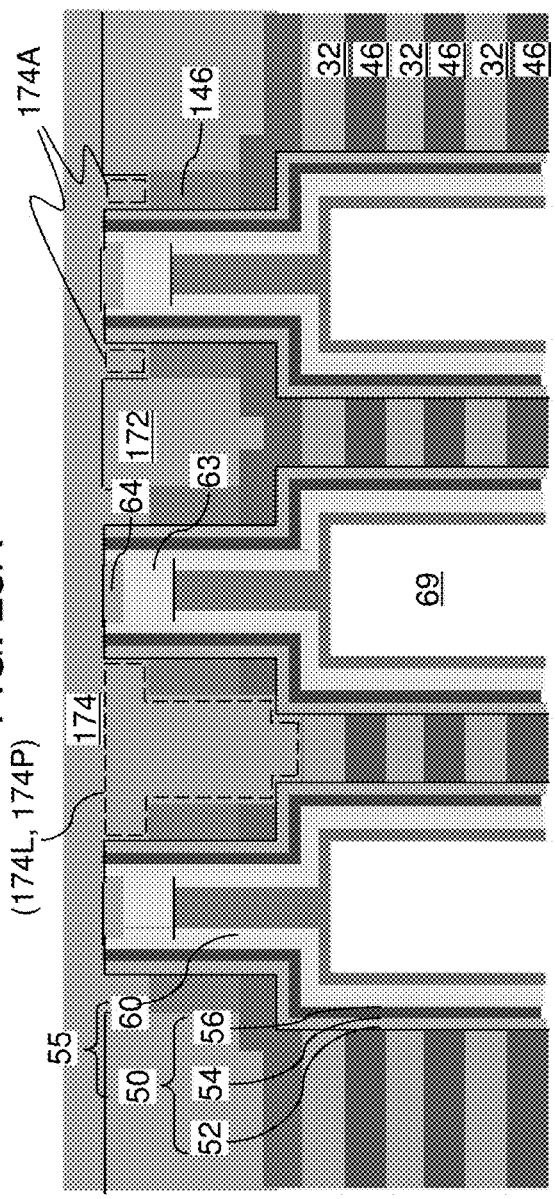
FIG. 23A
FIG. 23B

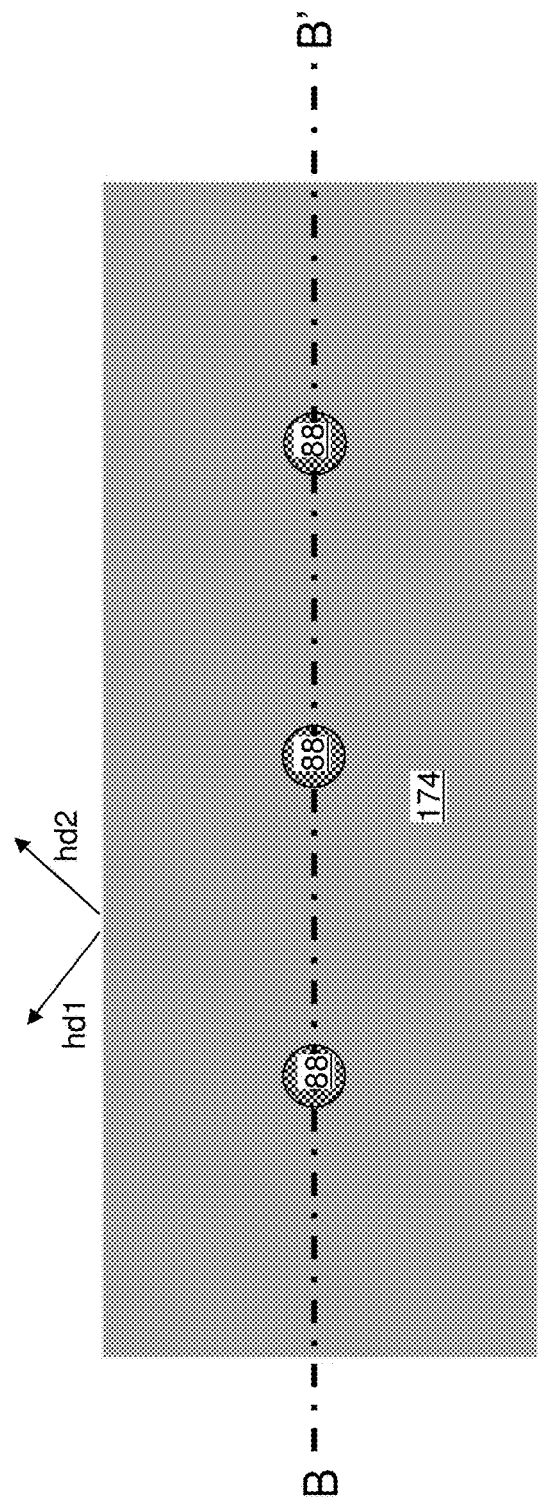
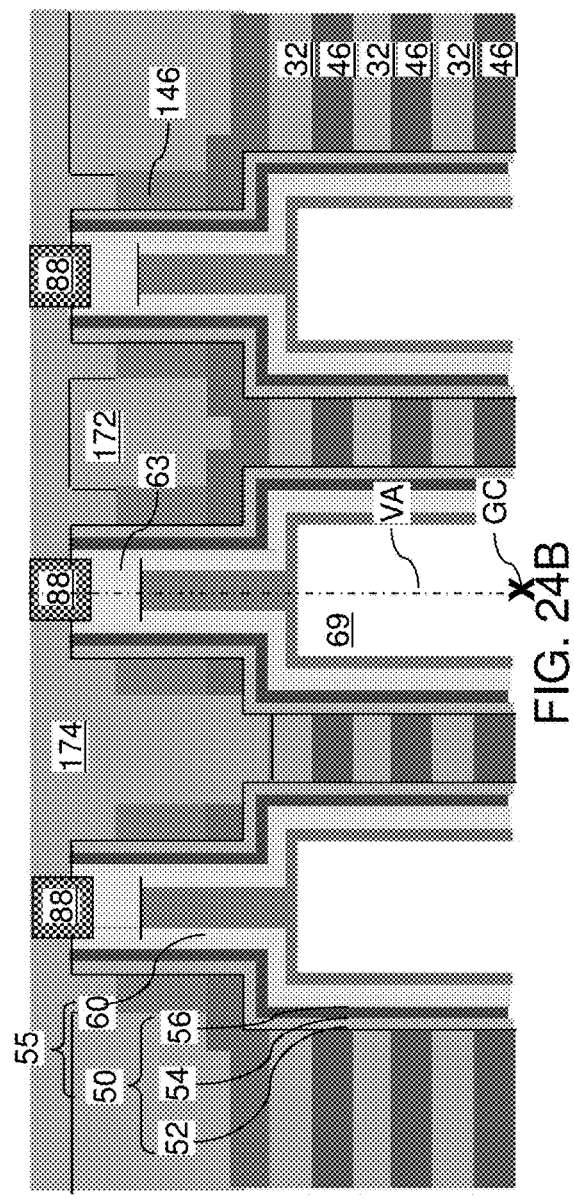
FIG. 24A
FIG. 24B

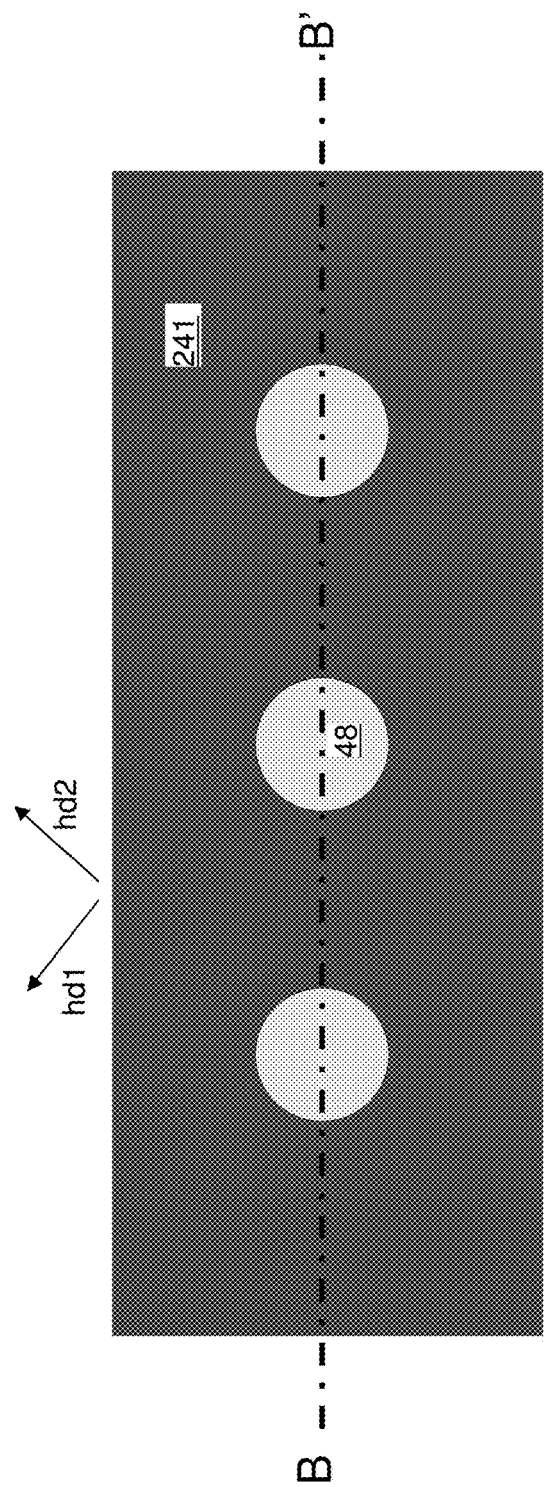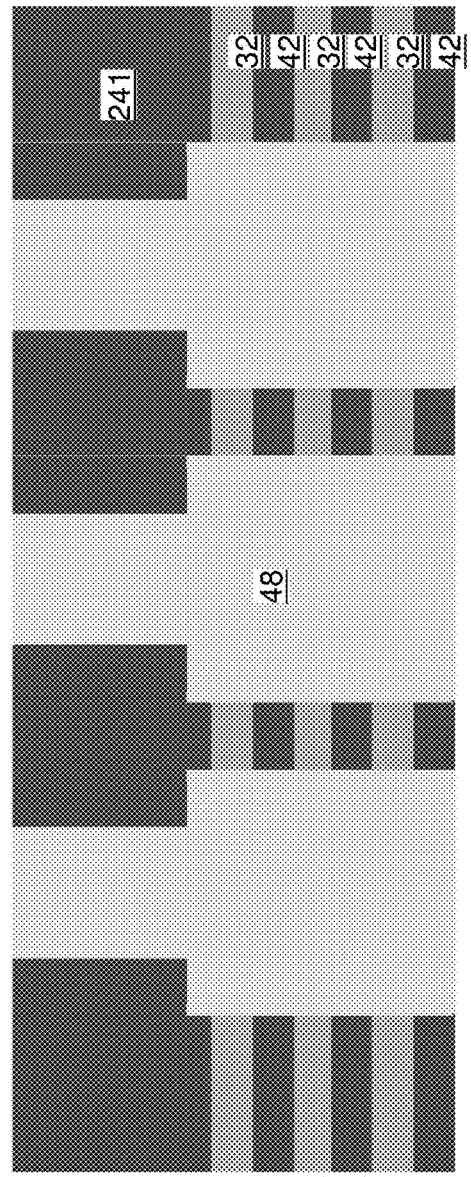
FIG. 25A
FIG. 25B

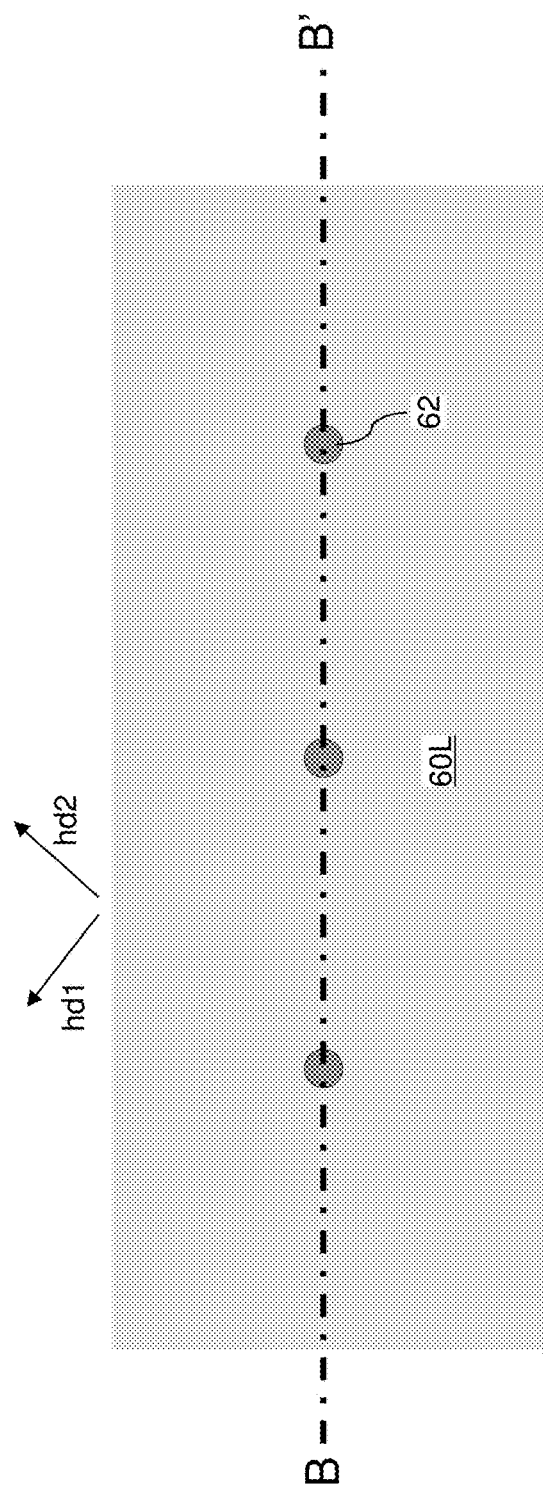
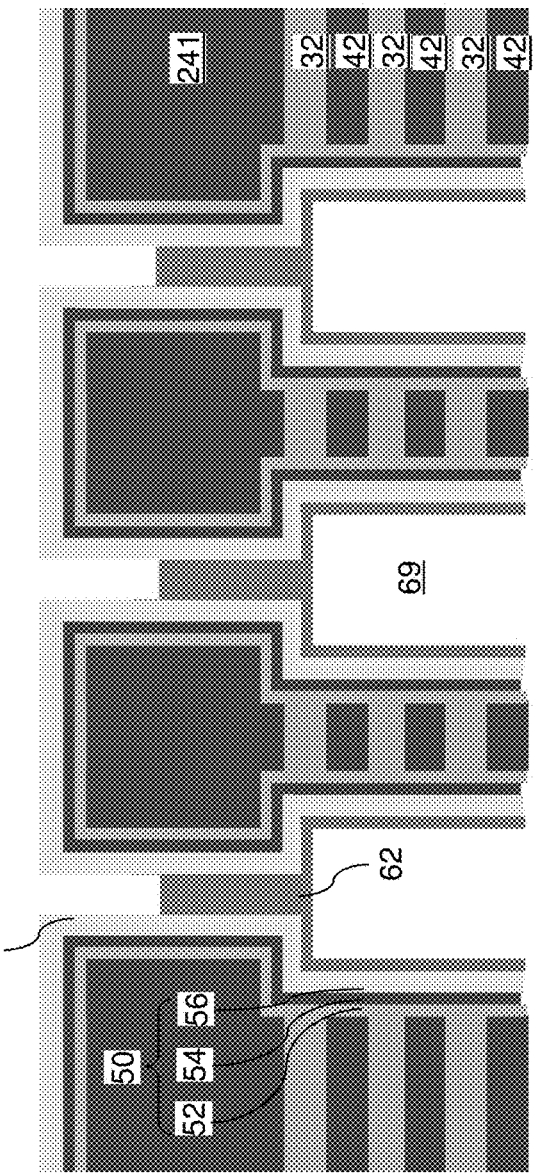

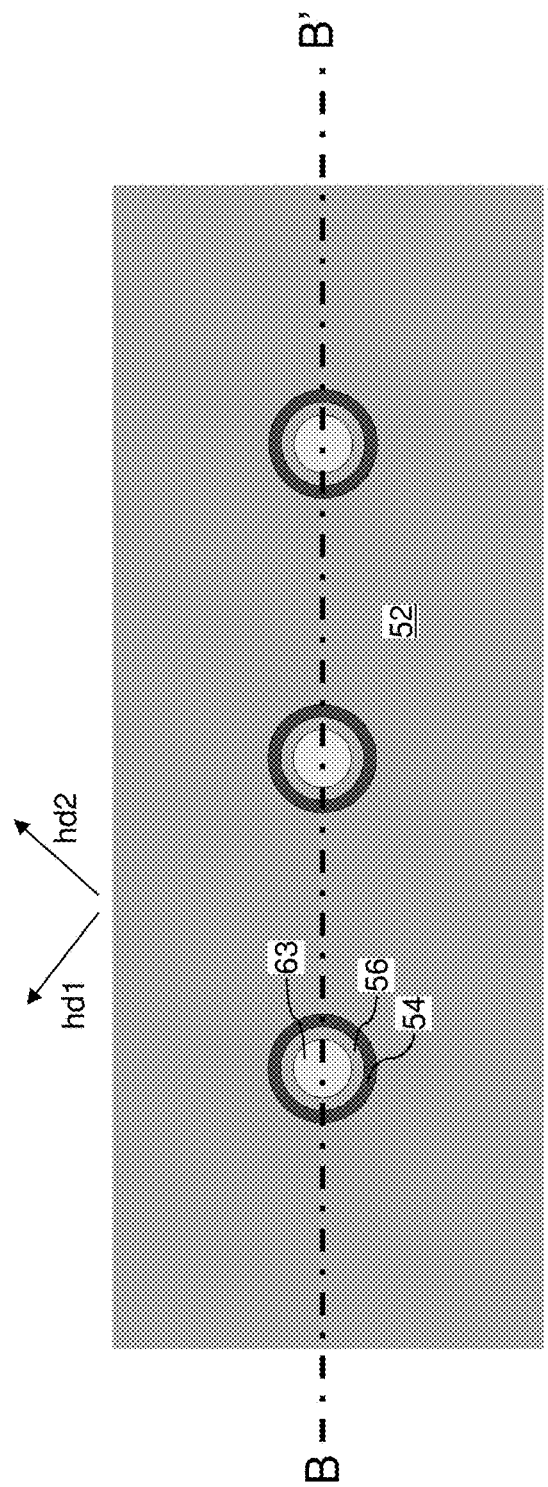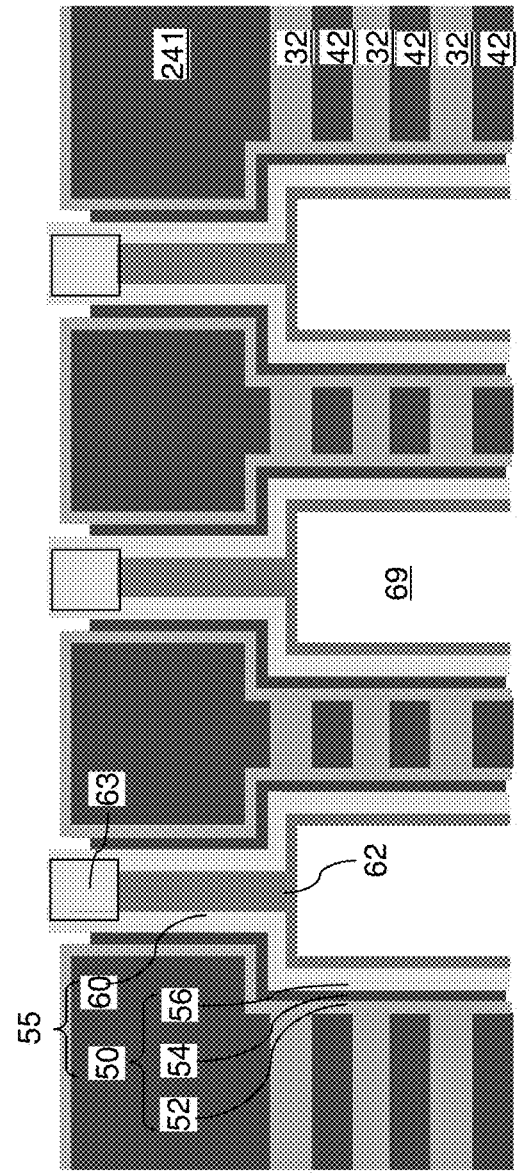
FIG. 29A
FIG. 29B

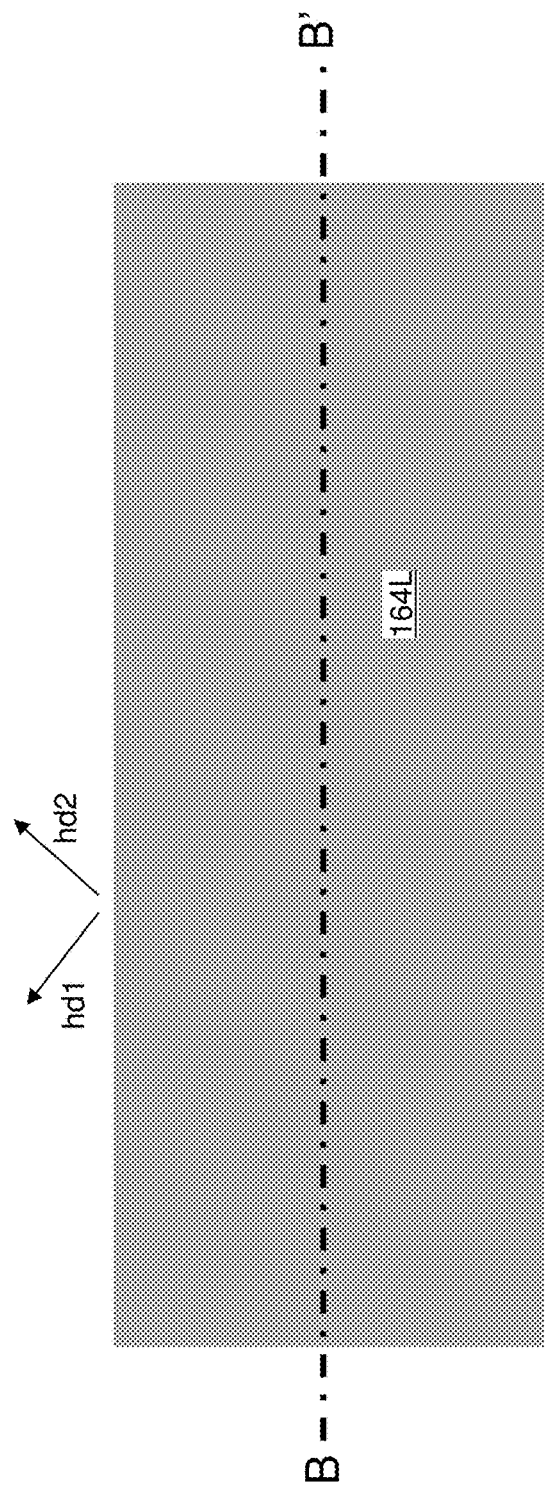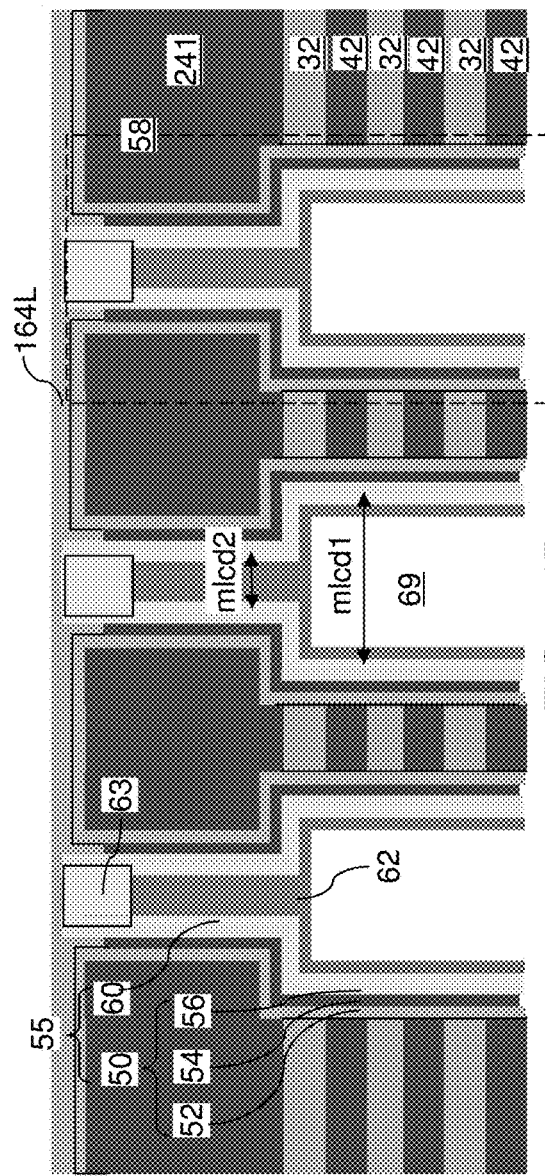

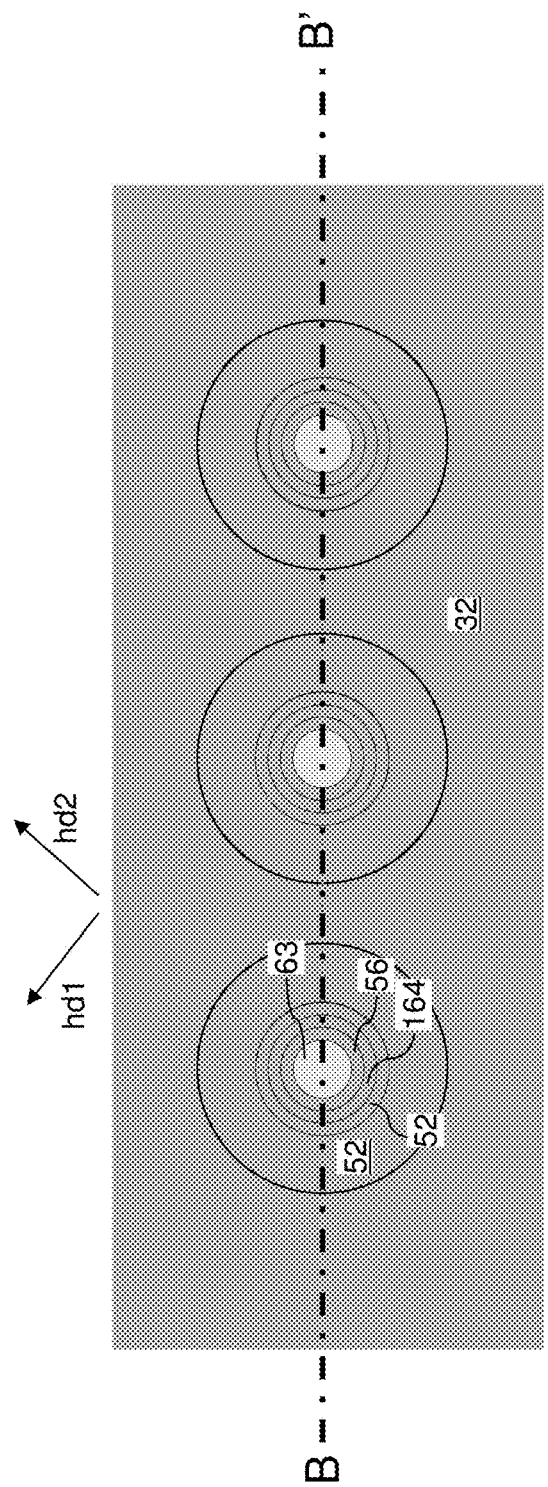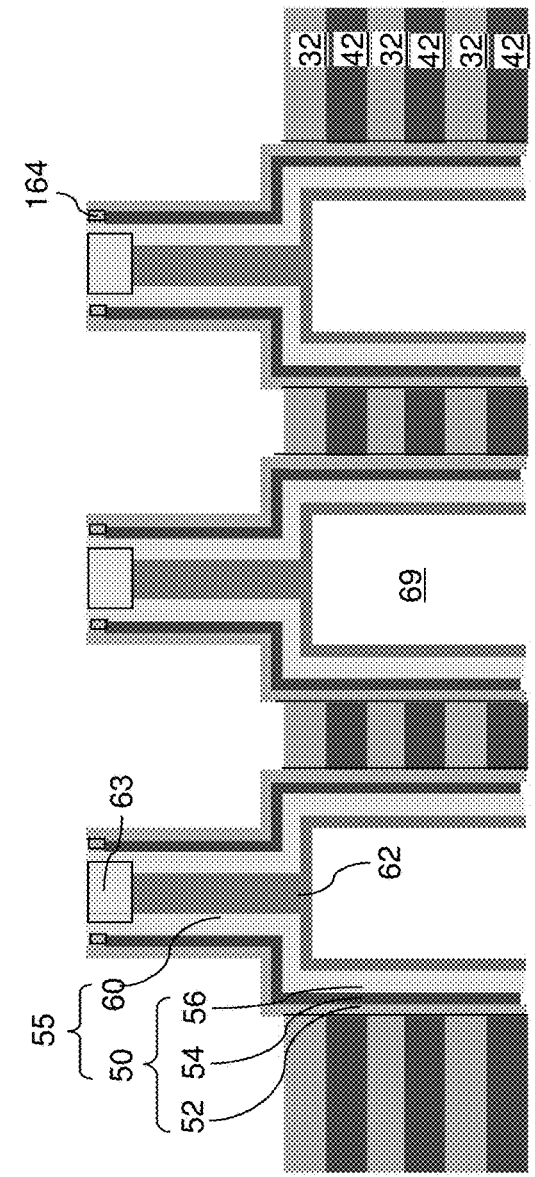
FIG. 32A
FIG. 32B

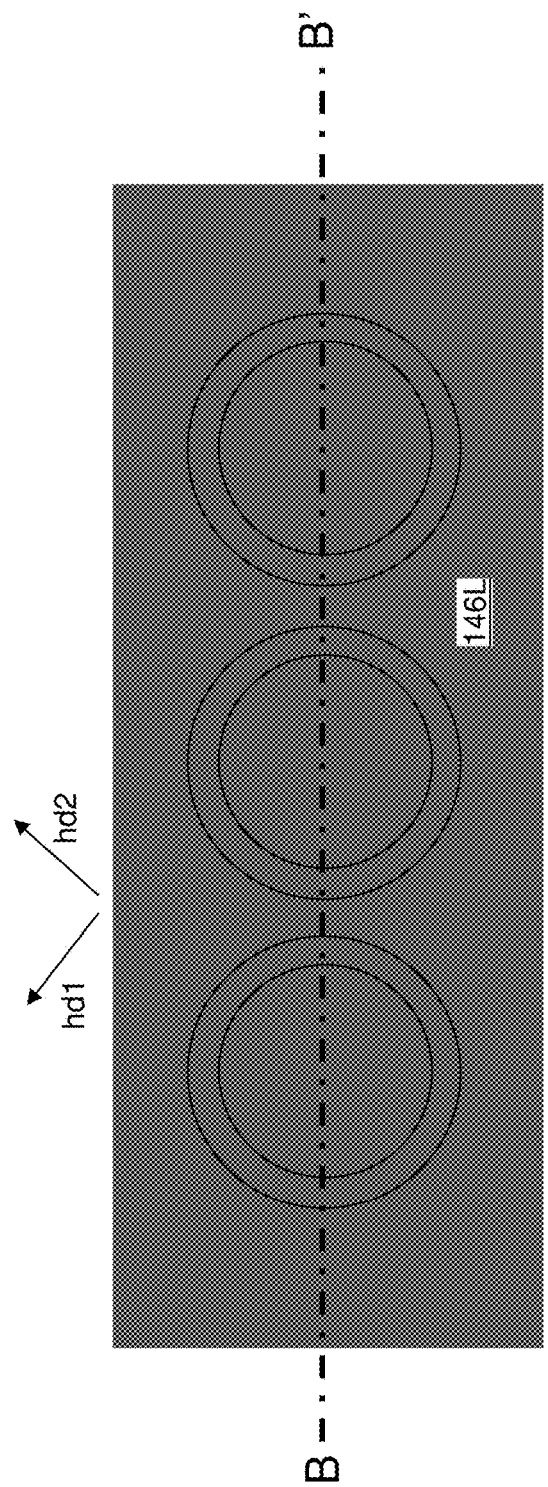
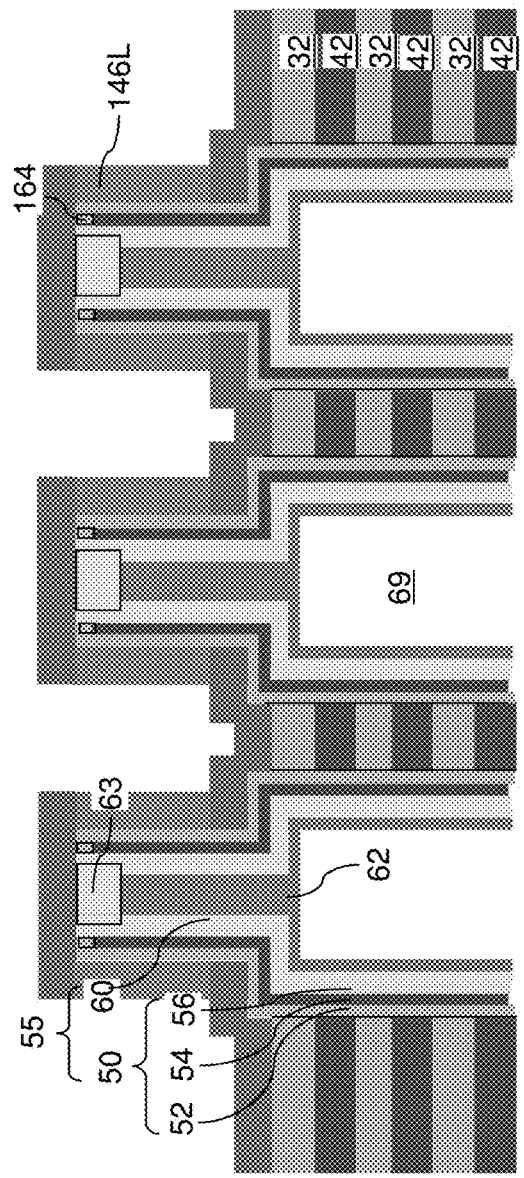
FIG. 33A
FIG. 33B

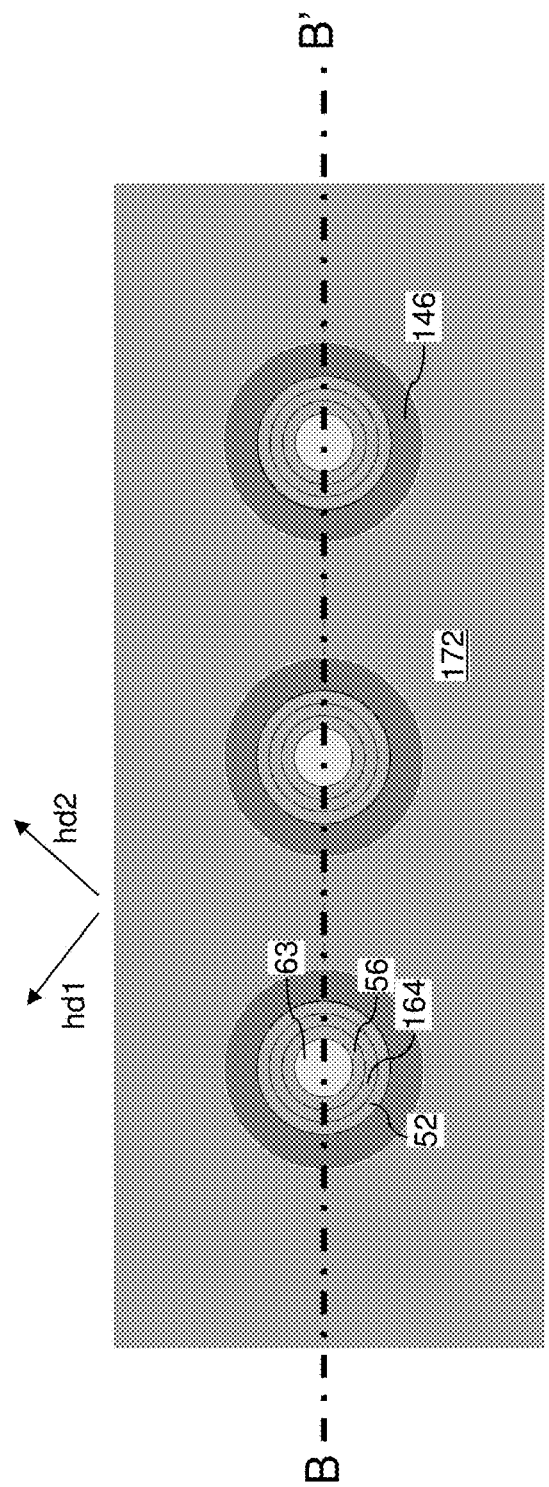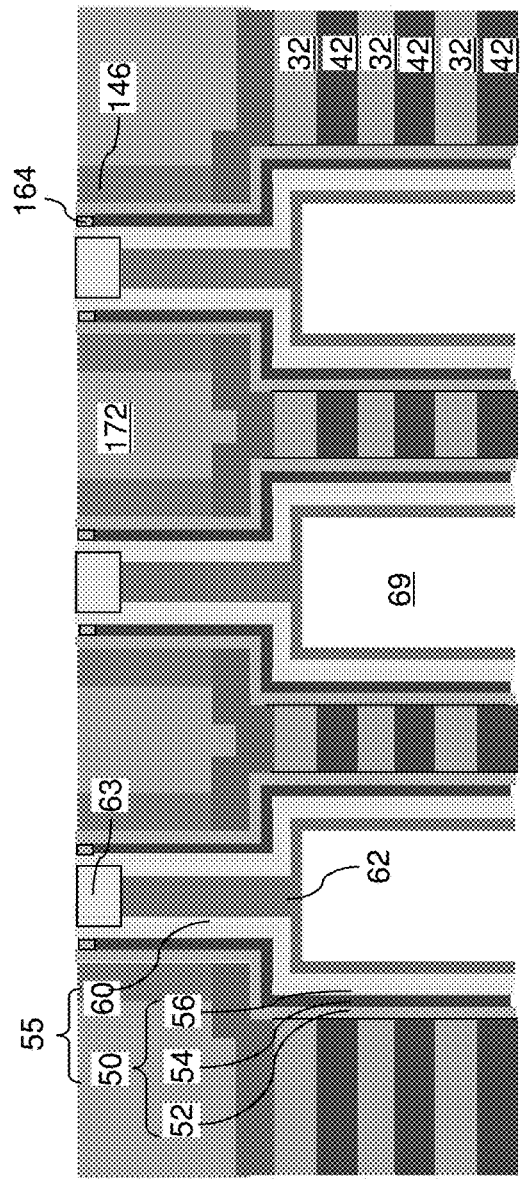

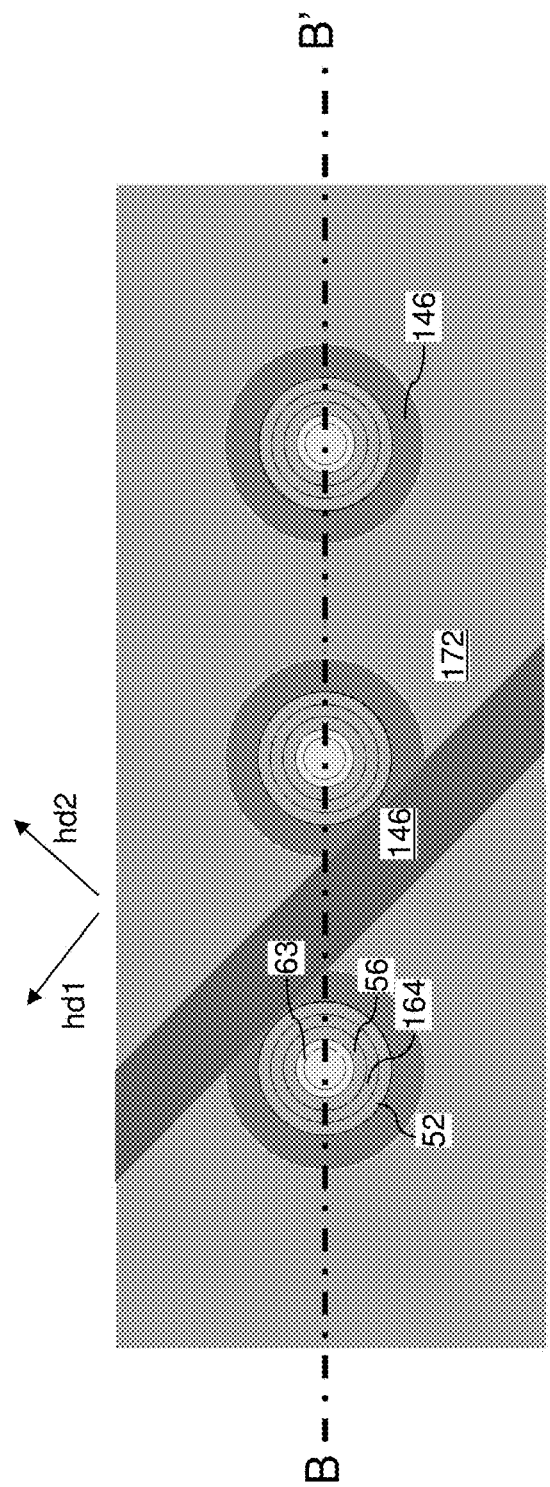
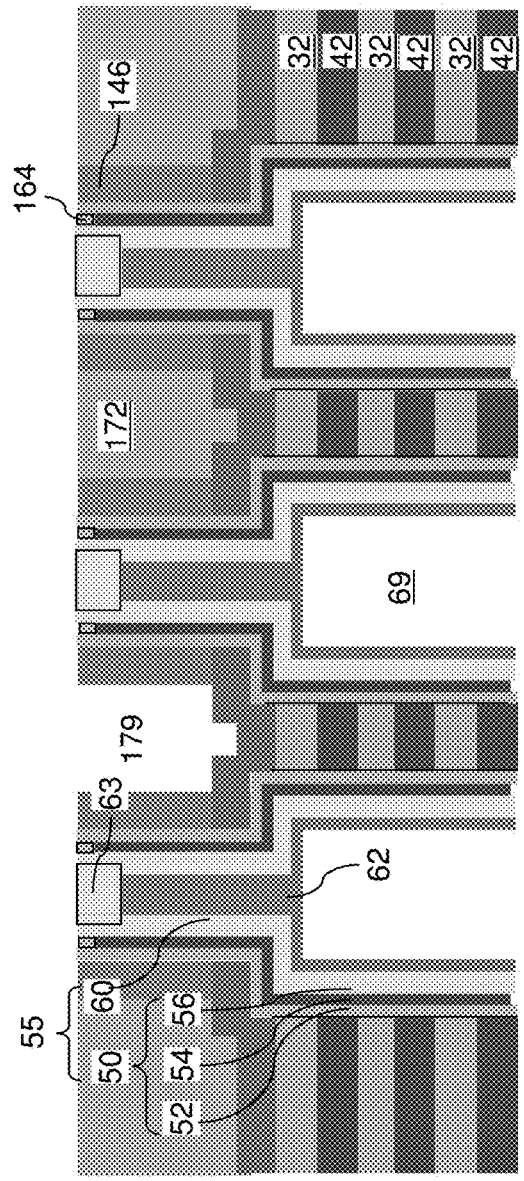
FIG. 36A
FIG. 36B

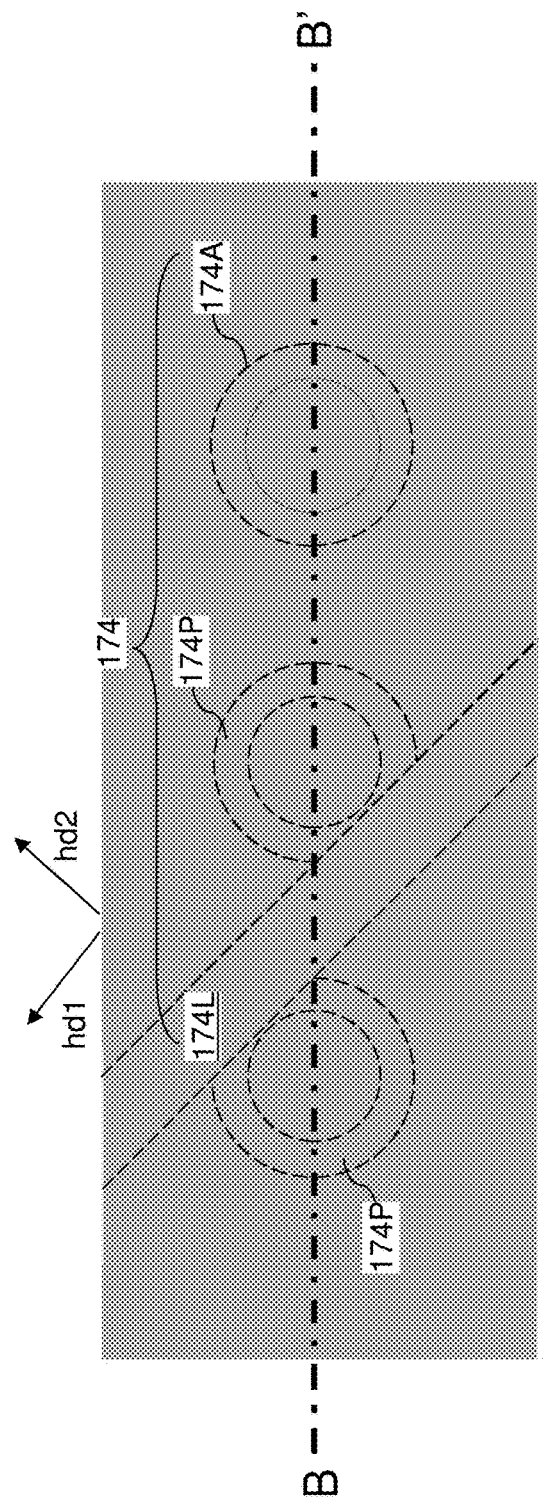
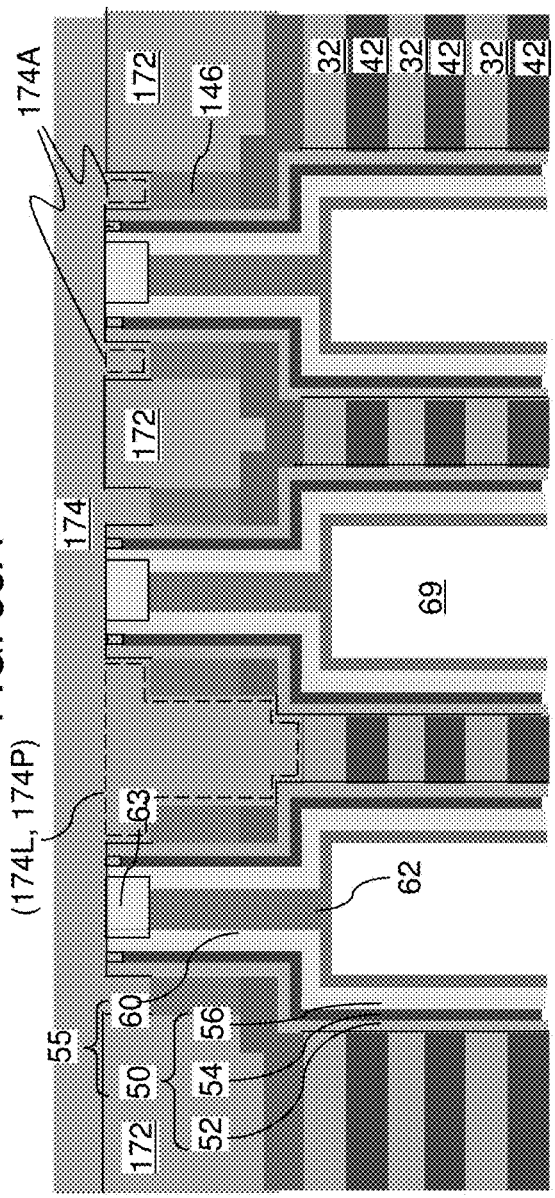
FIG. 38A
FIG. 38B

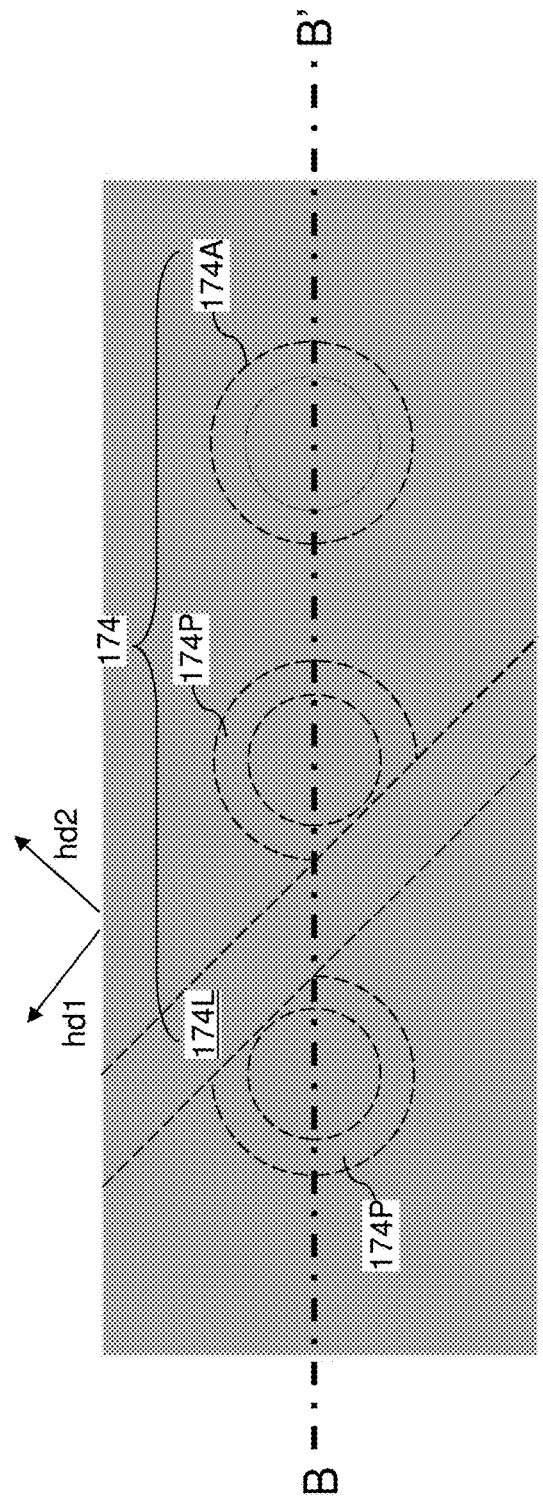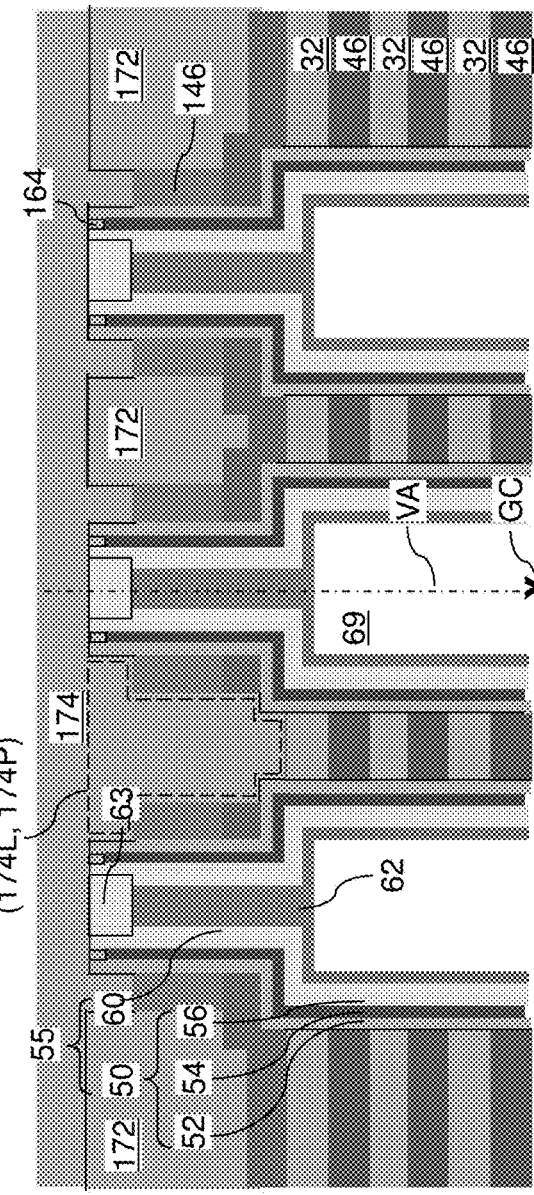
FIG. 39A
FIG. 39B

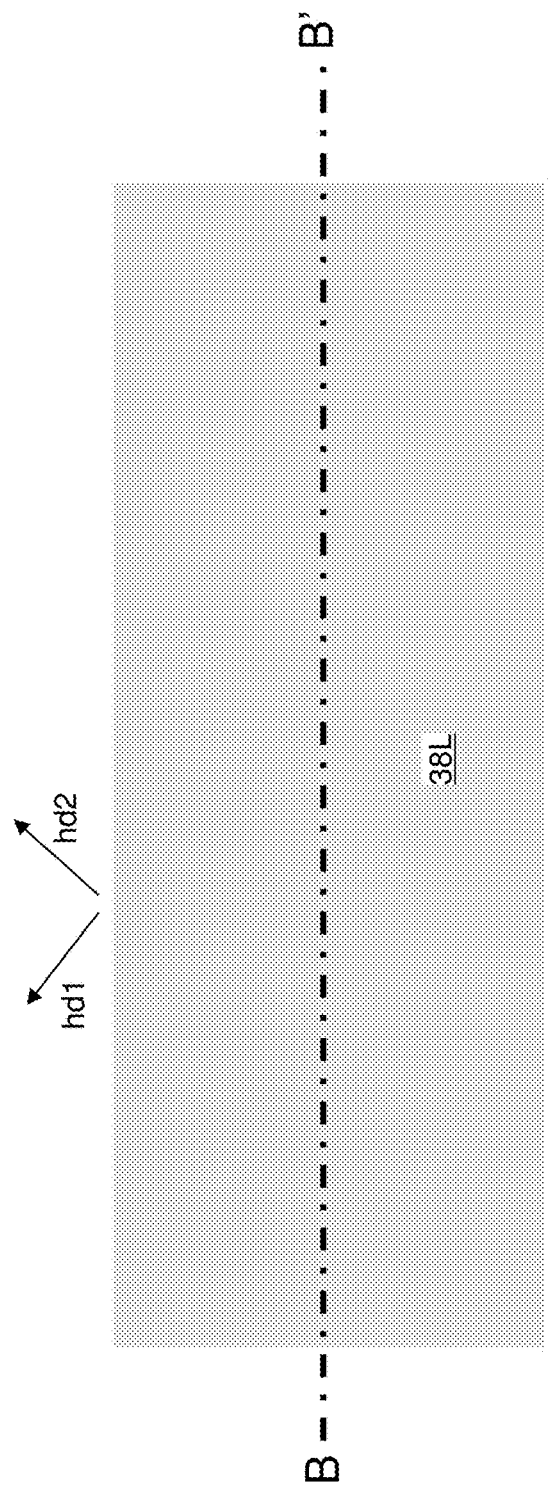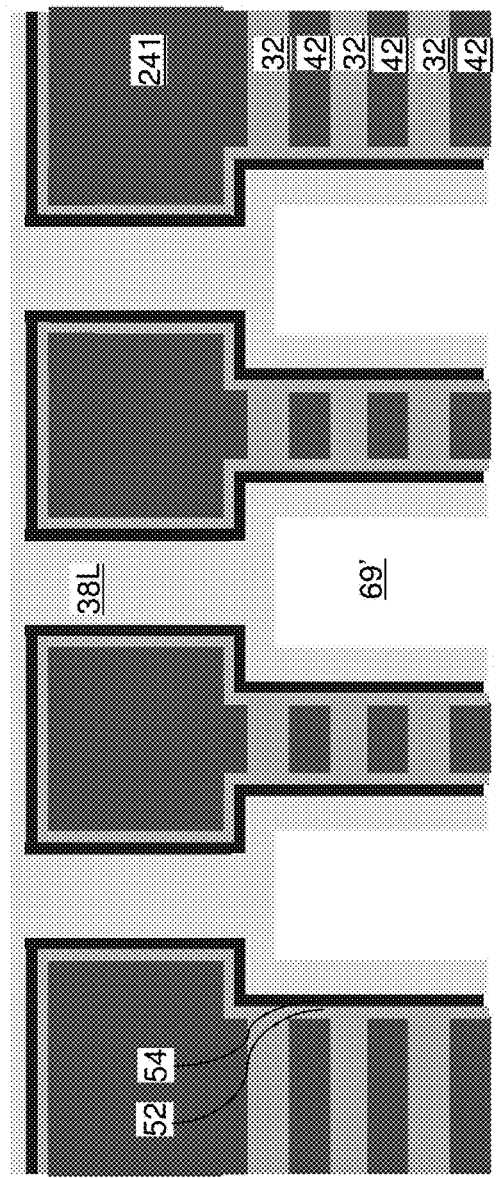

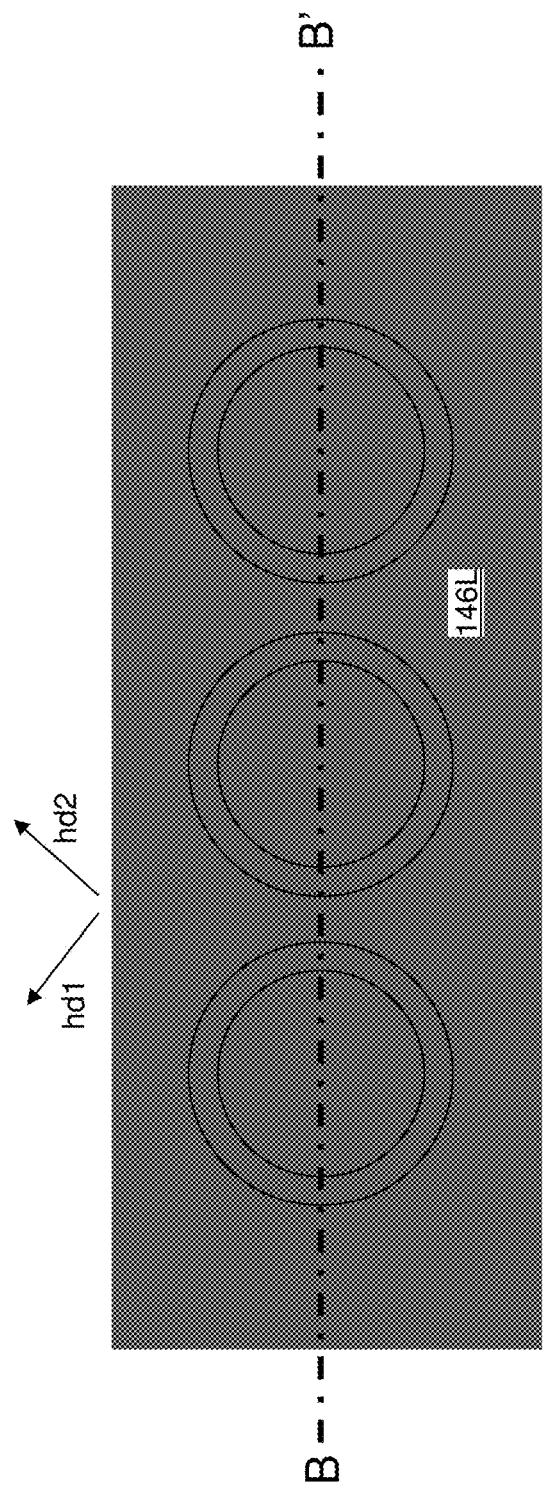
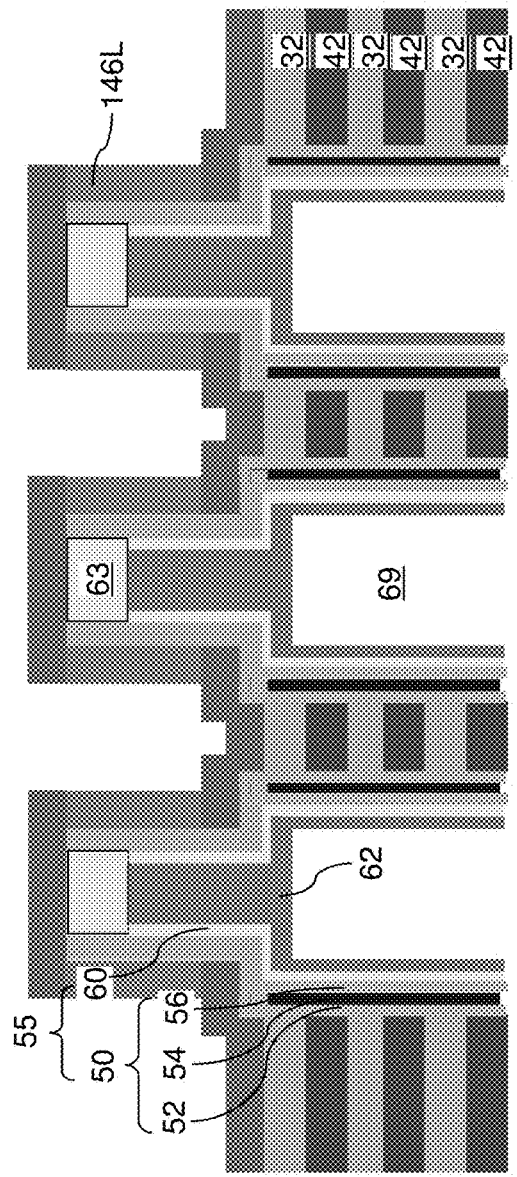
FIG. 46A
FIG. 46B

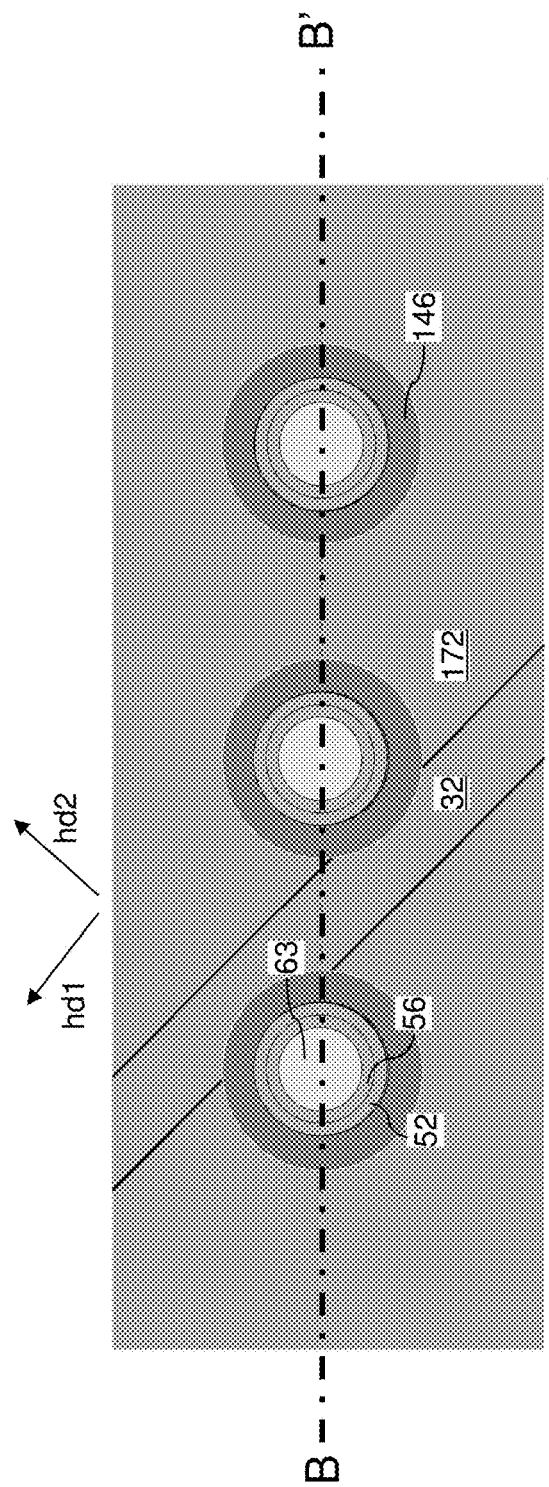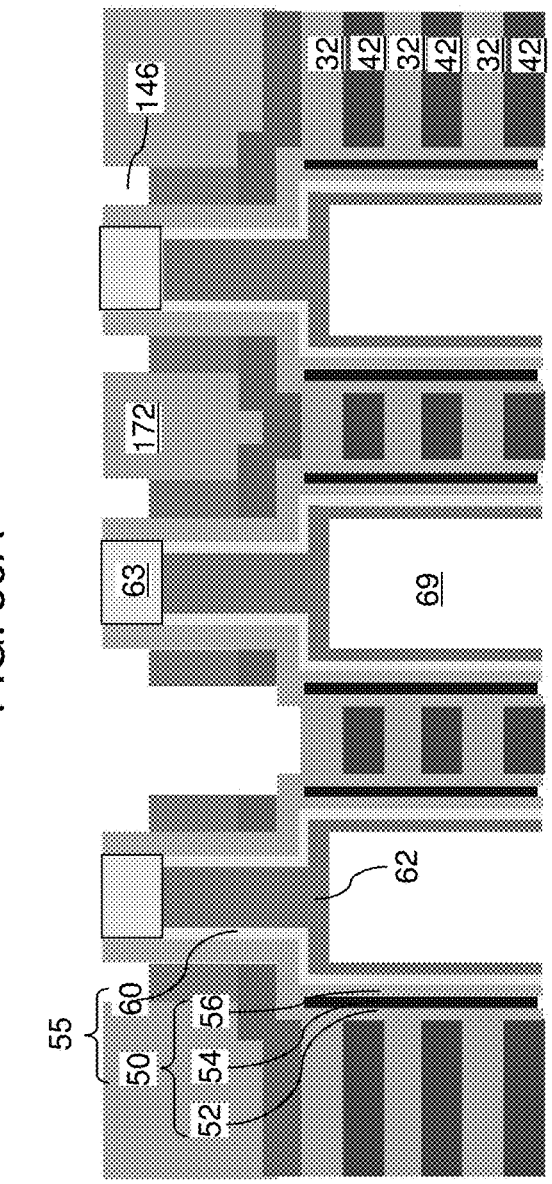
FIG. 50A
FIG. 50B

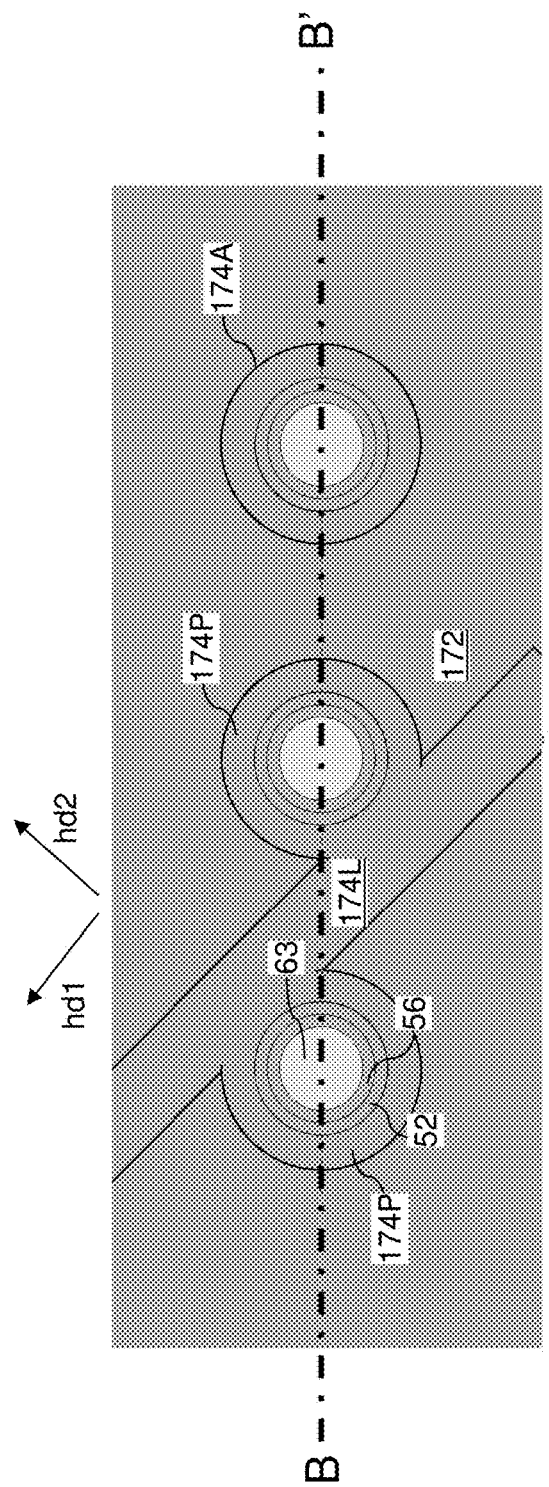
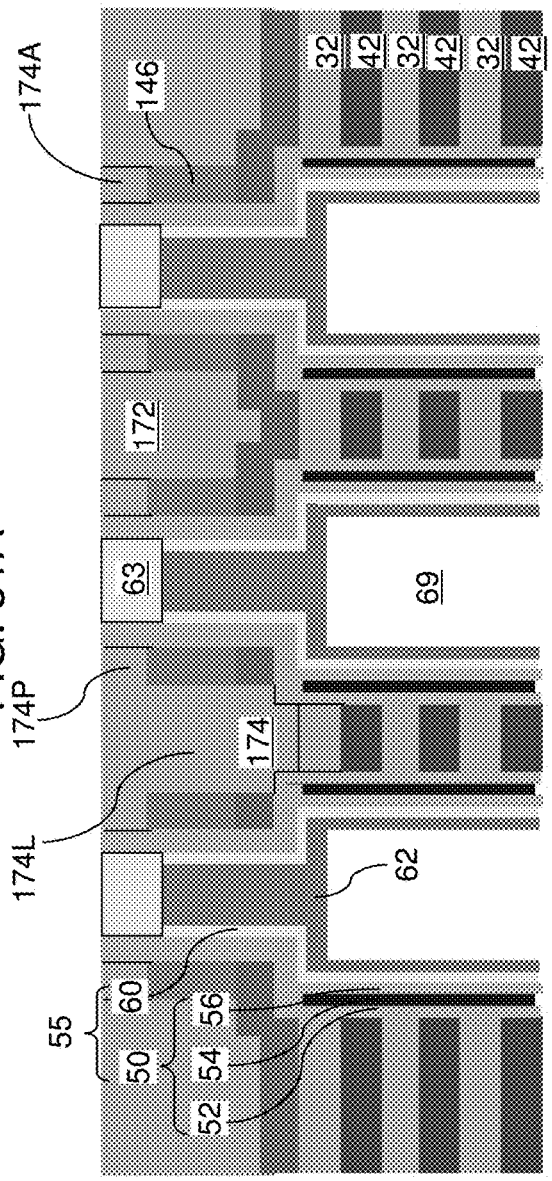
FIG. 51A
FIG. 51B

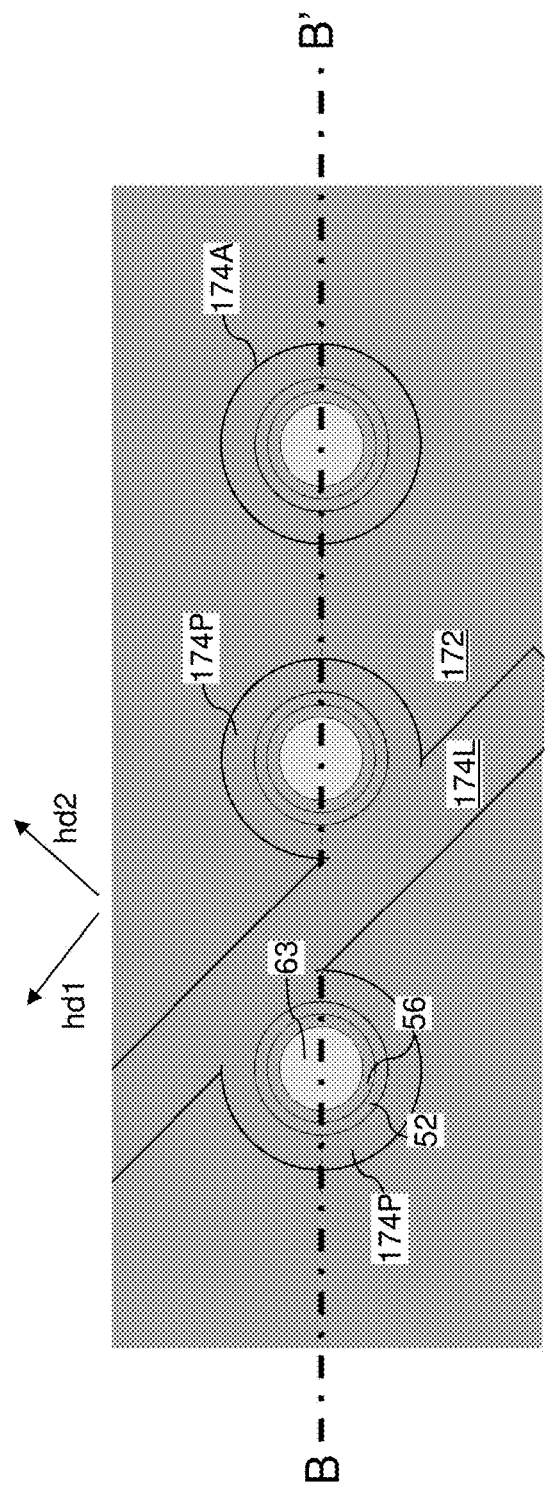
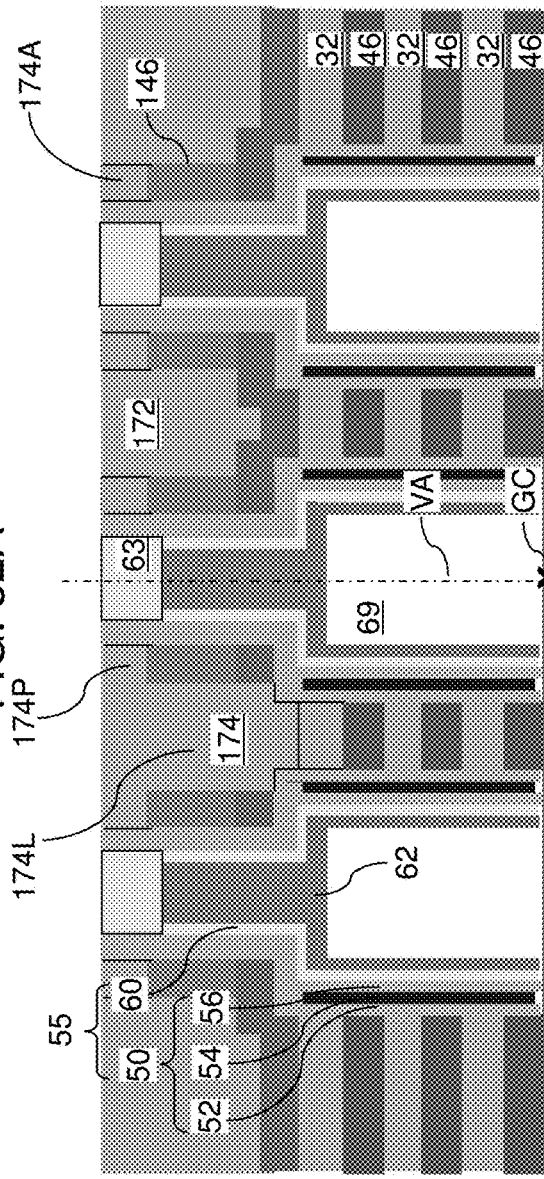
FIG. 52A
FIG. 52B

THREE-DIMENSIONAL MEMORY DEVICE INCLUDING BOTTLE-SHAPED MEMORY STACK STRUCTURES AND DRAIN-SELECT GATE ELECTRODES HAVING CYLINDRICAL PORTIONS

FIELD

The present disclosure relates generally to the field of semiconductor devices, and particular to a three-dimensional memory device including bottle-shaped memory stack structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; drain-select-level gate electrodes located over the alternating stack; memory openings extending through the alternating stack and a respective one of the drain-select-level gate electrodes; and memory opening fill structures located in the memory openings, wherein each of the memory opening fill structures comprises a respective semiconductor channel; wherein each semiconductor channel comprises: a respective first vertically-extending portion extending through levels of the electrically conductive layers and having a first maximum lateral channel dimension, and a respective second vertically-extending portion located at a level of the drain-select-level gate electrodes and having a second maximum lateral channel dimension that is less than the first maximum lateral channel dimension; and wherein each of the drain-select-level gate electrodes comprises: a planar portion having two sets of vertical sidewall segments; and a set of cylindrical portions vertically protruding upward from the planar portion and laterally surrounding a respective one of the memory opening fill structures.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming sacrificial pillar structures extending through the alternating stack and including a respective upper region that protrudes above the alternating stack and having a first maximum lateral dimension and a respective lower region embedded within the alternating stack and having a second maximum lateral dimension that is greater than the first maximum lateral dimension; replacing the sacrificial pillar structures with memory opening fill structures comprising a memory film and a semiconductor channel; forming a continuous metallic material layer over the alternating stack and the memory opening fill structures; removing horizontal portions of the continuous metallic material layer that overlie the memory opening fill structures or located within areas of a respective uniform width between a respective pair of rows of memory opening fill structures.

BRIEF DESCRIPTION OF THE DRAWINGS

FIG. 2B is a vertical cross-sectional view of the first exemplary structure of FIG. 2A.

FIG. 4A is a top-down view of the first exemplary structure after formation of sacrificial pillar structures according to the first embodiment of the present disclosure.

FIG. 4B is a vertical cross-sectional view of the first exemplary structure of FIG. 4A.

FIG. 10A is a top-down view of a region of the first exemplary structure after formation of memory cavities by removal of the sacrificial pillar structures according to the first embodiment of the present disclosure.

FIG. 10B is a vertical cross-sectional view of the first exemplary structure of FIG. 10A along the vertical plane B-B'.

FIG. 13A is a top-down view of a region of the first exemplary structure after formation of a cover dielectric layer according to the first embodiment of the present disclosure.

FIG. 13B is a vertical cross-sectional view of the first exemplary structure of FIG. 13A along the vertical plane B-B'.

FIG. 14A is a top-down view of a region of the first exemplary structure after patterning the cover dielectric layer into cover dielectric pillars according to the first embodiment of the present disclosure.

FIG. 14B is a vertical cross-sectional view of the first exemplary structure of FIG. 14A along the vertical plane B-B'.

FIG. 15A is a top-down view of a region of the first exemplary structure after removal of the sacrificial template layer according to the first embodiment of the present disclosure.

FIG. 15B is a vertical cross-sectional view of the first exemplary structure of FIG. 15A along the vertical plane B-B'.

FIG. 17A is a top-down view of a region of the first exemplary structure after formation of a dielectric matrix layer according to the first embodiment of the present disclosure.

FIG. 17B is a vertical cross-sectional view of the first exemplary structure of FIG. 17A along the vertical plane B-B'.

FIG. 18A is a top-down view of a region of the first exemplary structure after planarization of the dielectric matrix layer according to the first embodiment of the present disclosure.

FIG. 18B is a vertical cross-sectional view of the first exemplary structure of FIG. 18A along the vertical plane B-B'.

FIG. 19A is a top-down view of a region of the first exemplary structure after formation of drain-select-level line trenches according to the first embodiment of the present disclosure.

FIG. 19B is a vertical cross-sectional view of the first exemplary structure of FIG. 19A along the vertical plane B-B'.

FIG. 20A is a top-down view of a region of the first exemplary structure after patterning the continuous metallic material layer into drain-select-level gate electrodes according to the first embodiment of the present disclosure.

FIG. 20B is a vertical cross-sectional view of the first exemplary structure of FIG. 20A along the vertical plane B-B'.

FIG. 23A is a top-down view of a region of the first exemplary structure after replacement of the sacrificial material layers with electrically conductive layers according to the first embodiment of the present disclosure.

FIG. 23B is a vertical cross-sectional view of the first exemplary structure of FIG. 23A along the vertical plane B-B'.

FIG. 24A is a top-down view of a region of the first exemplary structure after formation of drain contact via structures according to the first embodiment of the present disclosure.

FIG. 24B is a vertical cross-sectional view of the first exemplary structure of FIG. 24A along the vertical plane B-B'.

FIG. 25A is a top-down view of a region of a second exemplary structure after formation of a sacrificial template layer according to the second embodiment of the present disclosure.

FIG. 25B is a vertical cross-sectional view of the second exemplary structure of FIG. 25A along the vertical plane B-B'.

FIG. 27A is a top-down view of a region of the second exemplary structure after formation of a blocking dielectric layer, a charge storage layer, a tunneling dielectric layer, a semiconductor channel material layer, and dielectric cores according to the second embodiment of the present disclosure.

FIG. 27B is a vertical cross-sectional view of the second exemplary structure of FIG. 27A along the vertical plane B-B'.

FIG. 29A is a top-down view of a region of the second exemplary structure after etchback of horizontal portions of the charge storage layer according to the second embodiment of the present disclosure.

FIG. 29B is a vertical cross-sectional view of the second exemplary structure of FIG. 29A along the vertical plane B-B'.

FIG. 30A is a top-down view of a region of the second exemplary structure after formation of a cover dielectric layer according to the second embodiment of the present disclosure.

FIG. 30B is a vertical cross-sectional view of the second exemplary structure of FIG. 30A along the vertical plane B-B'.

FIG. 32A is a top-down view of a region of the second exemplary structure after removal of the sacrificial template layer according to the second embodiment of the present disclosure.

FIG. 32B is a vertical cross-sectional view of the second exemplary structure of FIG. 32A along the vertical plane B-B'.

FIG. 33A is a top-down view of a region of the second exemplary structure after formation of a continuous metallic material layer according to the second embodiment of the present disclosure.

FIG. 33B is a vertical cross-sectional view of the second exemplary structure of FIG. 33A along the vertical plane B-B'.

FIG. 35A is a top-down view of a region of the second exemplary structure after planarization of the dielectric matrix layer according to the second embodiment of the present disclosure.

FIG. 35B is a vertical cross-sectional view of the second exemplary structure of FIG. 35A along the vertical plane B-B'.

FIG. 36A is a top-down view of a region of the second exemplary structure after formation of drain-select-level line trenches according to the second embodiment of the present disclosure.

FIG. 36B is a vertical cross-sectional view of the second exemplary structure of FIG. 36A along the vertical plane B-B'.

FIG. 38A is a top-down view of a region of the second exemplary structure after formation of isolation dielectric portions and annular dielectric portions according to the second embodiment of the present disclosure.

FIG. 38B is a vertical cross-sectional view of the second exemplary structure of FIG. 38A along the vertical plane B-B'.

FIG. 39A is a top-down view of a region of the second exemplary structure after replacement of the sacrificial material layers with electrically conductive layers according to the second embodiment of the present disclosure.

FIG. 39B is a vertical cross-sectional view of the second exemplary structure of FIG. 39A along the vertical plane B-B'.

FIG. 40A is a top-down view of a region of a third exemplary structure after formation of a blocking dielectric layer, a charge storage layer, and a sacrificial cover material layer according to a third embodiment of the present disclosure.

FIG. 40B is a vertical cross-sectional view of the third exemplary structure of FIG. 40A along the vertical plane B-B'.

FIG. 46A is a top-down view of a region of the third exemplary structure after formation of a continuous metallic material layer according to the third embodiment of the present disclosure.

FIG. 46B is a vertical cross-sectional view of the third exemplary structure of FIG. 46A along the vertical plane B-B'.

FIG. 50A is a top-down view of a region of the third exemplary structure after patterning the continuous metallic material layer into drain-select-level gate electrodes according to the third embodiment of the present disclosure.

FIG. 50B is a vertical cross-sectional view of the third exemplary structure of FIG. 50A along the vertical plane B-B'.

FIG. 51A is a top-down view of a region of the third exemplary structure after formation of isolation dielectric portions and annular dielectric portions according to the third embodiment of the present disclosure.

FIG. 51B is a vertical cross-sectional view of the third exemplary structure of FIG. 51A along the vertical plane B-B'.

FIG. 52A is a top-down view of a region of the third exemplary structure after replacement of the sacrificial material layers with electrically conductive layers according to the third embodiment of the present disclosure.

FIG. 52B is a vertical cross-sectional view of the third exemplary structure of FIG. 52A along the vertical plane B-B'.

DETAILED DESCRIPTION

Figure 1A:
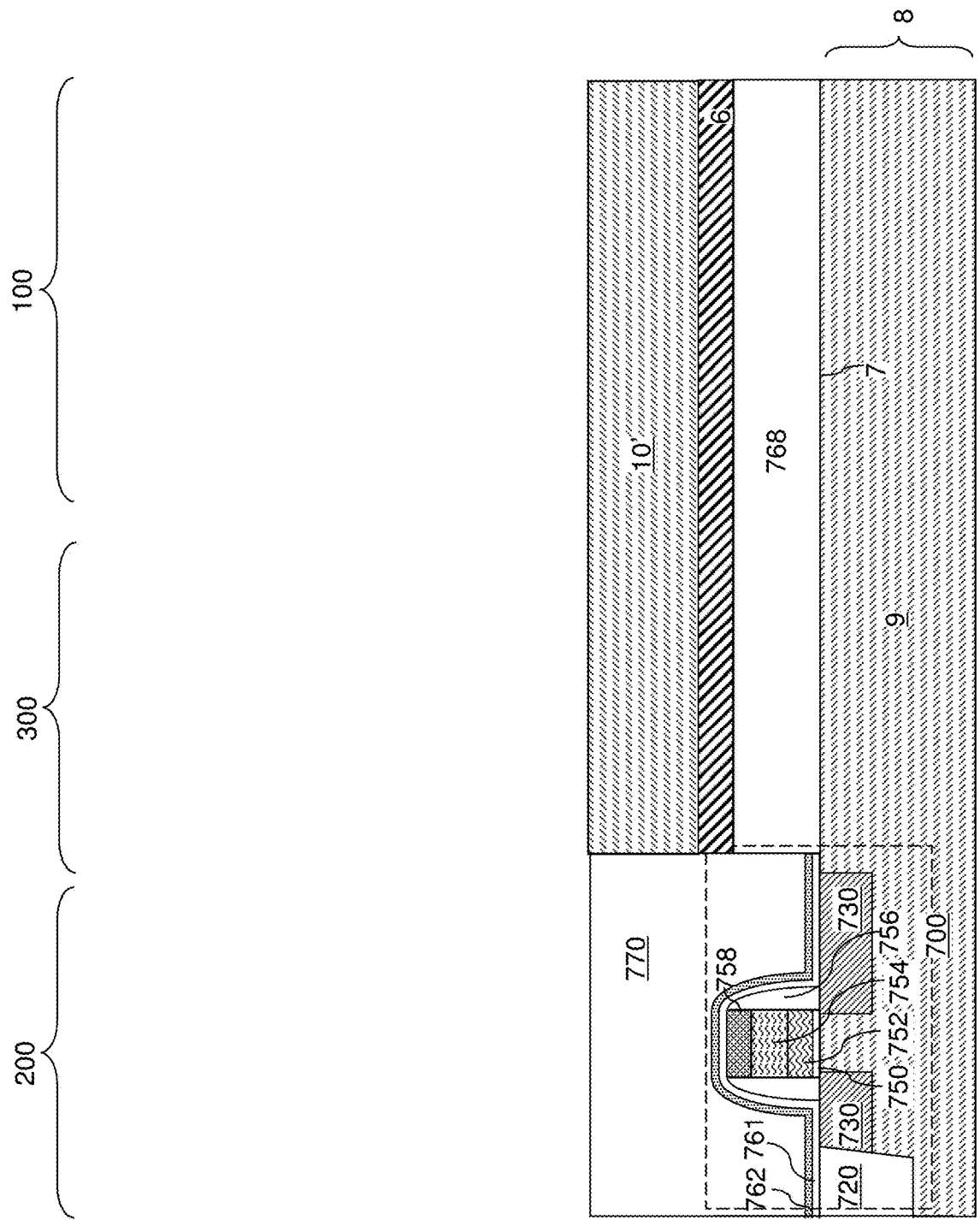
FIG. 1A is a schematic vertical cross-sectional view of a first exemplary structure after formation of at least one peripheral device, an insulating layer, a buried conductive layer, and in-process source-level material layers according to a first embodiment of the present disclosure.

As discussed above, the present disclosure is directed to a three-dimensional memory device including bottle-shaped memory stack structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
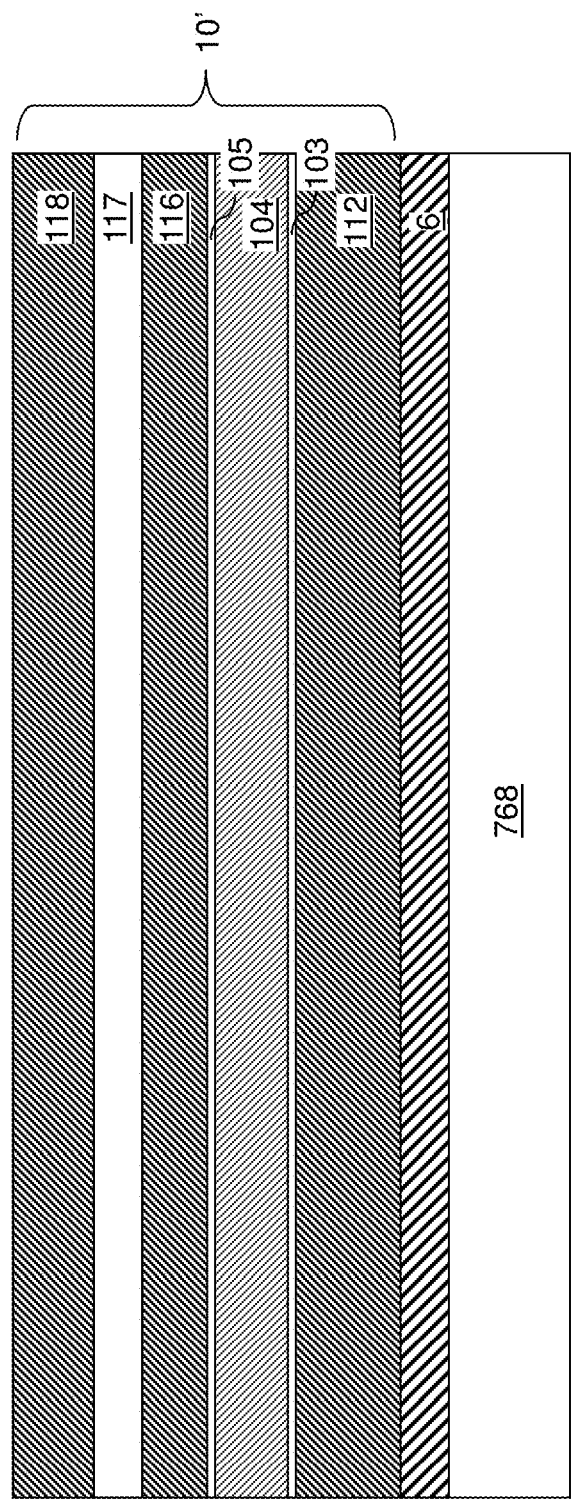
FIG. 1B is a vertical cross-sectional view of a layer stack of the insulating layer, the buried conductive layer, and the in-process source-level material layer of FIG. 1A.

Referring to FIGS. 1A and 1B, a first exemplary structure according to an embodiment of the present disclosure is illustrated, which can be employed, for example, to fabricate a device structure containing vertical NAND memory devices. The first exemplary structure includes a substrate 8, such as a silicon wafer or a silicon-on-insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. As used herein, an "in-process" element refers to an element that is modified during a subsequent processing step. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2A:
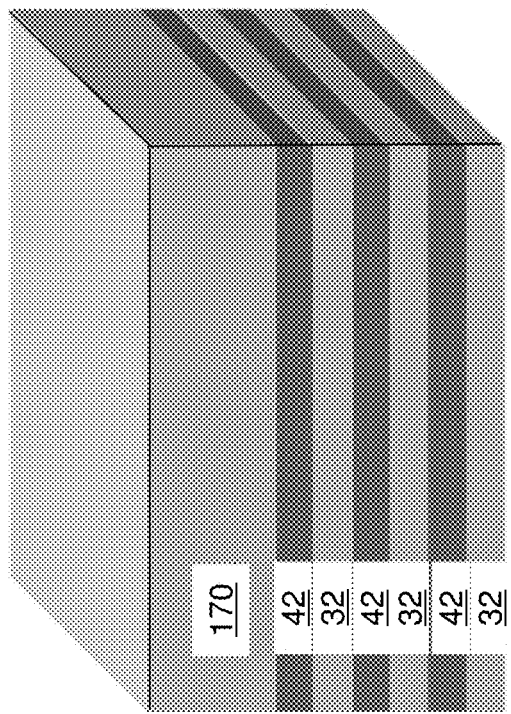
FIG. 2A is a perspective view of an upper region of the first exemplary structure after formation of an alternating stack of insulating layers and spacer material layers and a sacrificial matrix layer according to the first embodiment of the present disclosure.

Referring to FIGS. 2A and 2B, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

A sacrificial matrix layer 170 can be formed over the alternating stack (32, 42). The sacrificial matrix layer 170 includes a sacrificial material that is different from the material of the sacrificial material layers 42. In one embodiment, the sacrificial matrix layer 170 can include a silicate glass material such as undoped silicate glass or a doped silicate glass. Examples of doped silicate glasses include borosilicate glass, phosphosilicate glass, borophosphosilicate glass, and organosilicate glass. The sacrificial matrix layer 170 can be formed by a chemical vapor deposition process. For example, tetraethylorthosilicate (TEOS) can be thermally decomposed in the present or absence of dopant gases to form a doped silicate glass or an undoped silicate glass. The thickness of the sacrificial matrix layer 170 can be in a range from 50 nm to 300 nm, although lesser and greater thicknesses can also be employed.

A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the sacrificial matrix layer 170 and the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the sacrificial matrix layer 170 and the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the sacrificial matrix layer 170, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3A:
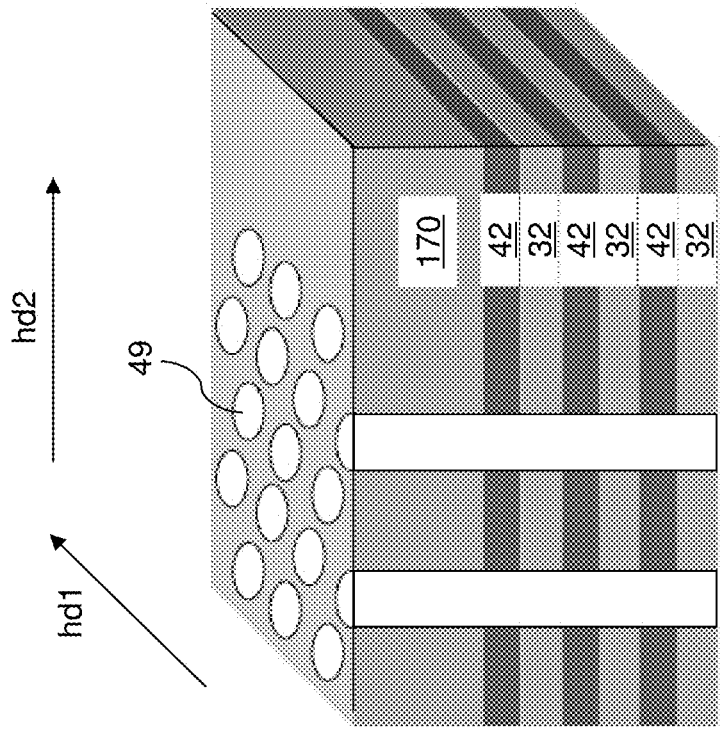
FIG. 3A is a perspective view of the upper region of the first exemplary structure after formation of memory openings and optional support openings according to the first embodiment of the present disclosure.
Figure 3B:
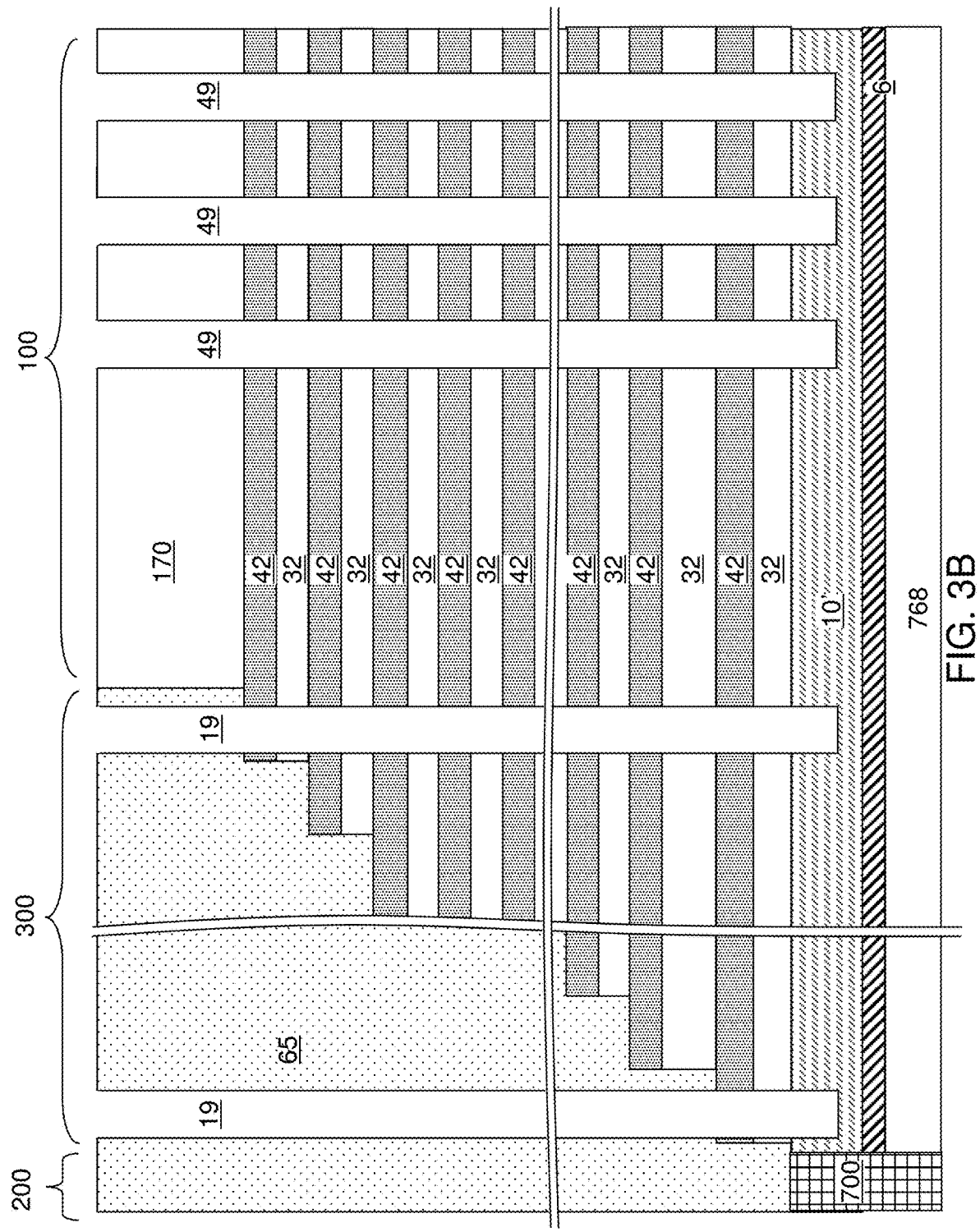
FIG. 3B is a vertical cross-sectional view of the first exemplary structure of FIG. 3A.

Referring to FIGS. 3A and 3B, a lithographic material stack (not shown) including at least a photoresist layer can be formed over the sacrificial matrix layer 170, and can be lithographically patterned to form openings therein. The openings include a first set of openings formed over the memory array region 100 and a second set of openings formed over the contact region 300. The pattern in the lithographic material stack can be transferred through the sacrificial matrix layer 170, the alternating stack (32, 42), and the retro-stepped dielectric material portion 65 by at least one anisotropic etch that employs the patterned lithographic material stack as an etch mask.

Portions of the sacrificial matrix layer 170 and the alternating stack (32, 42) underlying the openings in the patterned lithographic material stack within the memory array region 100 are etched to form memory openings 49. Portions of the sacrificial matrix layer 170, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the sacrificial matrix layer 170 to the lower source-level material layer 112 in the in-process source-level material layers 10. In one embodiment, an overetch into the lower source-level material layer 112 may be optionally performed after the top surface of the lower source-level material layer 112 is physically exposed at a bottom of each memory opening 49 and each support opening 19. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the lower source-level material layer 112.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

The memory openings 49 can be arranged in groups such that each group includes a plurality of rows of memory openings 49. Within each group of memory openings 49, the memory openings 49 can be arranged as rows that extend along the first horizontal direction hd1. The multiple rows can be spaced apart along the second horizontal direction hd2 that is perpendicular to the first horizontal direction hd1 with a uniform inter-row pitch for an entirety of the group of memory openings 49. In this case, the rows of memory openings 49 are "on-pitch," i.e., have a uniform pitch, along the second horizontal direction. In one embodiment, the memory openings can be arranged in clusters, i.e., groups, that include multiple rows of memory openings 49. In one embodiment, the memory openings 49 in a cluster can be arranged as a two-dimensional hexagonal array having a two-dimensional periodicity.

Figure 4C:
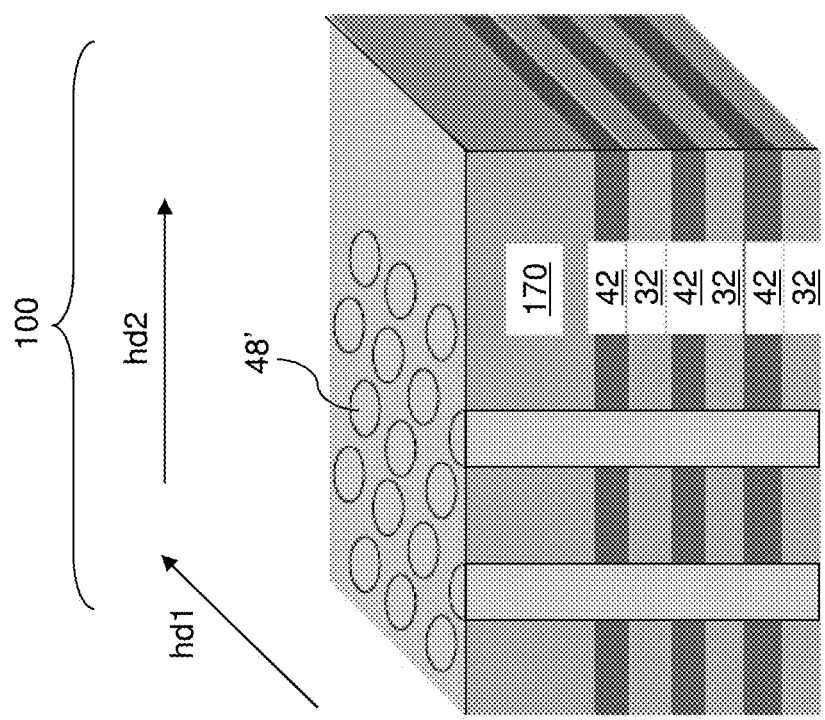
FIG. 4C is a perspective view of a region of the first exemplary structure of FIGS. 4A and 4B.

Referring to FIGS. 4A-4C, a sacrificial fill material can be deposited in the memory openings 49 and the support openings 19. The sacrificial fill material can be different from the materials of the sacrificial matrix layer 170, the insulating layers 32, and the sacrificial material layers 42. For example, the sacrificial fill material can include a semiconductor material such as amorphous silicon, polysilicon, or a silicon-germanium alloy. The sacrificial fill material can be deposited in the memory openings 49 and the support openings 19 by a conformal deposition process such as low pressure chemical vapor deposition (LPCVD) process. Excess portions of the sacrificial fill material can be removed from above the top surface of the sacrificial matrix layer 170 by a planarization process, which can include a recess etch process or a chemical mechanical planarization (CMP) process. Each remaining portion of the fill material in the memory openings 49 and the support openings 19 constitute an in-process sacrificial pillar structure 48. Each in-process sacrificial pillar structure 48 can have a top surface within the horizontal plane of the top surface of the sacrificial matrix layer 170. The in-process sacrificial pillar structures 48 filling the memory openings 49 can have the same periodicity as the memory openings. The in-process sacrificial pillar structures 48 are formed through the sacrificial matrix layer 170 and the alternating stack (32, 42). Each of the in-process sacrificial pillar structures 48' comprises a straight sidewall that extends from a bottom surface of the alternating stack (32, 42) to a top surface of the sacrificial matrix layer 170.

Figure 5A:
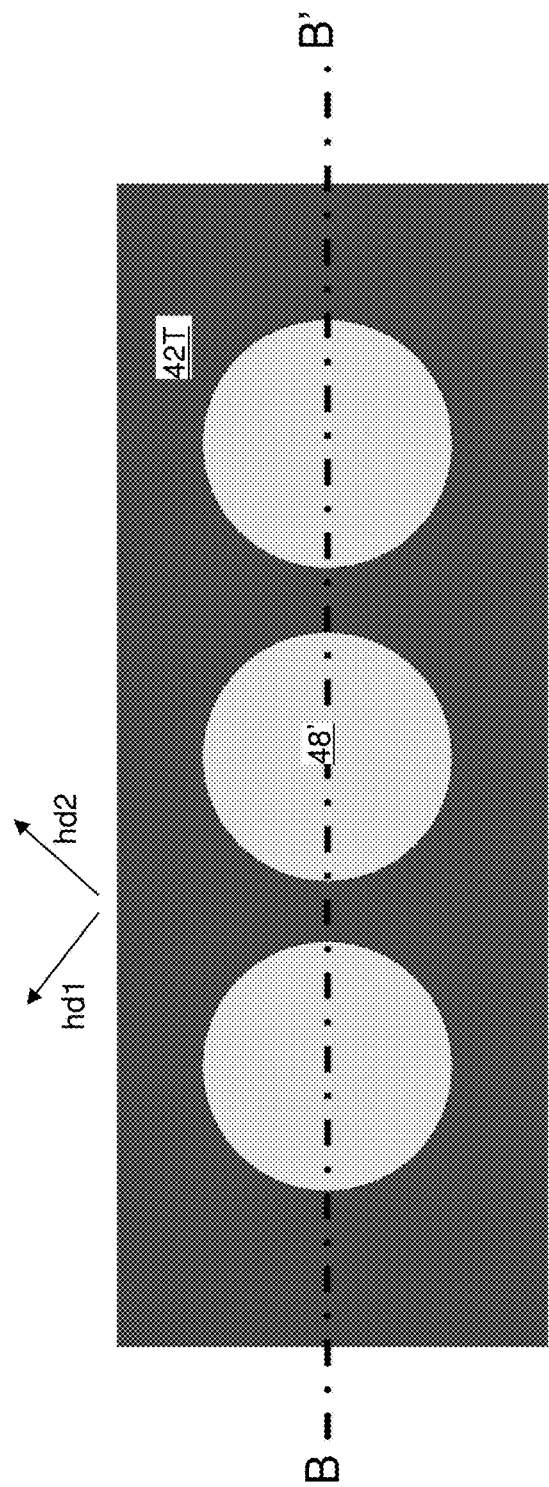
FIG. 5A is a top-down view of a region of the first exemplary structure after removal of the sacrificial matrix layer according to the first embodiment of the present disclosure.
Figure 5B:
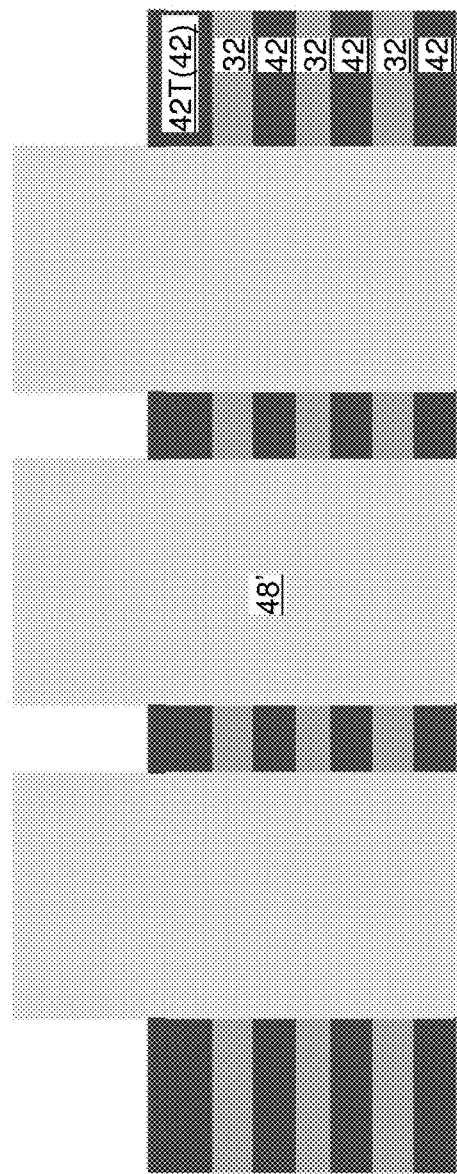
FIG. 5B is a vertical cross-sectional view of the first exemplary structure of FIG. 5A along the vertical plane B-B'.

Referring to FIGS. 5A and 5B, the sacrificial matrix layer 170 can be removed selective to the materials of the topmost sacrificial material layer 42T and the in-process sacrificial pillar structures 48'. For example, if the topmost sacrificial material layer 42T comprises silicon nitride and if the in-process sacrificial pillar structures 48' include a semiconductor material such as amorphous silicon, the sacrificial matrix layer 170 can be removed selective to the topmost sacrificial material layer 42T and the in-process sacrificial pillar structures 48' by performing a wet etch process employing dilute hydrofluoric acid.

Figure 6A:
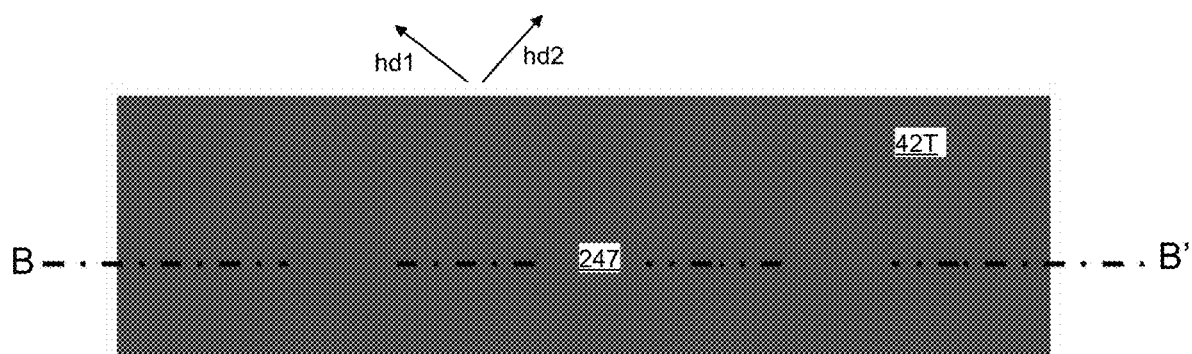
FIG. 6A is a top-down view of a region of the first exemplary structure after conversion of surface portions of the sacrificial pillar structures into semiconductor oxide portions according to the first embodiment of the present disclosure.
Figure 6B:
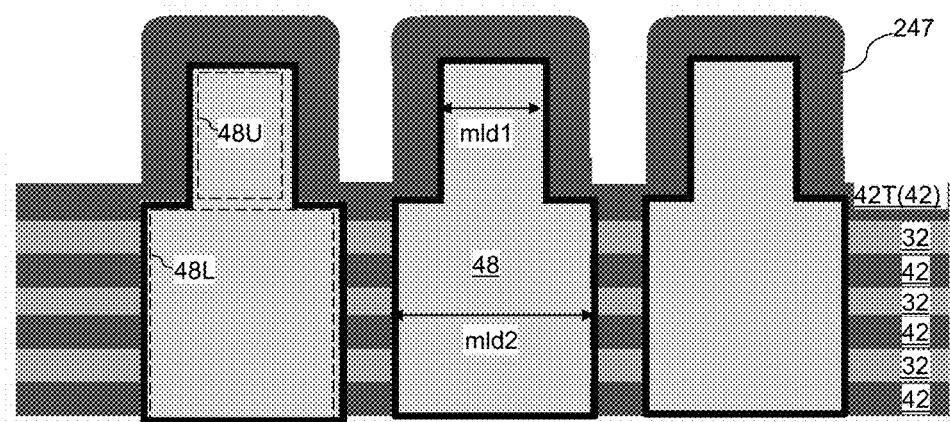
FIG. 6B is a vertical cross-sectional view of the first exemplary structure of FIG. 6A along the vertical plane B-B'.

Referring to FIGS. 6A and 6B, each of the in-process sacrificial pillar structures 48' is modified to isotropically reduce a lateral extent thereof above the alternating stack (32, 42) without reducing the lateral extent at levels below the topmost sacrificial material layer 42T of the alternating stack (32, 42). In other words, upper regions of the in-process sacrificial pillar structures 48' that protrude above a topmost surface of the alternating stack (32, 42) are thinned to provide sacrificial pillar structures 48 that have a lesser lateral dimension in upper regions protruding above the alternating stack (32, 42) compared to lower regions embedded in the alternating stack (32, 42).

Figure 7A:
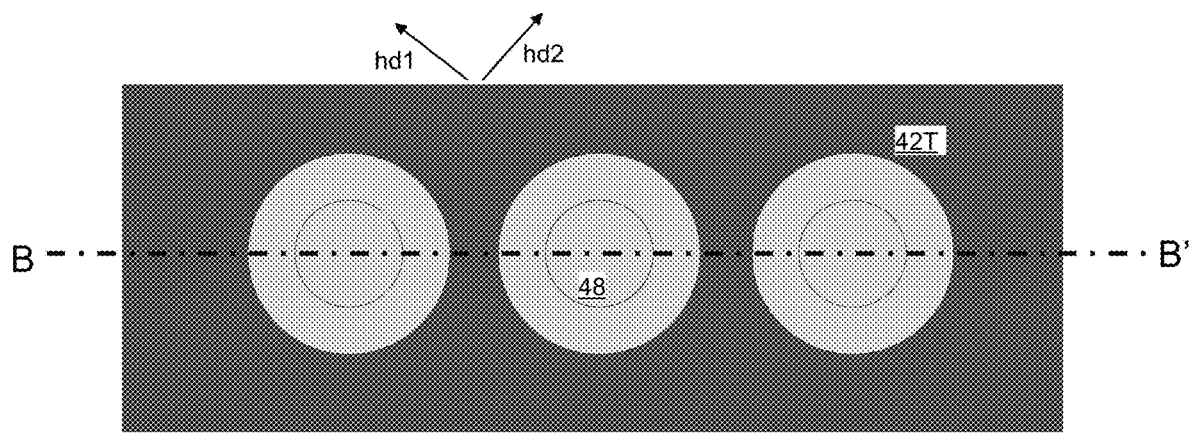
FIG. 7A is a top-down view of a region of the first exemplary structure after removal of the semiconductor oxide portions according to the first embodiment of the present disclosure.
Figure 7B:
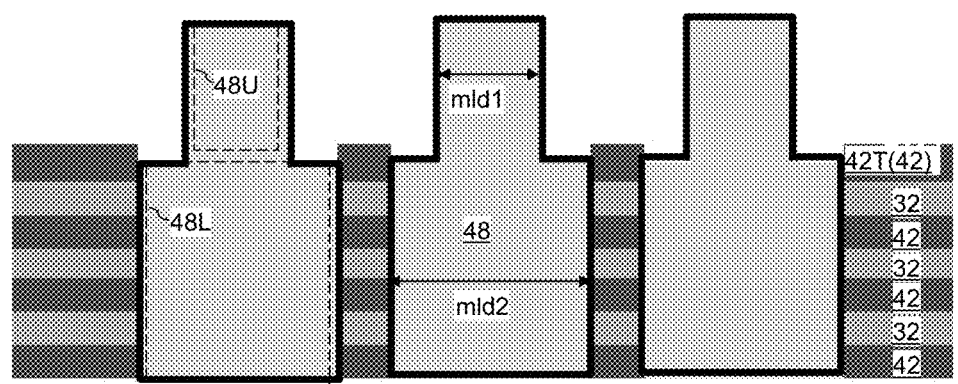
FIG. 7B is a vertical cross-sectional view of the first exemplary structure of FIG. 7A along the vertical plane B-B'.

In one embodiment, thinning the upper regions of the in-process sacrificial pillar structures 48' comprises forming semiconductor oxide portions 247 by oxidizing surface portions of the in-process sacrificial pillar structures 48' and subsequently removing the semiconductor oxide portions 247, as shown in FIGS. 7A and 7B. For example, an oxidation process can be performed to convert physically exposed surface portions of the in-process sacrificial pillar structures 48' into semiconductor oxide portions 247. For example, if the in-process sacrificial pillar structures 48' include amorphous silicon, a thermal oxidation process can be performed to convert surface portions of the in-process sacrificial pillar structures 48' into silicon oxide portions. Each remaining portion of an in-process sacrificial pillar structure 48' constitutes a sacrificial pillar structure 48. Each sacrificial pillar structure 48 can have an upper region 48U having a respective maximum lateral dimension, which is herein referred to as a first maximum lateral dimension mld1, and a lower region 48L having a respective maximum lateral dimension, which is herein referred to as a second maximum lateral dimension mld2, which is greater than dimension mdl1. The upper region 48U can be located above the horizontal plane including the bottom surface of the topmost sacrificial material layer 42T, and the lower region 48L can be located below the horizontal plane including the top surface of the topmost sacrificial material layer 42T. Thus, the sacrificial pillar structures 48 extend through the alternating stack (32, 42) and include a respective upper region 48U that protrudes above the alternating stack (32, 42) and having a first maximum lateral dimension mld1 and a respective lower region 48L embedded within the alternating stack (32, 42) and having a second maximum lateral dimension mld2 that is greater than the first maximum lateral dimension mld1.

Referring to FIGS. 7A and 7B, the semiconductor oxide portions 247 can be removed selective to the sacrificial pillar structures 48 and the topmost sacrificial material layer 42T. For example, a wet etch process employing dilute hydrofluoric acid can be performed to isotropically etch the semiconductor oxide portions 247 without etching the sacrificial pillar structures 48 and the topmost sacrificial material layer 42T. The sacrificial pillar structures 48 extend through the alternating stack (32, 42), and includes a respective upper region 48U that protrudes above the alternating stack (32, 42) and having a first maximum lateral dimension mld1 and a respective lower region 48L embedded within the alternating stack (32, 42) and having a second maximum lateral dimension mld2 that is greater than the first maximum lateral dimension mld1.

Figure 8A:
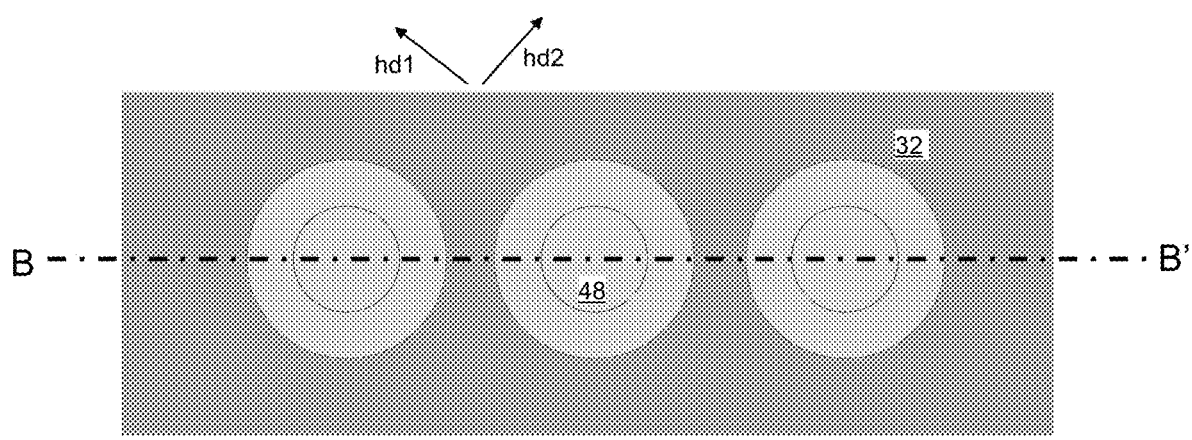
FIG. 8A is a top-down view of a region of the first exemplary structure after removal of a topmost sacrificial material layer according to the first embodiment of the present disclosure.
Figure 8B:
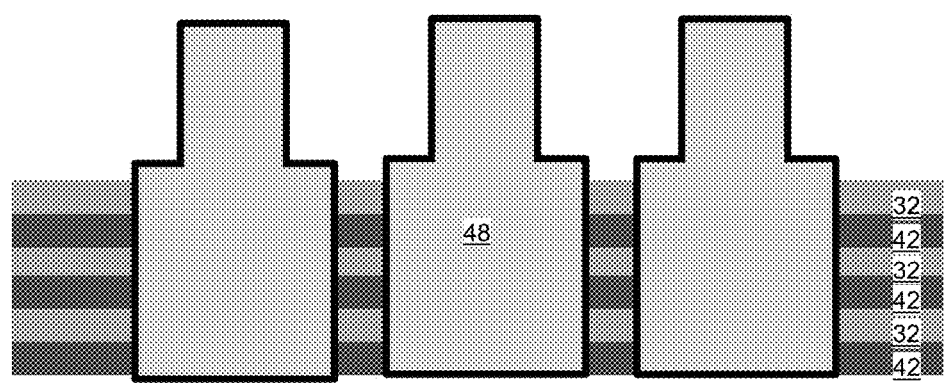
FIG. 8B is a vertical cross-sectional view of the first exemplary structure of FIG. 8A along the vertical plane B-B'.

Referring to FIGS. 8A and 8B, the topmost sacrificial material layer 42T can be removed selective to the insulating layers 32 and the sacrificial pillar structures 48. For example, if the topmost sacrificial material layer 42T includes silicon nitride, a wet etch process employing hot phosphoric acid can be employed to remove the topmost sacrificial material layer 42T.

Figure 9A:
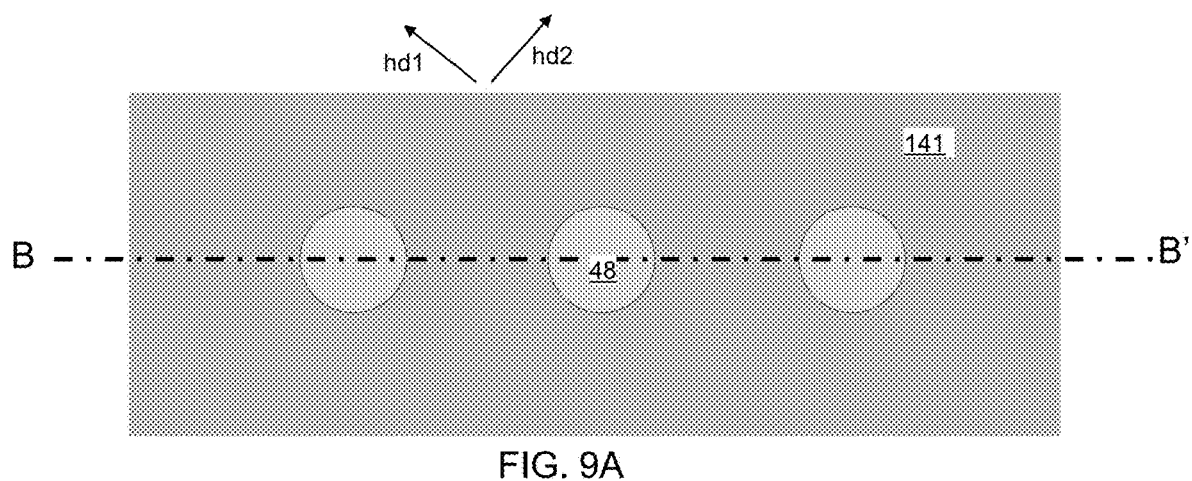
FIG. 9A is a top-down view of a region of the first exemplary structure after formation of a sacrificial template layer according to the first embodiment of the present disclosure.
Figure 9B:
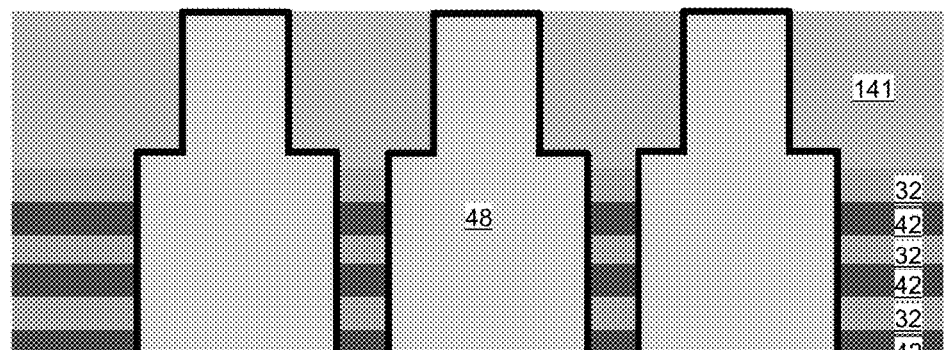
FIG. 9B is a vertical cross-sectional view of the first exemplary structure of FIG. 9A along the vertical plane B-B'.

Referring to FIGS. 9A and 9B, a sacrificial template material can be deposited above alternating stack and around the sacrificial pillar structures 48. The sacrificial template material is different from the materials of the sacrificial pillar structures 48 and the insulating layers 32, and may be the same as, or may be different from, the material of the sacrificial material layers 42. In one embodiment, the sacrificial template material can include heavily boron-doped polysilicon or heavily boron-doped amorphous silicon having a dopant concentration between $1\times10^{19}$ and $1\times10^{22}$ cm$^{-3}$ which is resistant to a wet etch process used to etch low doped or undoped amorphous silicon having a dopant concentration below $1\times10^{18}$ cm$^{-3}$. Alternatively, the sacrificial template material can include borosilicate glass having a higher etch rate than undoped silicate glass. The sacrificial template material can be deposited by a conformal deposition process such as low pressure chemical vapor deposition (LPCVD). Excess portions of the sacrificial template material can be removed from above the top surface of the sacrificial pillar structures 48 by a planarization process such as chemical mechanical planarization. The remaining continuous portion of the sacrificial template material forms a sacrificial template layer 141, which laterally surrounds upper end portions of the sacrificial pillar structures 48. The top surfaces of the sacrificial pillar structures 48 can be coplanar with the top surfaces of the sacrificial template layer 141.

Referring to FIGS. 10A and 10B, an isotropic etchant that etches the material of the sacrificial pillar structures 48, such as an undoped or low doped amorphous silicon having a p-type or n-type dopant concentration below $1\times10^{18}$ cm$^{-3}$ selective to the materials of the sacrificial template layer 141 and the insulating layers 32 can be applied to the first exemplary structure. The sacrificial pillar structures 48 are removed by the isotropic etchant to form memory cavities 49", which are unfilled volumes of the memory openings 49 at this processing step. For example, if the sacrificial pillar structures 48 comprise undoped amorphous silicon, the sacrificial pillar structures 48 can be removed by a wet etch process using a mixture of potassium hydroxide (KOH), isopropyl alcohol (IPA) and water, such as 20 to 28 percent KOH—water—saturated IPA solution, as described in E. Bassous, et al., *Highly selective KOH based etchant for boron doped silicon structures*, Microelectronic Engineering 9(1-4) pp. 167-170, May 1989, incorporated herein by reference in its entirety.

Figure 11A:
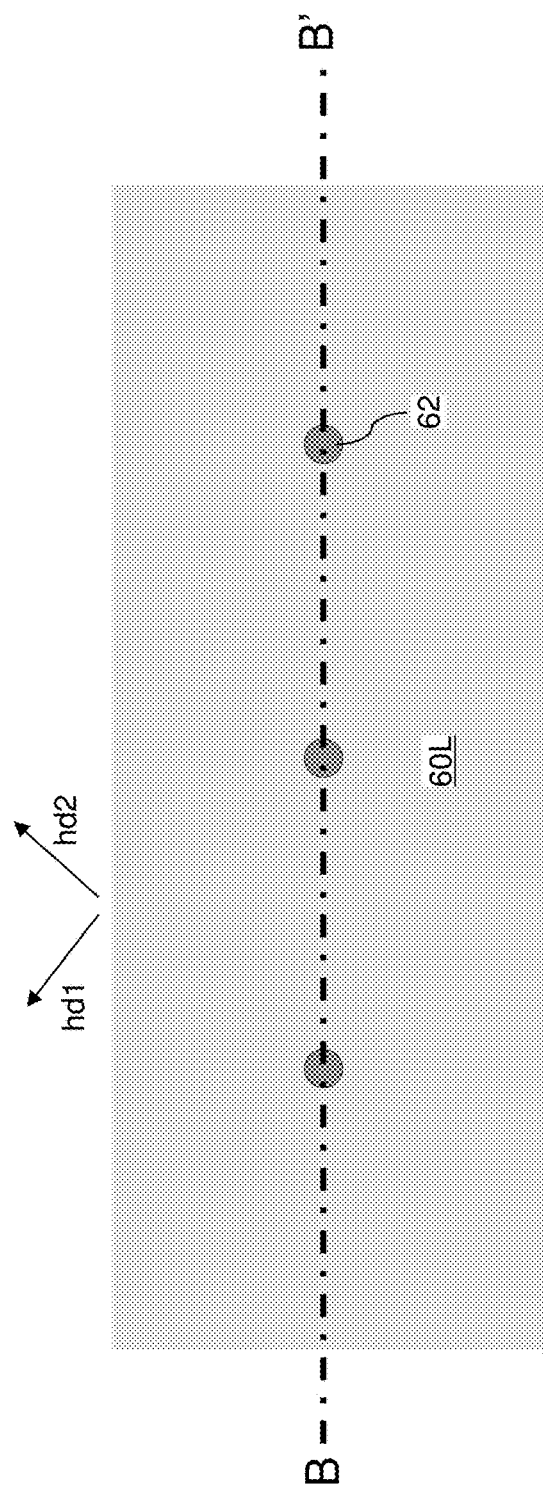
FIG. 11A is a top-down view of a region of the first exemplary structure after formation of a blocking dielectric layer, a charge storage layer, a tunneling dielectric layer, a semiconductor channel material layer, and dielectric cores according to the first embodiment of the present disclosure.
Figure 11B:
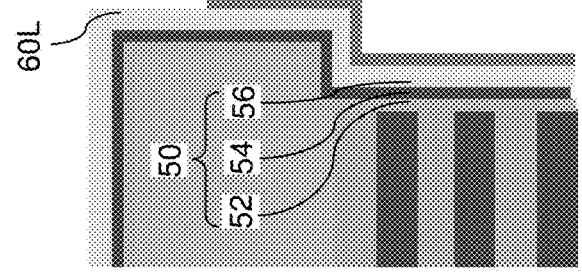
FIG. 11B is a vertical cross-sectional view of the first exemplary structure of FIG. 11A along the vertical plane B-B'.

Referring to FIGS. 11A and 11B, a memory film 50 and a semiconductor channel material layer 60L can be sequentially deposited in the memory opening 49. Each memory film 50 can include a stack of layers including a blocking dielectric layer 52, a charge storage layer 54, and a tunneling dielectric layer 56.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. The semiconductor channel material layer 60L can have a doping of a first conductivity type at a dopant concentration in a range from $1.0 \times 10^{14}/cm^3$ to $3.0 \times 10^{17}/cm^3$. A memory cavity 49' is formed in the volume of each memory opening 49 that is not filled with the deposited material layers (52, 54, 56, 60L).

A dielectric material is deposited on the semiconductor channel material layer and is vertically recessed to form dielectric cores 62. The top surfaces of the dielectric cores 62 can be located between the first horizontal plane including the top surface of the sacrificial template layer 141 and the second horizontal plane including the bottommost surface of the sacrificial template layer 141. Core cavities (i.e., air gaps) 69 can be formed in the volumes within the dielectric cores 62 that are not filled with the material of the dielectric cores 62. Each dielectric core 62 can embed a core cavity 69 that is devoid of any solid material therein. An upper cylindrical portion of each dielectric core 62 protrudes above the respective core cavity 69 above a horizontal plane including a bottom surface of the sacrificial template layer 141. Each core cavity 69 can have a maximum lateral dimension mldc that is greater than a maximum lateral dimension of the upper cylindrical portion of the dielectric core 62.

Figure 12A:
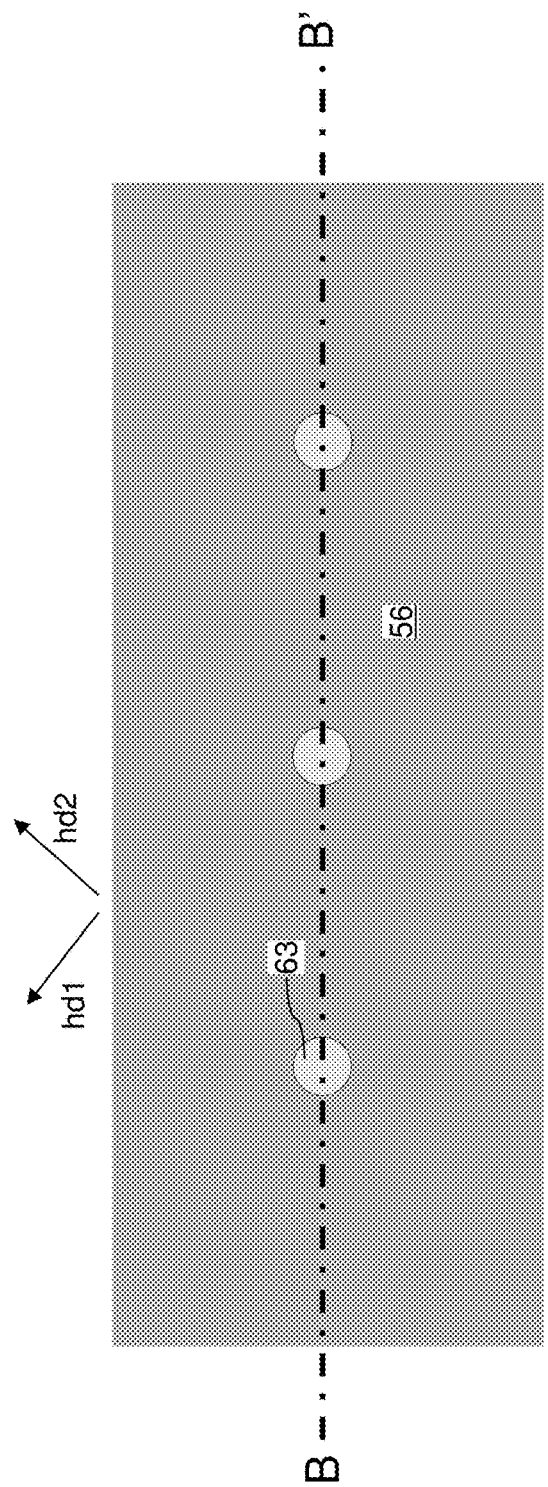
FIG. 12A is a top-down view of a region of the first exemplary structure after formation of drain regions according to the first embodiment of the present disclosure.
Figure 12B:
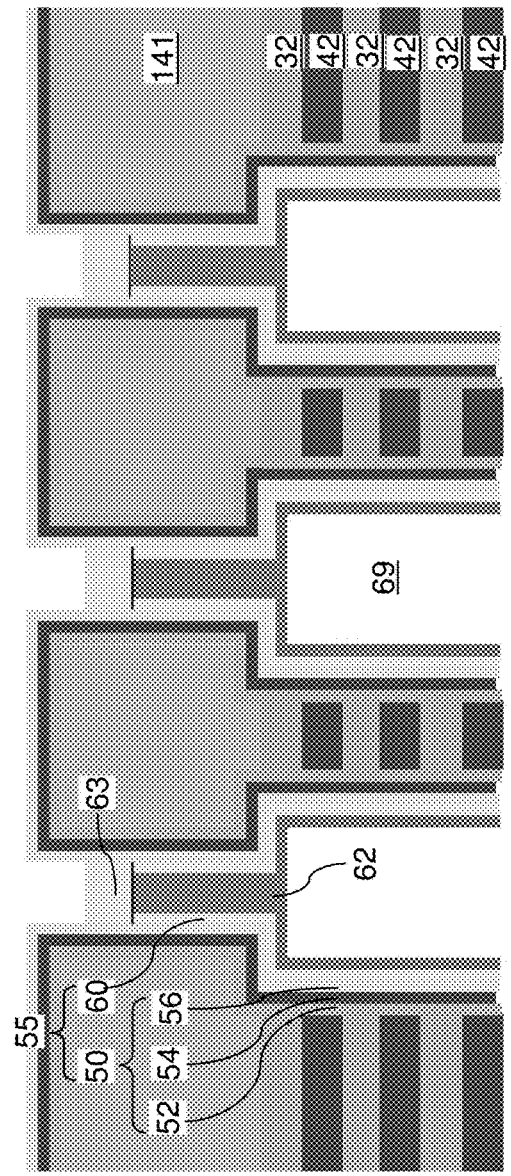
FIG. 12B is a vertical cross-sectional view of the first exemplary structure of FIG. 12A along the vertical plane B-B'.

Referring to FIGS. 12A and 12B, portions of the semiconductor channel material layer 60L overlying the top surfaces of the dielectric cores 62 can be removed, for example, by an isotropic etch process. Each remaining portion of the semiconductor channel material layer 60L constitutes a semiconductor channel 60, which can have a doping of the first conductivity type or can be intrinsic. A combination of a semiconductor channel 60 and portions of the memory film 50 located within a memory cavity constitutes a memory stack structure 55, which includes portions of the charge storage layer 54 at the levels of the sacrificial material layers 42 as memory elements. Each memory stack structure 55 includes a vertical stack of annular memory elements, i.e., annular portions of the charge storage layer 54 located at the levels of the sacrificial material layers 42.

A doped semiconductor fill material having a doping of a second conductivity type (which is the opposite of the first conductivity type) can be deposited in recesses above the top surfaces of the dielectric cores 62. The doped semiconductor fill material can be recessed such that each remaining portion of the doped semiconductor fill material has a top surface located below a horizontal plane including the top surface of the sacrificial template layer 141. Each remaining portion of the doped semiconductor fill material constitutes a drain region 63. Each drain region 63 is formed at an upper end of a respective semiconductor channel 60. Alternatively, the drain region 63 may be formed by depositing a doped or undoped semiconductor material followed by ion implanting dopants of the second conductivity type into the semiconductor material.

Referring to FIGS. 13A and 13B, a cover dielectric layer 64L can be formed over the drain regions 63 and the memory film 50. The cover dielectric layer 64L includes a planarizable dielectric material such as silicon oxide.

Referring to FIGS. 14A and 14B, portions of the cover dielectric layer 64L and portions of the memory film 50 that overlie top surface of the sacrificial template layer 141 are removed by a planarization process. The planarization process can employ a recess etch and/or chemical mechanical planarization. Each remaining discrete portion of the cover dielectric layer 64L constitutes a cover dielectric pillar 64.

Each sacrificial pillar structure 48 is replaced with a memory opening fill structure 58. Each memory opening structure 58 comprises a respective set of a memory film 50, a semiconductor channel 60, a dielectric core 62, a core cavity 69, a drain region 63, and a cover dielectric pillar 64.

Each semiconductor channel 60 comprises a respective first vertically-extending portion extending through levels of the sacrificial material layers 42 and having a first maximum lateral channel dimension mlcd1, a respective second vertically-extending portion located at a level of the sacrificial template layer 141 and having a second maximum lateral channel dimension mlcd2 that is less than the first maximum lateral channel dimension mlcd1, a respective annular portion having an outer periphery that is adjoined to an upper end of the respective first vertically-extending portion and an inner periphery that is adjoined to a lower end of the respective second vertically-extending portion.

In one embodiment, each semiconductor channel 60 is laterally surrounded by a memory film 50 that includes three portions: a first vertical memory film portion that contacts, and laterally surrounds, the respective first vertically-extending portion of one of the semiconductor channels 60; a second vertical memory film portion that contacts, and laterally surrounds, the respective second vertically-extending portion of the one of the semiconductor channels 60; and an annular memory film portion that contacts, and overlies, the annular portion of one of the semiconductor channels 60. In one embodiment, each of the first vertical memory film portion and the second vertical memory film portion comprises a respective portion of a blocking dielectric layer 52, a respective portion of a charge storage layer 54, and a respective portion of a tunneling dielectric layer 56.

Each of the memory opening fill structures 58 comprises an encapsulated cavity 69 that vertically extends through each level of the sacrificial material layers 42. In one embodiment, each of the memory opening fill structures 58 comprises a dielectric core 62. The dielectric core 62 includes a closed inner surface that defines an entire volume of the encapsulated cavity 69. As used herein, a closed surface refers to a surface that is homeomorphic to a surface of a sphere. In one embodiment, the dielectric core 62 includes a neck portion located above the encapsulated cavity 69 and protrudes through the sacrificial template layer 141.

Referring to FIGS. 15A and 15B, the sacrificial template layer 141 can be removed selective to the memory films 50 and the cover dielectric pillars 64. For example, if the sacrificial template layer 141 includes doped polysilicon or doped amorphous silicon, a wet etch process employing ammonium hydroxide can be employed to remove the sacrificial template layer 141. Outer sidewalls of the upper portions of the memory films 50 and annular top surfaces of the memory films 50 can be physically exposed after removal of the sacrificial template layer 141.

Figure 16A:
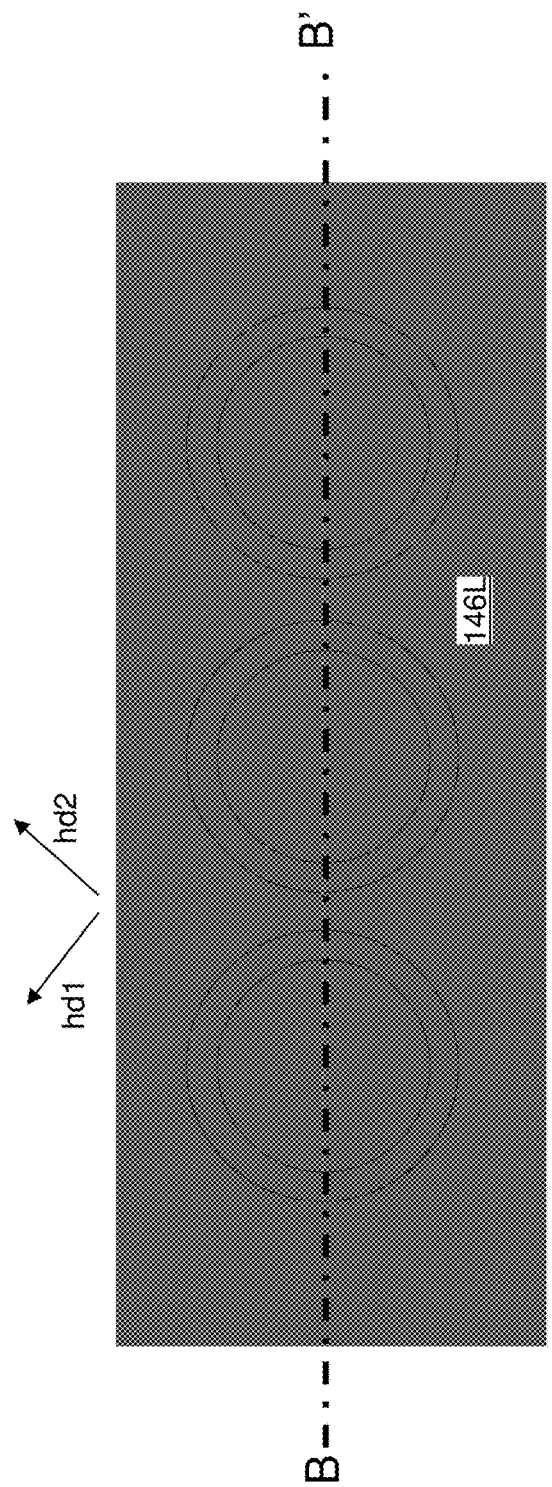
FIG. 16A is a top-down view of a region of the first exemplary structure after formation of a continuous metallic material layer according to the first embodiment of the present disclosure.
Figure 16B:
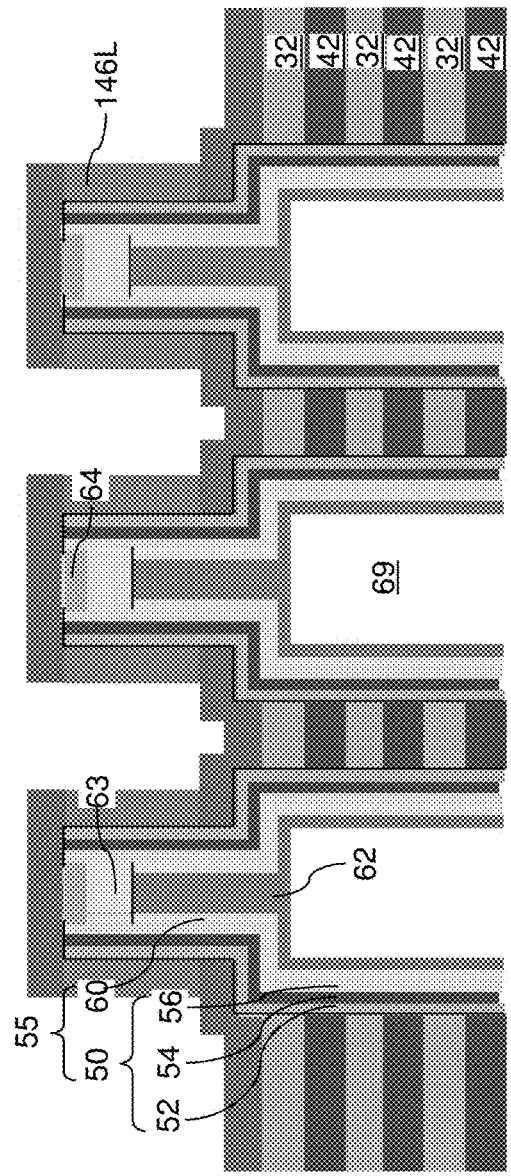
FIG. 16B is a vertical cross-sectional view of the first exemplary structure of FIG. 16A along the vertical plane B-B'.

Referring to FIGS. 16A and 16B, a continuous metallic material layer 146L can be formed over the alternating stack (32, 42) and the memory opening fill structures 58. Optionally, a gate dielectric or a blocking dielectric layer, such as an aluminum oxide layer may be deposited over the formed over the alternating stack (32, 42) and the memory opening fill structures 58 followed by depositing the continuous metallic material layer 146L over the dielectric. For example, at least one electrically conductive material can be deposited by a conformal deposition process, such as chemical vapor deposition or a non-conformal deposition process, such as sputtering. The at least one electrically conductive material is conformally deposited directly on physically exposed outer surfaces of the memory stack structures 55. The at least one electrically conductive material can include a metallic nitride liner material and a metallic fill material. The metallic nitride liner material can comprise, for example, TiN, TaN, and/or WN. The metallic fill material can comprise, for example, W, Co, Mo, and Ru. The thickness of the continuous metallic material layer 146L can be selected such that neighboring vertical portions of the continuous metallic material layer 146L do not contact each other. For example, the thickness of the continuous metallic material layer 146L can be in a range from 10 nm to 160 nm, such as from 20 nm to 80 nm, although lesser and greater thicknesses can also be employed.

Referring to FIGS. 17A and 17B, a dielectric material can be deposited over the continuous metallic material layer 146L by a conformal or non-conformal deposition process. A dielectric matrix layer 172 is formed. The dielectric material of the dielectric matrix layer 172 can include undoped silicate glass, doped silicate glass, organosilicate glass, or a combination thereof. For example, the dielectric matrix layer 172 can include silicon oxide.

Referring to FIGS. 18A and 18B, the dielectric matrix layer 172 and the continuous metallic material layer 146L can be planarized, for example, by chemical mechanical planarization. For example, portions of the dielectric matrix layer 172 and the continuous metallic material layer 146L that overlie the horizontal plane including the top surfaces of the cover dielectric pillars 64 can be removed by chemical mechanical planarization. Top surfaces of the cover dielectric pillar 64 can be physically exposed. Further, annular top surfaces of the continuous metallic material layer 146L can be physically exposed after the planarization process.

Referring to FIGS. 19A and 19B, drain-select-level line trenches 179 can be formed by patterning the dielectric matrix layer 179. Specifically, the drain-select-level line trenches 179 can be formed by removing portions of the dielectric matrix layer 172 located within areas having a respective uniform width. The areas can include rectangular areas that laterally extend along the first horizontal direction hd1 and having a uniform width along the second horizontal direction hd2. For example, a masking layer (not shown), such as a photoresist layer, can be applied over the first exemplary structure, and can be patterned by lithographic exposure and development to cover multiple areas within the memory array region 100. Unmasked portions of the dielectric matrix layer 172 can be etched by an anisotropic etch process employing the patterned photoresist layer as an etch mask. The drain-select-level line trenches 179 are formed between neighboring remaining portions of the dielectric matrix layer 172.

The drain-select-level line trenches 179 include a respective pair of laterally undulating sidewalls that generally extend along the first horizontal direction hd1. Each of the drain-select-level line trenches 179 can have a laterally alternating sequence of vertical planar sidewall segments and vertical convex sidewall segments. The vertical planar sidewall segments of each laterally undulating sidewall can be sidewall segments of a patterned portion of the dielectric matrix layer 172, and can be located within a same vertical plane. The vertical convex sidewall segments of each laterally undulating sidewall can be physically exposed cylindrical sidewall segments of the continuous metallic material layer 146L. Each vertical convex sidewall segment has a convex profile in a horizontal cross-sectional view, and extends vertically along the vertical direction with the same horizontal cross-sectional profile. Optionally, the photoresist layer can be removed, for example, by ashing.

Referring to FIGS. 20A and 20B, physically exposed portions of the continuous metallic material layer 146L can be anisotropically etched. The anisotropic etch process can be selective to the material of the dielectric matrix layer 172, i.e., does not etch the material of the dielectric matrix layer 172 significantly. Unmasked portions of the continuous metallic material layer 146L can be removed by the anisotropic etch process. The anisotropic etch process patterns the continuous metallic material layer 146L into drain-select-level gate electrodes 146. Thus, the drain-select-level gate electrodes 146 comprise remaining portions of the continuous metallic material layer 146L. If a gate or blocking dielectric is located below the continuous metallic material layer 146L, then it can be patterned at the same time to form a gate or blocking dielectric.

In one embodiment, the combination of the processing steps of FIGS. 18A, 18B, 19A, 19B, 20A, and 20B removes horizontal portions of the continuous metallic material layer 146L that overlie the memory opening fill structures 58 or located within areas of a respective uniform width between a respective pair of rows of memory opening fill structures 58. Each of the drain-select-level gate electrodes 146 can include a planar portion having two sets of vertical sidewall segments and a set of cylindrical portions vertically protruding upward from the planar portion and laterally surrounding a respective one of the memory stack structures 55. Each set of vertical sidewall segments of a drain-select-level gate electrode 146 can be located within a respective vertical plane.

Figure 21A:
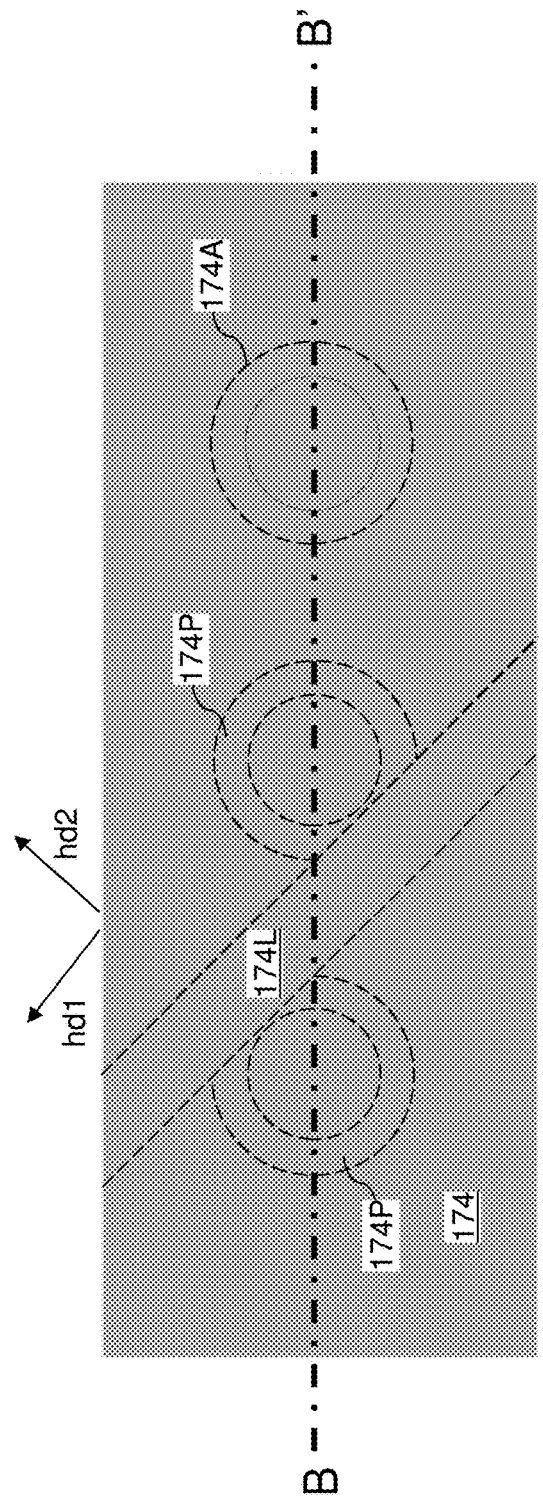
FIG. 21A is a top-down view of a region of the first exemplary structure after formation of a contact level dielectric layer according to the first embodiment of the present disclosure.
Figure 21B:
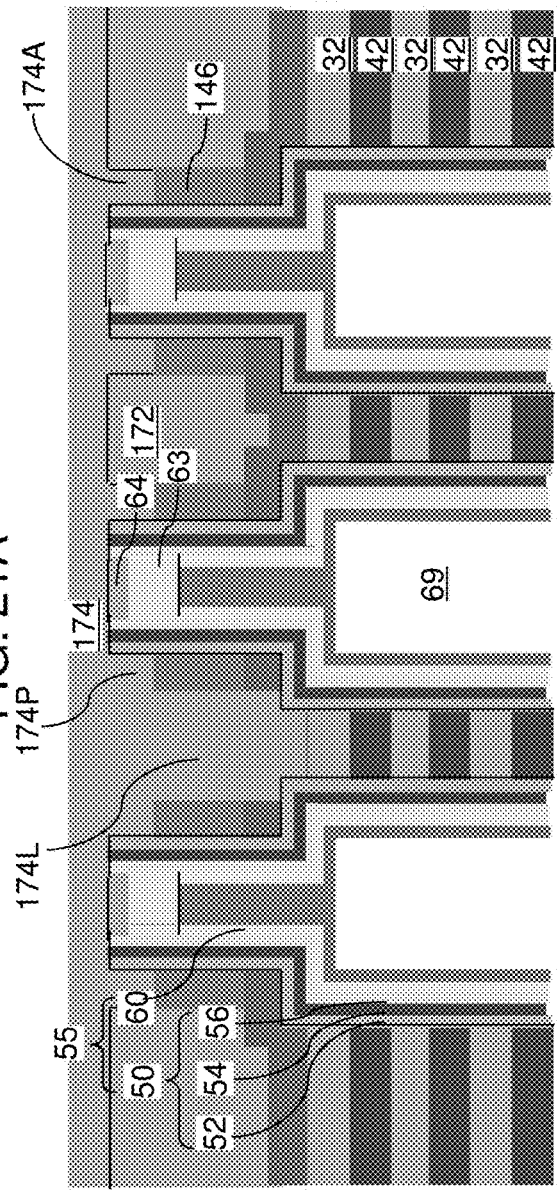
FIG. 21B is a vertical cross-sectional view of the first exemplary structure of FIG. 21A along the vertical plane B-B'.

Referring to FIGS. 21A and 21B, a contact level dielectric layer 174 can be formed by depositing a dielectric material such as silicon oxide. The contact level dielectric layer 174 is formed in volumes from which portions of the continuous metallic material layer 146L are removed. The contact level dielectric layer 174 can include isolation dielectric portions (174L, 174P). Each isolation dielectric portion (174L, 174P) can include a dielectric line portion 174L laterally extending along the first horizontal direction hd1, contacting sidewall segments of two planar portions of the drain-select-level gate electrodes 146, and sidewalls of two rows of cylindrical portions of the drain-select-level gate electrodes 146. Each isolation dielectric portion (174L, 174P) can also include a plurality of loop portions 174P adjoined to sides of the dielectric line portion 174L and overlying a respective cylindrical portion in two rows of cylindrical portions of the drain-select-level gate electrodes 146.

In one embodiment, each sidewall of the plurality of loop portions 174P is vertically coincident with a sidewall of an underlying one of the plurality of cylindrical portions of the drain-select-level gate electrodes 146. The contact level dielectric layer 174 can include annular dielectric portions 174A overlying additional cylindrical portions of the drain-select-level gate electrodes 146. The annular dielectric portions 174A comprise a same material as the isolation dielectric portion (174L, 174P) and are laterally spaced from the isolation dielectric portion (174L, 174P).

Figure 22A:
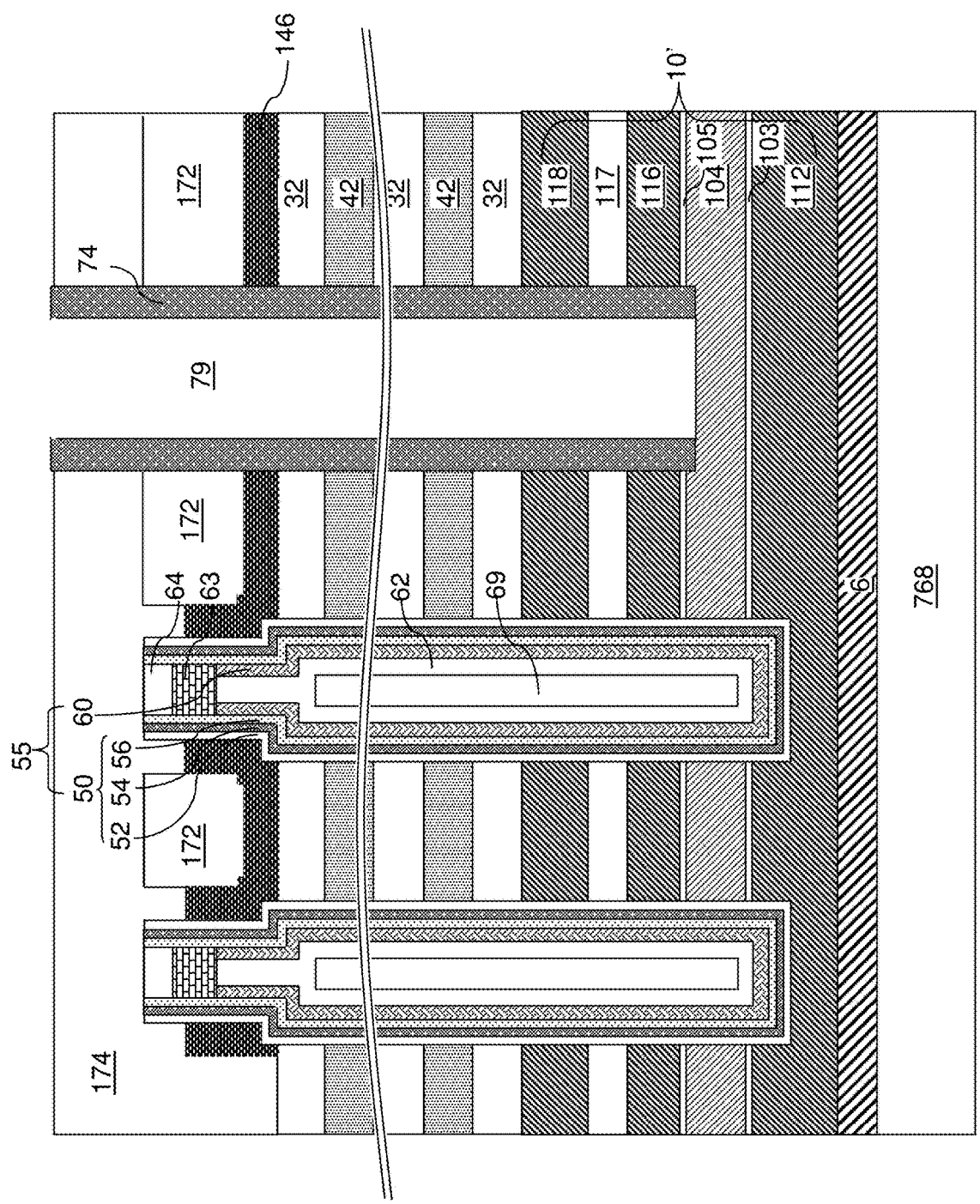
FIGS. 22A-22H are sequential vertical cross-sectional views of a region of the first exemplary structure during replacement of in-process source-level material layers into source-level material layers and replacement of the sacrificial material layers into electrically conductive layers according to an embodiment of the present disclosure.

Referring to FIG. 22A, a photoresist layer (not shown) can be applied over the contact level dielectric layer 174, and is lithographically patterned to form openings in areas between clusters of memory opening fill structures 58. The openings can be rectangular openings having straight edges that laterally extend along the first horizontal direction hd1. The areas of the openings do not overlap with the areas of the memory opening fill structures 58 in the memory array region 100 or with the areas of the support pillar structures in the contact region 300. In other words, the memory opening fill structures 58 and the support pillar structures can be covered by the patterned photoresist layer.

The pattern in the photoresist layer can be transferred through the contact level dielectric layer 174, the alternating stack (32, 42) and the retro-stepped dielectric material portion 65 employing an anisotropic etch to form backside trenches 79. The backside trenches 79 vertically extend from the top surface of the contact level dielectric layer 174 to a top surface of the source-level sacrificial layer 104, and laterally extend through the memory array region 100 and the contact region 300.

In one embodiment, the backside trenches 79 can laterally extend along the first horizontal direction hd1 and can be laterally spaced apart among one another along the second horizontal direction hd2 (which is perpendicular to the first horizontal direction hd1). The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between each neighboring pair of a backside trench 79 and a drain-select-level isolation structure 72, and between each neighboring pair of drain-select-level isolation structures 72. The photoresist layer can be removed, for example, by ashing.

An etch stop material can be conformally deposited and anisotropically etched to form a backside trench spacer 74 within each backside trench 79. The backside trench spacers 74 are sacrificial spacers that protect the alternating stack (32, 42) during replacement of the in-process source-level material layers 10' with source-level material layers. In one embodiment, the backside trench spacers 74 include silicon nitride. The thickness of the backside trench spacers 74 can be in a range from 2 nm to 20 nm, such as from 3 nm to 10 nm, although lesser and greater thicknesses can also be employed.

Figure 22B:
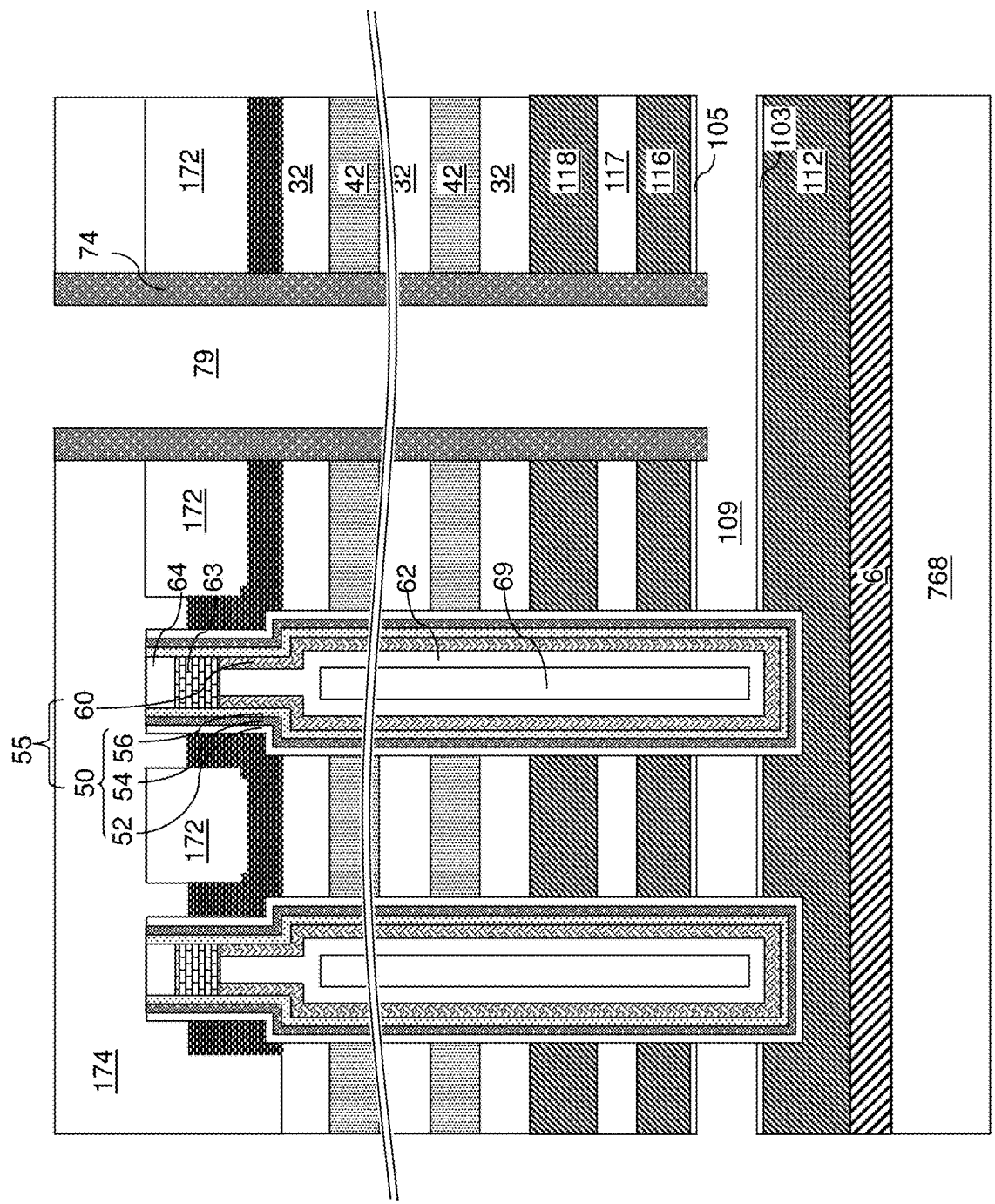

Referring to FIG. 22B, an etchant that etches the material of the source-level sacrificial layer 104 selective to the materials of the alternating stack (32, 42), the contact level dielectric layer 174, and the drain regions 63 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, the drain regions 63 include a heavily doped semiconductor material (which can include electrical dopants at an atomic concentration greater than $5.0 \times 10^{19}/cm^3$), and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 22C:
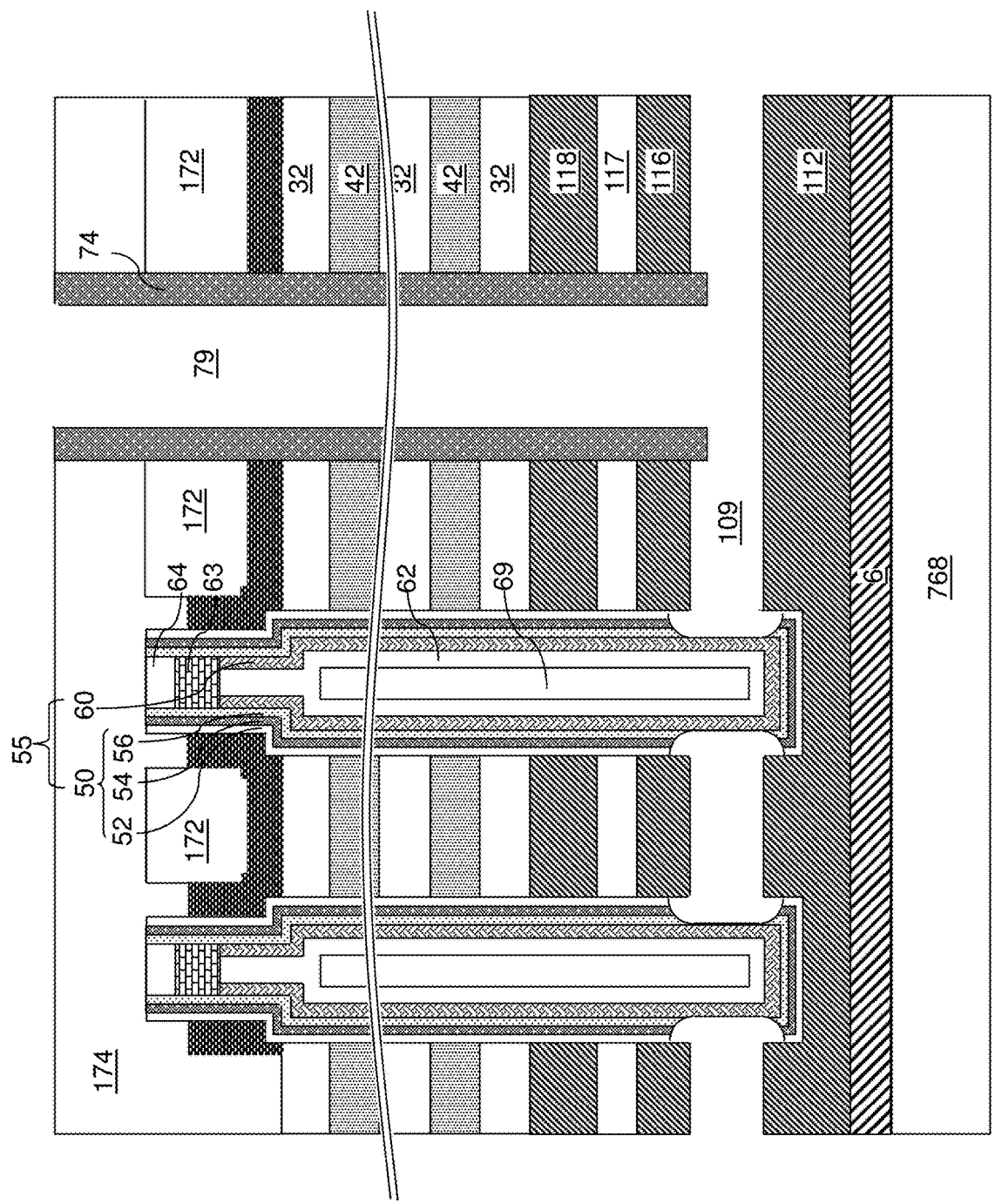

Referring to FIG. 22C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 22D:
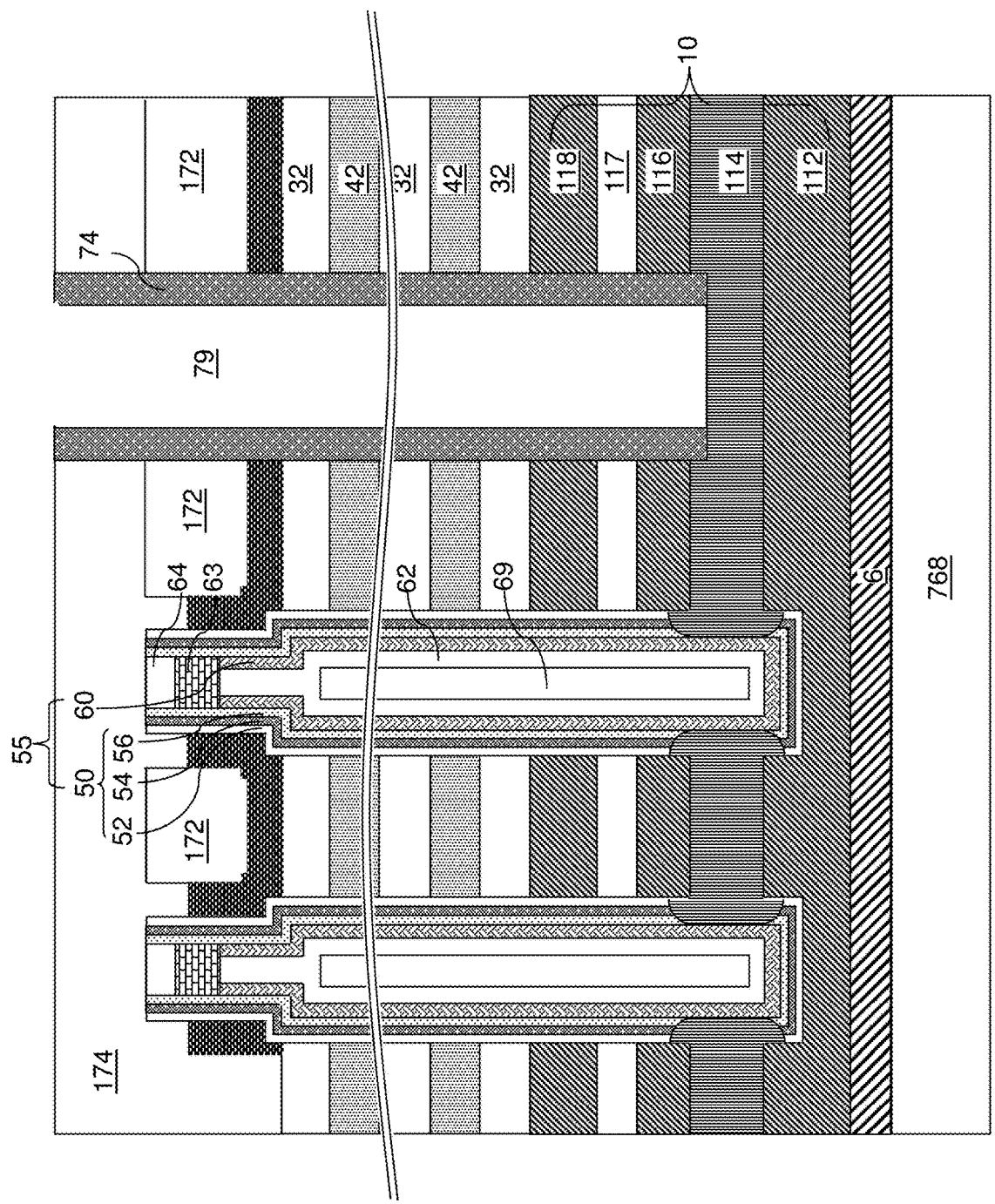

Referring to FIG. 22D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'. Optionally, an oxidation process can be performed to convert a surface portion of the source contact layer 114 into a semiconductor oxide portion (not illustrated) underneath each backside opening 79.

Figure 22E:
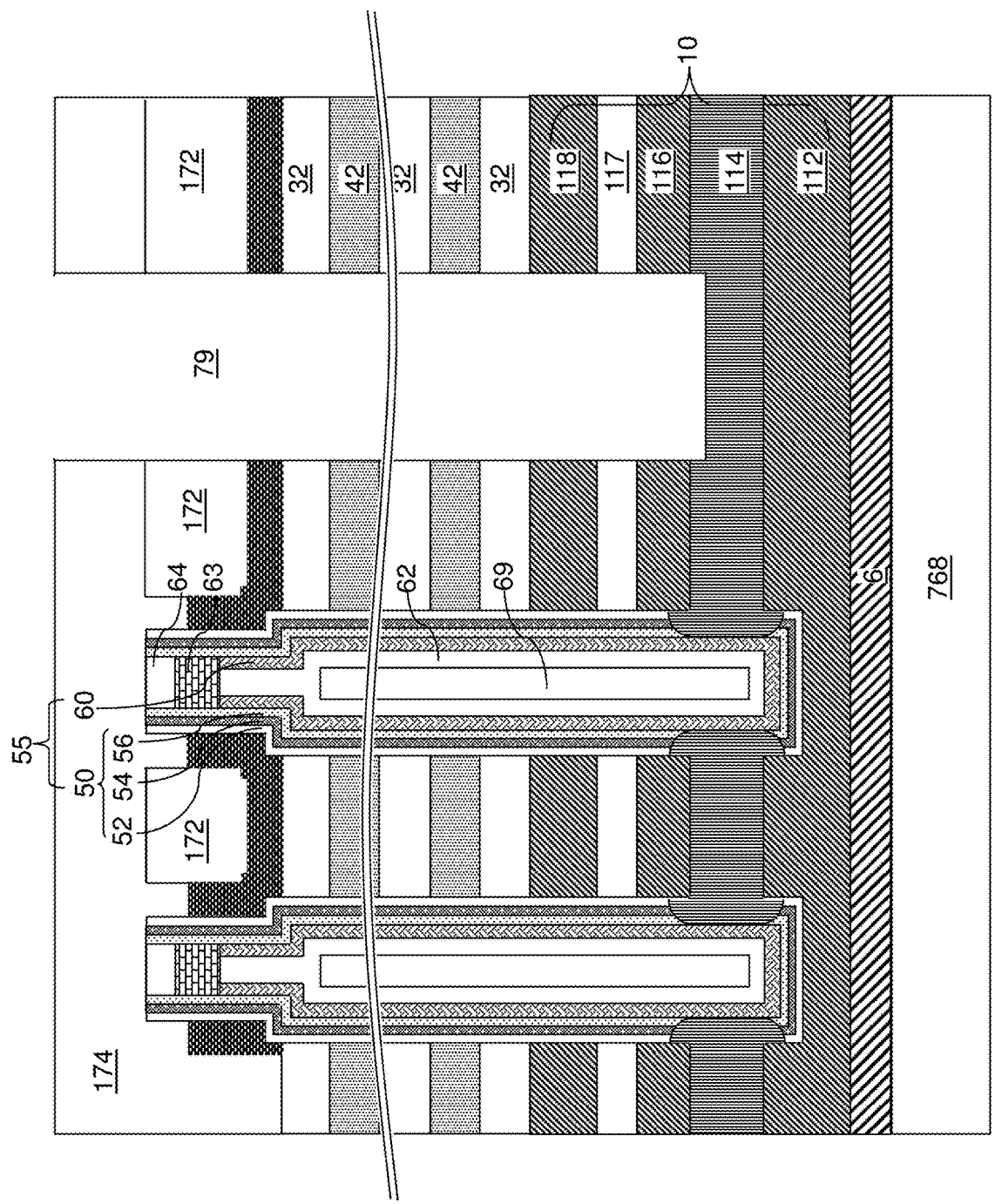

Referring to FIG. 22E, the backside trench spacers 74 can be removed selective to the insulating layers 32, the contact level dielectric layer 174, the source contact layer 114, and the drain regions 63 employing an isotropic etch process. For example, if the backside trench spacers 74 include silicon nitride, a wet etch process employing hot phosphoric acid can be performed to remove the backside trench spacers 74. In one embodiment, the isotropic etch process that removes the backside trench spacers 74 can be combined with a subsequent isotropic etch process that etches the sacrificial material layers 42 selective to the insulating layers 32, the dielectric matrix layer 172, the contact level dielectric layer 174, the source contact layer 114, and the drain regions 63.

Figure 22F:
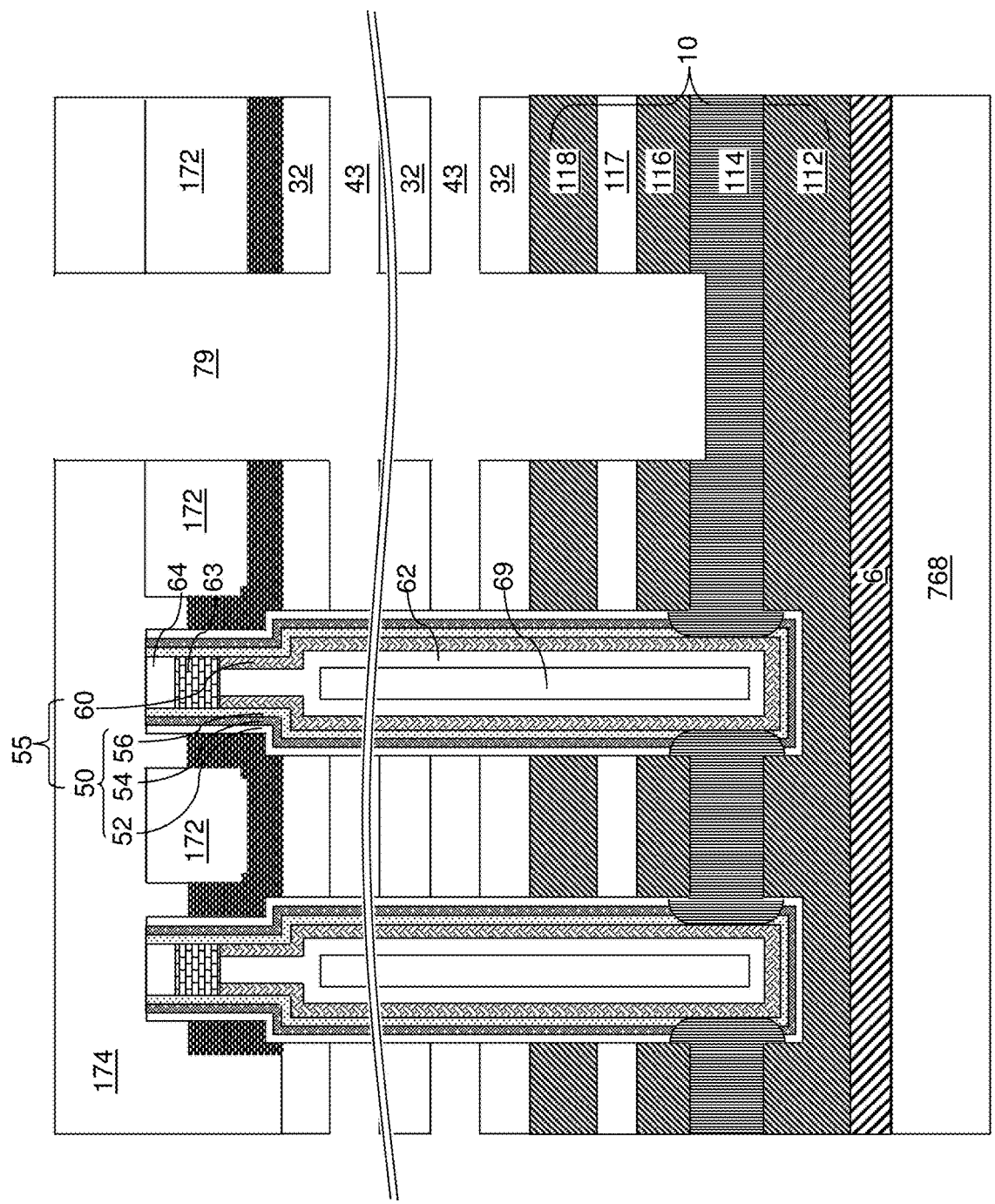

Referring to FIG. 22F, the sacrificial material layers 42 are can be removed selective to the insulating layers 32, the dielectric matrix layer 172, the contact level dielectric layer 174, the source contact layer 114, and the drain regions 63. For example, an etchant that selectively etches the materials of the sacrificial material layers 42 with respect to the materials of the insulating layers 32, the dielectric matrix layer 172, the contact level dielectric layer 174, the retro-stepped dielectric material portion 65 (illustrated in FIGS. 2B and 3B), and the material of the outermost layer of the memory films 50 can be introduced into the backside openings 79, for example, employing an isotropic etch process. For example, the sacrificial material layers 42 can include silicon nitride, the materials of the insulating layers 32, the dielectric matrix layer 172, the contact level dielectric layer 174, the retro-stepped dielectric material portion 65, and the outermost layer of the memory films 50 can include silicon oxide materials.

The isotropic etch process can be a wet etch process employing a wet etch solution, or can be a gas phase (dry) etch process in which the etchant is introduced in a vapor phase into the backside opening 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material layers 42 is removed. Each of the backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each of the backside recesses 43 can have a uniform height throughout.

Figure 22G:
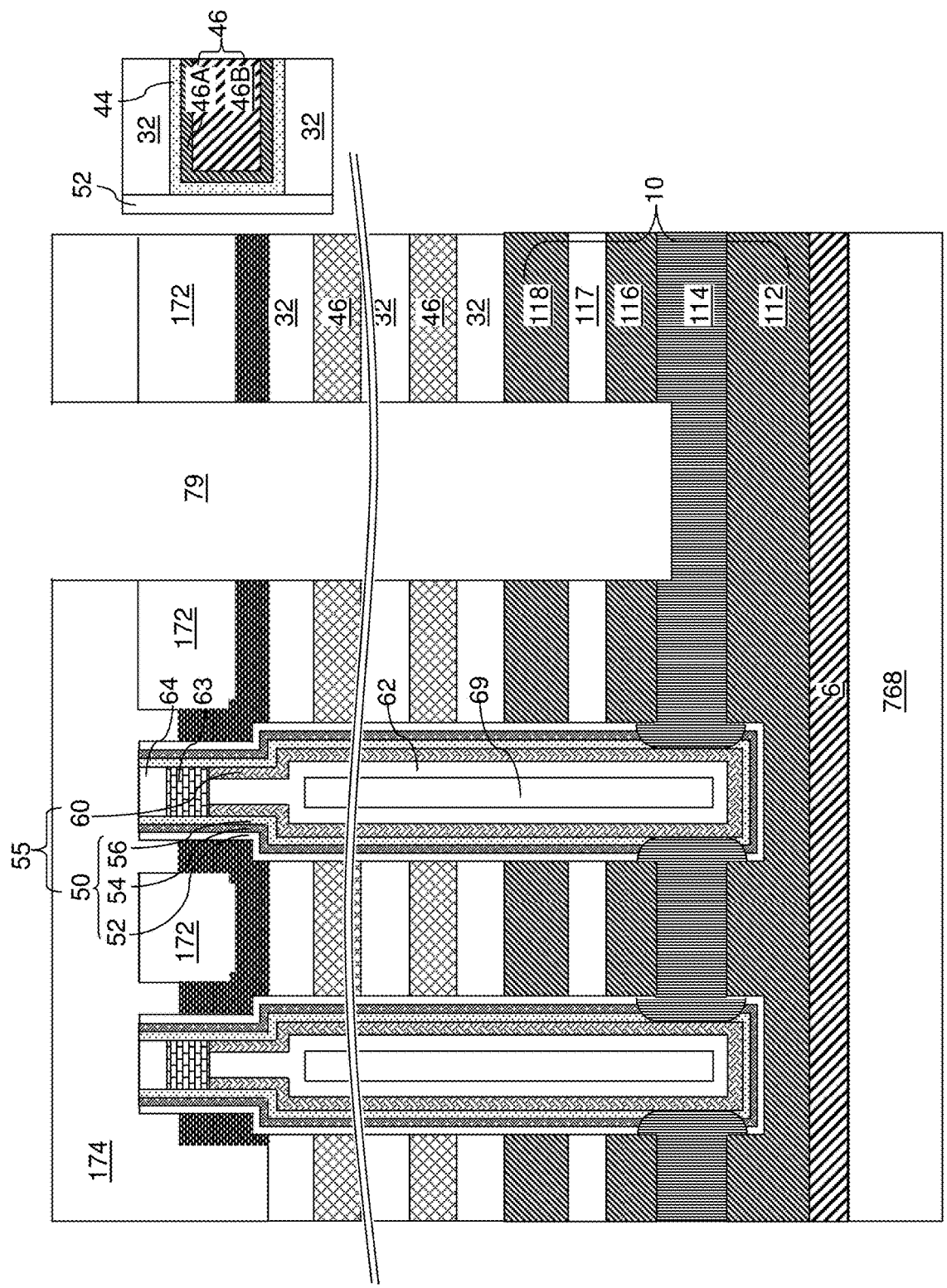

Referring to FIG. 22G, a backside blocking dielectric layer 44 can be formed in the backside recesses 43. The backside blocking dielectric layer 44 can include at least one dielectric material that is subsequently employed to prevent charge tunneling between the charge storage layers 54 and electrically conductive layers to be subsequently formed in the backside recesses 43. At least one metallic material can be subsequently deposited in the backside recesses 43 and at peripheral portions of the backside trenches 79. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of the at least one the backside trench 79, and over the top surface of the contact level dielectric layer 174 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 174. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact level dielectric layer 174.

The deposited metallic material of the continuous electrically conductive material layer is etched back from the sidewalls of each backside trench 79 and from above the contact level dielectric layer 174, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode, or a select gate electrode, for the plurality of vertical memory devices.

Figure 22H:
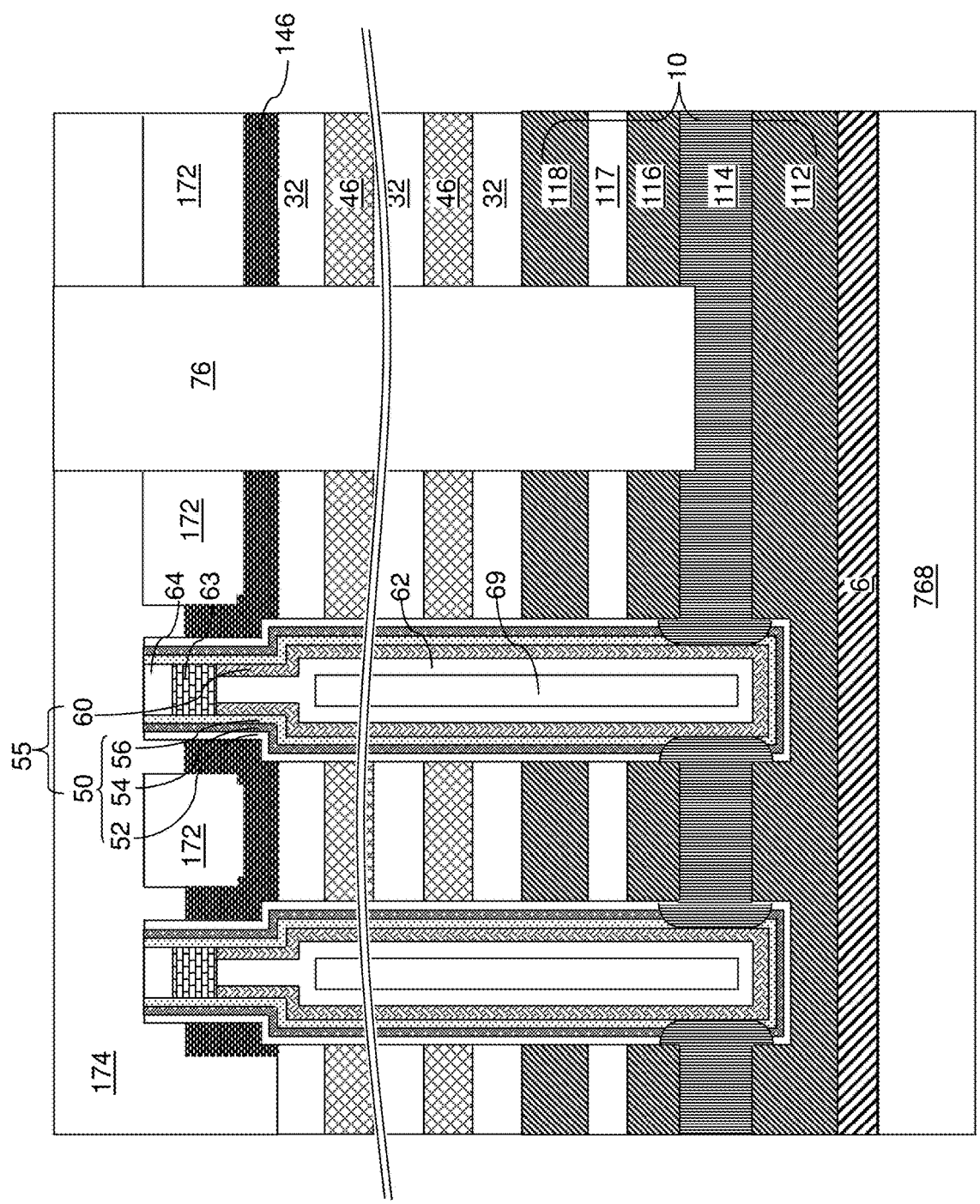

Referring to FIGS. 22H, 23A, and 23B, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers 32 and the electrically conductive layers 46. Each dielectric wall structure 76 can contact sidewalls of the contact level dielectric layer 174.

Referring to FIGS. 24A and 24B, drain contact via structures 88 can be formed through the contact level dielectric layer 174 on a top surface of a respective one of the drain regions 63. Cover dielectric pillars 64 can be removed during formation of the contact level dielectric layer 174.

Additional contact via structures (not shown) can be formed through the contact level dielectric layer 174 and the retro-stepped dielectric material portion 65 on a top surface of a respective one of the electrically conductive layers in the contact region 300 that includes stepped surfaces. Metal interconnect structures including bit lines, interconnect metal lines, and interconnect via structures can be formed to provide electrical connection to various nodes of the three-dimensional memory device.

In one embodiment shown in FIG. 23B, each memory opening fill structure 58 among the memory opening fill structures 58 comprises a vertical axis VA passing through a geometrical center GC of the memory opening fill structure 58. As used herein, a geometrical center of an element refers to the center of gravity of a hypothetical object occupying the same volume as the element and having a homogeneous composition throughout. An inner sidewall of a most proximal one of the cylindrical portions of the drain-select-level gate electrodes 146 can be more proximal to the vertical axis VA than the electrically conducive layers 46 are to the vertical axis VA due to the bottle-shaped profile of the memory opening fill structures 58. In one embodiment, an outer sidewall of the most proximal one of the cylindrical portions of the drain-select-level gate electrodes 146 can be more proximal to the vertical axis VA than the electrically conductive layers 46 are to the vertical axis VA.

In one embodiment, the continuous metallic material layer 146L can be formed by a conformal deposition process, and the lateral thickness of each of the cylindrical portions of the drain-select-level gate electrodes 146 can be the same as the vertical thickness of the planar portions of the drain-select-level gate electrodes 146. In one embodiment, vertical sidewall segments within each set of vertical sidewall segments of a drain-select-level gate electrode 146 can be adjoined to outer sidewalls of a row of cylindrical portions of the drain-select-level gate electrode 146.

Referring to FIGS. 25A and 25B, a second exemplary structure according to a second embodiment of the present disclosure can be derived from the first exemplary structure of FIGS. 8A and 8B by depositing a sacrificial template layer 241 including a dielectric material such as silicon nitride. The top surface of the sacrificial template layer 241 can be planarized to provide a top surface that is coplanar with the top surfaces of the sacrificial pillar structures 48.

Figure 26A:
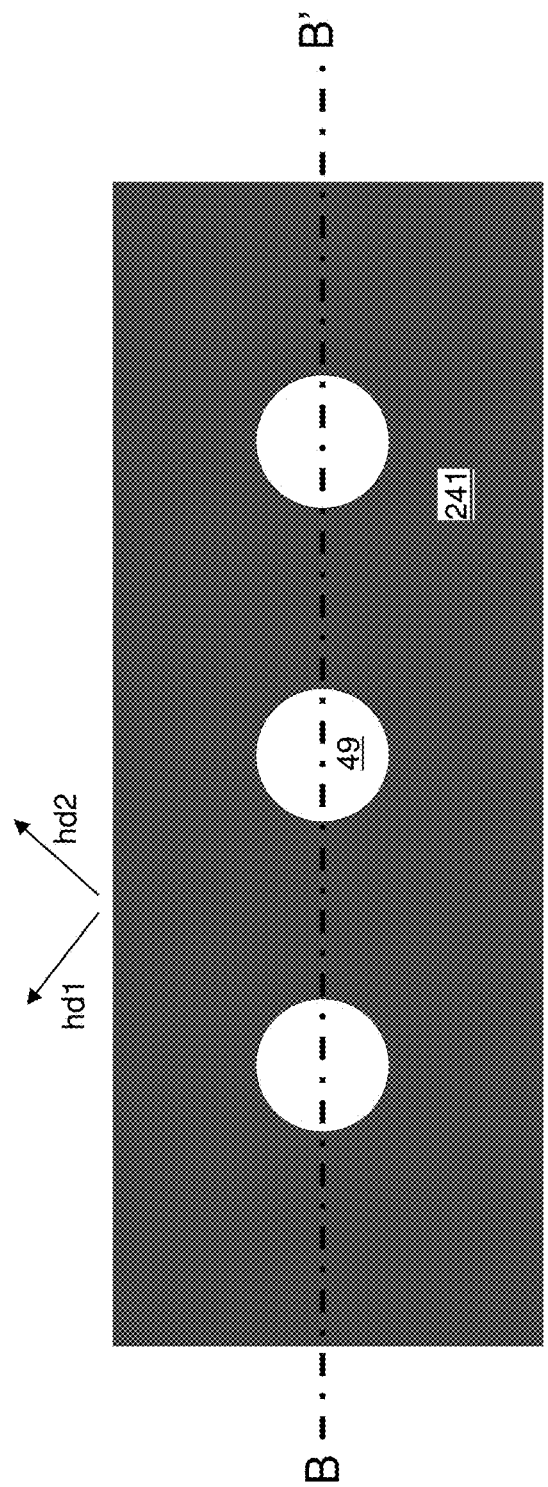
FIG. 26A is a top-down view of a region of the second exemplary structure after formation of memory cavities by removal of the sacrificial pillar structures according to the second embodiment of the present disclosure.
Figure 26B:
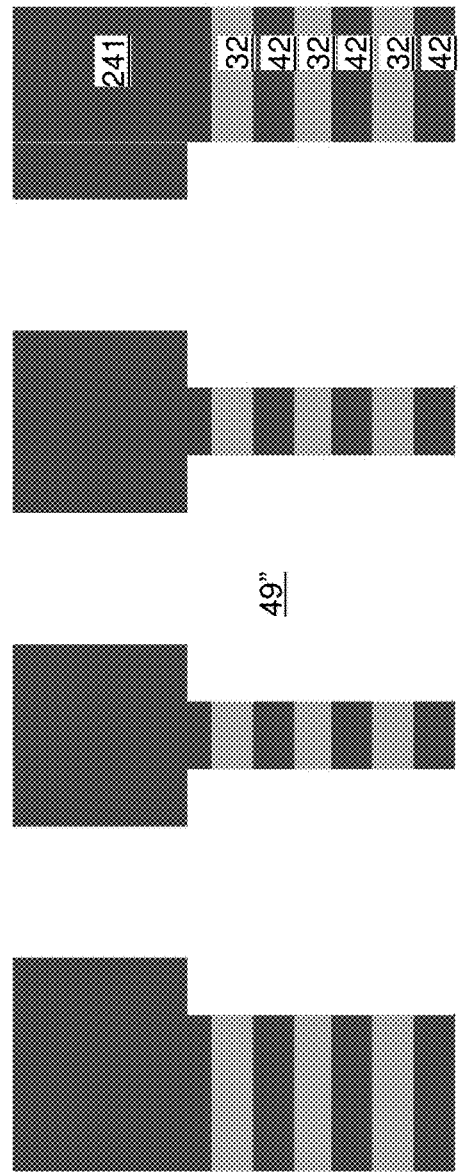
FIG. 26B is a vertical cross-sectional view of the second exemplary structure of FIG. 26A along the vertical plane B-B'.

Referring to FIGS. 26A and 26B, an isotropic etchant that etches the material of the sacrificial pillar structures 48 selective to the materials of the sacrificial template layer 241 and the insulating layers 32 can be applied to the second exemplary structure. The sacrificial pillar structures 48 are removed by the isotropic etchant to form memory cavities 49", which are unfilled volumes of the memory openings 49 at this processing step. For example, if the sacrificial pillar structures 48 comprise undoped amorphous silicon, the sacrificial pillar structures 48 can be removed by a wet etch process employing hot trimethyl-2 hydroxyethyl ammonium hydroxide ("hot TMY") or tetramethyl ammonium hydroxide (TMAH).

Referring to FIGS. 27A and 27B, the processing steps of FIGS. 11A and 11B can be performed to form a blocking dielectric layer 52, a charge storage layer 54, a tunneling dielectric layer 56, a semiconductor channel material layer 60L, and dielectric cores 62.

Figure 28A:
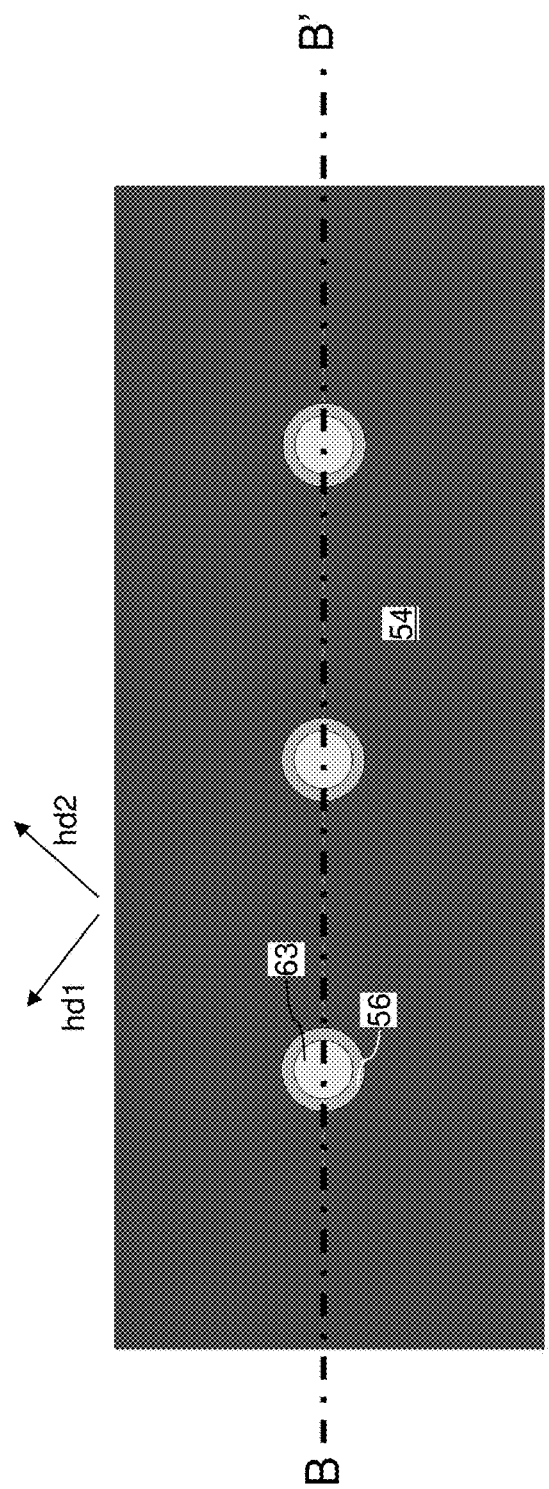
FIG. 28A is a top-down view of a region of the second exemplary structure after formation of drain regions according to the second embodiment of the present disclosure.
Figure 28B:
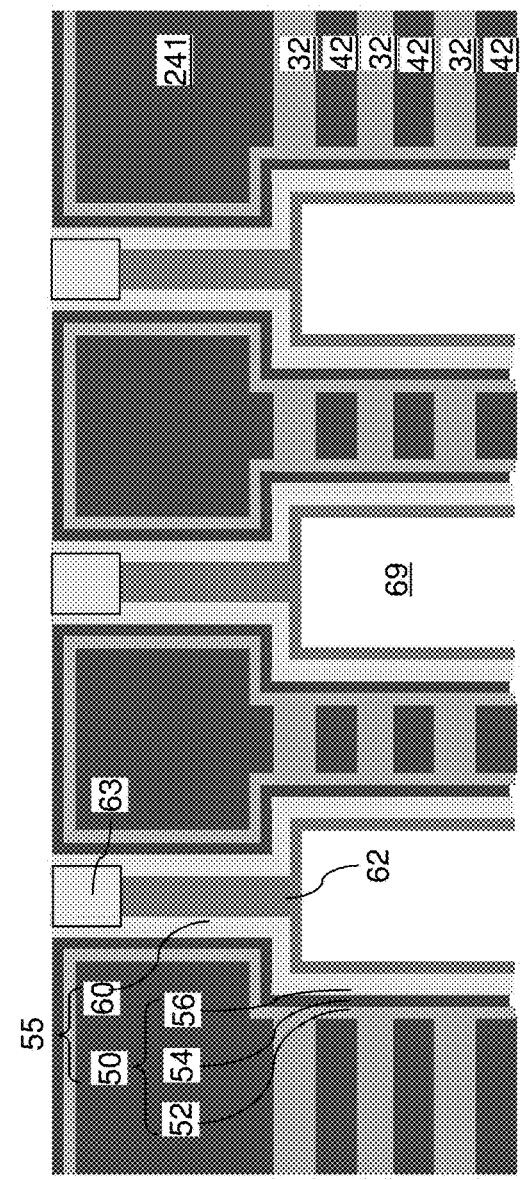
FIG. 28B is a vertical cross-sectional view of the second exemplary structure of FIG. 28A along the vertical plane B-B'.

Referring to FIGS. 28A and 28B, portions of the semiconductor channel material layer 60L overlying the top surfaces of the dielectric cores 62 can be removed, for example, by an isotropic etch process. Each remaining portion of the semiconductor channel material layer 60L constitutes a semiconductor channel 60, which can have a doping of the first conductivity type or can be intrinsic. A combination of a semiconductor channel 60 and portions of the memory film 50 located within a memory cavity constitutes a memory stack structure 55, which includes portions of the charge storage layer 54 at the levels of the sacrificial material layers 42 as memory elements. Each memory stack structure 55 includes a vertical stack of annular memory elements, i.e., annular portions of the charge storage layer 54 located at the levels of the sacrificial material layers 42.

A doped semiconductor fill material having a doping of a second conductivity type (which is the opposite of the first conductivity type) can be deposited in recesses above the top surfaces of the dielectric cores 62. Portions of the doped semiconductor fill material and the tunneling dielectric layer 56 can be removed from above the horizontal plane including a topmost surface of the charge storage layer 54 by a planarization process, which can include chemical mechanical planarization and/or a recess etch. Each remaining portion of the doped semiconductor fill material constitutes a drain region 63. Each drain region 63 is formed at an upper end of a respective semiconductor channel 60, and may have a top surface that is coplanar with the topmost surface of the charge storage layer 54.

Referring to FIGS. 29A and 29B, horizontal portions of the charge storage layer 54 can be etched back by an etch process, which can be an isotropic etch process or an anisotropic etch process. In one embodiment, removal of the horizontal portions of the charge storage layer 54 may be selective to the materials of the tunneling dielectric layer 56 and the blocking dielectric layer 52. In this case, cylindrical cavities can be formed around each protruding portion of the tunneling dielectric layer 56.

Referring to FIGS. 30A and 30B, a cover dielectric layer 164L can be formed over the drain regions 63 and the memory film 50. The cover dielectric layer 164L includes a planarizable dielectric material such as silicon oxide.

Figure 31A:
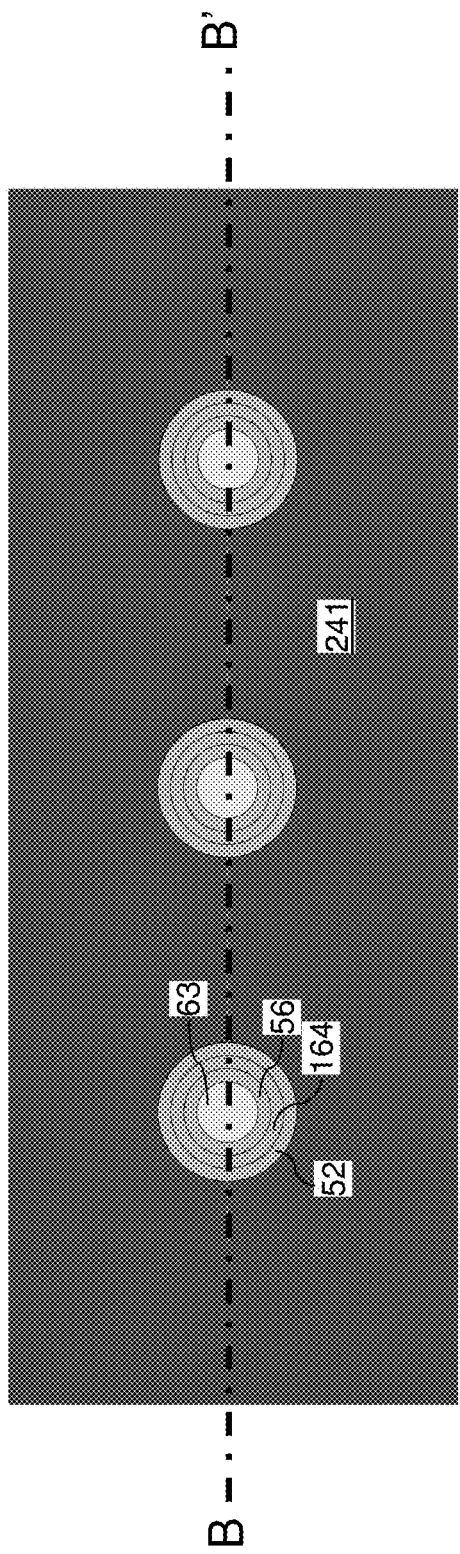
FIG. 31A is a top-down view of a region of the second exemplary structure after patterning the cover dielectric layer into cover dielectric rings according to the second embodiment of the present disclosure.
Figure 31B:
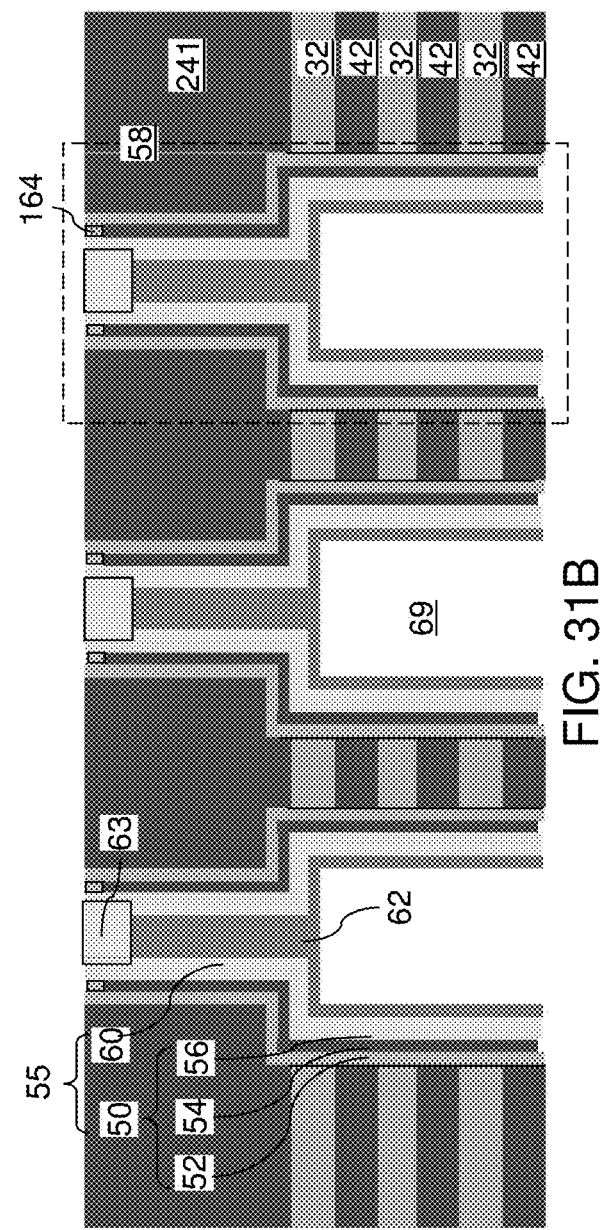
FIG. 31B is a vertical cross-sectional view of the second exemplary structure of FIG. 31A along the vertical plane B-B'.

Referring to FIGS. 31A and 31B, portions of the cover dielectric layer 164L and portions of the memory film 50 that overlie top surface of the sacrificial template layer 241 are removed by a planarization process. The planarization process can employ a recess etch and/or chemical mechanical planarization. Each remaining discrete portion of the cover dielectric layer 164L constitutes a cover dielectric ring 164.

Each sacrificial pillar structure 48 is replaced with a memory opening fill structure 58. Each memory opening structure 58 comprises a respective set of a memory film 50, a semiconductor channel 60, a dielectric core 62, a core cavity 69, a drain region 63, and a cover dielectric ring 164.

Each semiconductor channel 60 comprises a respective first vertically-extending portion extending through levels of the sacrificial material layers 42 and having a first maximum lateral channel dimension mlcd1, a respective second vertically-extending portion located at a level of the sacrificial template layer 141 and having a second maximum lateral channel dimension mlcd2 that is less than the first maximum lateral channel dimension mlcd1, a respective annular portion having an outer periphery that is adjoined to an upper end of the respective first vertically-extending portion and an inner periphery that is adjoined to a lower end of the respective second vertically-extending portion.

In one embodiment, each semiconductor channel 60 is laterally surrounded by a memory film 50 that includes a first vertical memory film portion that contacts, and laterally surrounds, the respective first vertically-extending portion of one of the semiconductor channels 60; a second vertical memory film portion that contacts, and laterally surrounds, the respective second vertically-extending portion of the one of the semiconductor channels 60; and an annular memory film portion that contacts, and overlies, the annular portion of one of the semiconductor channels 60. In one embodiment, each of the first vertical memory film portion and the second vertical memory film portion comprises a respective portion of a blocking dielectric layer 52, a respective portion of a charge storage layer 54, and a respective portion of a tunneling dielectric layer 56.

Each of the memory opening fill structures 58 comprises an encapsulated cavity 69 that vertically extends through each level of the sacrificial material layers 42. In one embodiment, each of the memory opening fill structures 58 comprises a dielectric core 62. The dielectric core 62 includes a closed inner surface that defines an entire volume of the encapsulated cavity 69. In one embodiment, the dielectric core 62 includes a neck portion located above the encapsulated cavity 69 and protrudes through the sacrificial template layer 141.

Referring to FIGS. 32A and 32B, the sacrificial template layer 241 can be removed selective to the memory films 50 and the cover dielectric rings 164. For example, if the sacrificial template layer 241 includes silicon nitride, a wet etch process employing hot phosphoric acid can be employed to remove the sacrificial template layer 241. Outer sidewalls of the upper portions of the memory films 50 and annular top surfaces of the memory films 50 (i.e., annular top surfaces of the tunneling dielectric layers 56) can be physically exposed after removal of the sacrificial template layer 241.

Referring to FIGS. 33A and 33B, the processing steps of FIGS. 16A and 16B can be performed to form a continuous metallic material layer 146L.

Figure 34A:
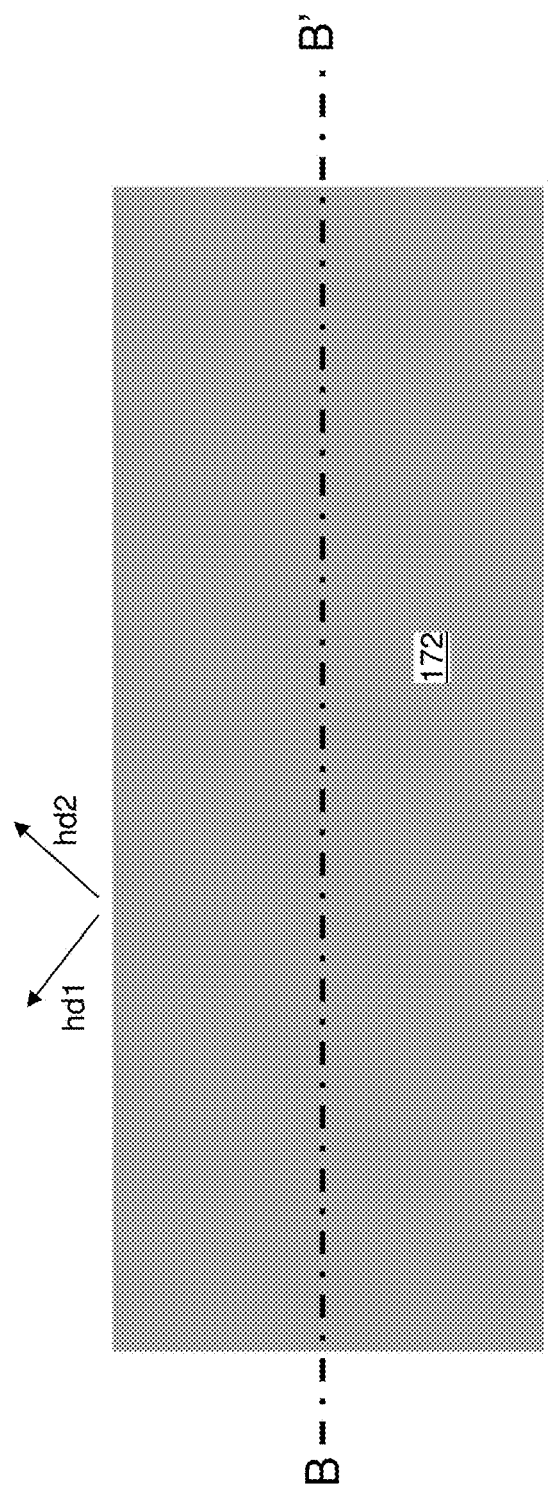
FIG. 34A is a top-down view of a region of the second exemplary structure after formation of a dielectric matrix layer according to the second embodiment of the present disclosure.
Figure 34B:
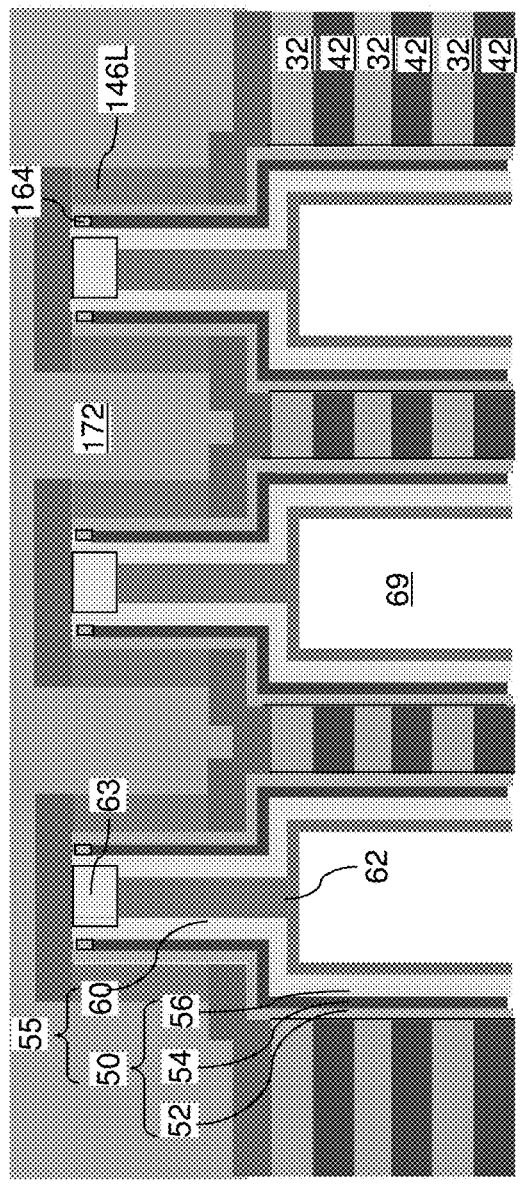
FIG. 34B is a vertical cross-sectional view of the second exemplary structure of FIG. 34A along the vertical plane B-B'.

Referring to FIGS. 34A and 34B, a dielectric material can be deposited over the continuous metallic material layer 146L by a conformal or non-conformal deposition process. A dielectric matrix layer 172 is formed. The dielectric material of the dielectric matrix layer 172 can include undoped silicate glass, doped silicate glass, organosilicate glass, or a combination thereof. For example, the dielectric matrix layer 172 can include silicon oxide.

Referring to FIGS. 35A and 35B, the dielectric matrix layer 172 and the continuous metallic material layer 146L can be planarized, for example, by chemical mechanical planarization. For example, portions of the dielectric matrix layer 172 and the continuous metallic material layer 146L that overlie the horizontal plane including the top surfaces of the drain regions 63 can be removed by chemical mechanical planarization. Top surfaces of the drain regions 63 can be physically exposed. Further, annular top surfaces of the continuous metallic material layer 146L can be physically exposed after the planarization process. The annular dielectric rings 164 laterally surround a respective one of the drain regions 63.

Referring to FIGS. 36A and 36B, the processing steps of FIGS. 19A and 19B can be performed to form drain-select-level line trenches 179. The drain-select-level line trenches 179 include a respective pair of laterally undulating sidewalls that generally extend along the first horizontal direction hd1. Each of the drain-select-level line trenches 179 can have a laterally alternating sequence of vertical planar sidewall segments and vertical convex sidewall segments. The vertical planar sidewall segments of each laterally undulating sidewall can be sidewall segments of a patterned portion of the dielectric matrix layer 172, and can be located within a same vertical plane. The vertical convex sidewall segments of each laterally undulating sidewall can be physically exposed cylindrical sidewall segments of the continuous metallic material layer 146L. Each vertical convex sidewall segment has a convex profile in a horizontal cross-sectional view, and extends vertically along the vertical direction with the same horizontal cross-sectional profile.

Figure 37A:
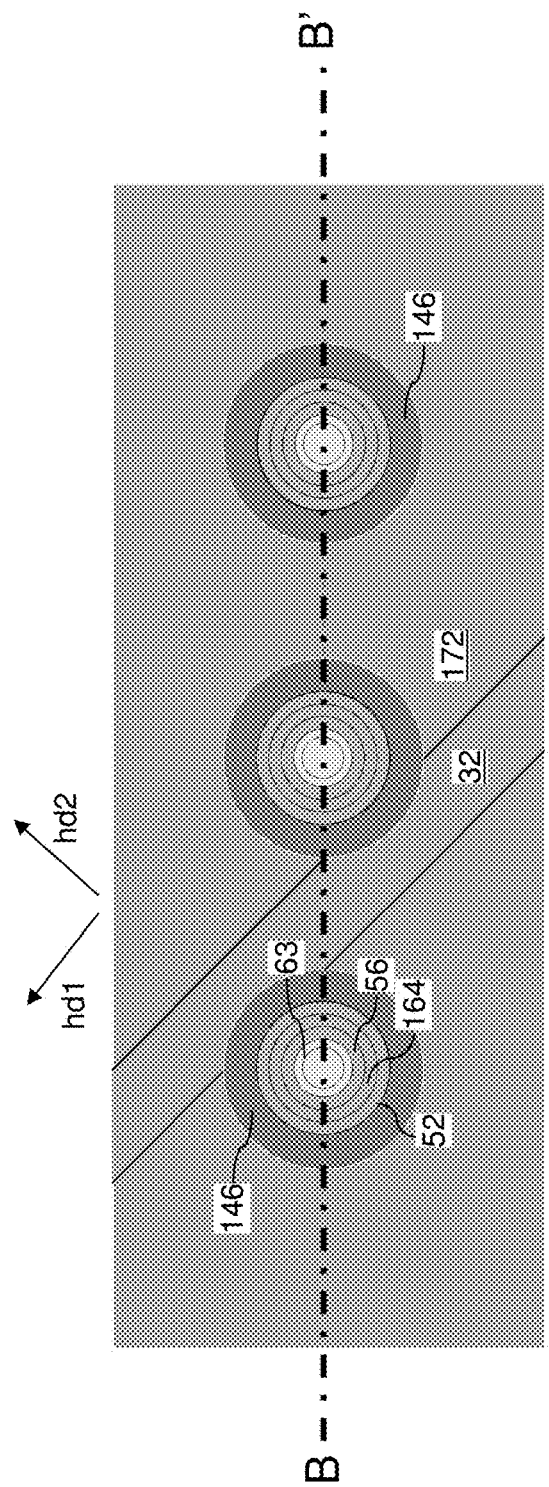
FIG. 37A is a top-down view of a region of the second exemplary structure after patterning the continuous metallic material layer into drain-select-level gate electrodes according to the second embodiment of the present disclosure.
Figure 37B:
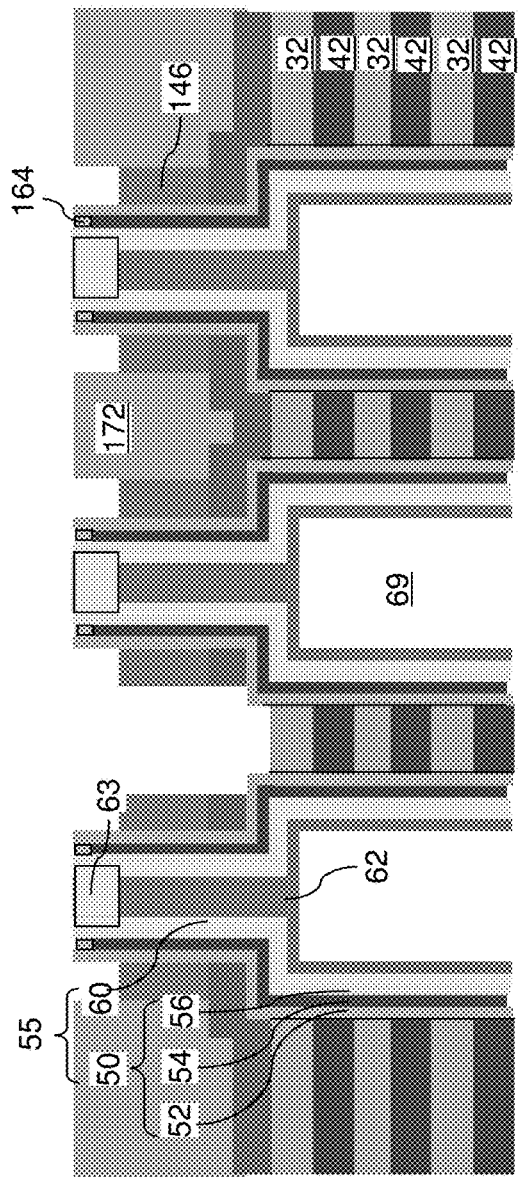
FIG. 37B is a vertical cross-sectional view of the second exemplary structure of FIG. 37A along the vertical plane B-B'.

Referring to FIGS. 37A and 37B, physically exposed portions of the continuous metallic material layer 146L can be anisotropically etched. Unmasked portions of the continuous metallic material layer 146L can be removed by the anisotropic etch process. The anisotropic etch process patterns the continuous metallic material layer 146L into drain-select-level gate electrodes 146. Thus, the drain-select-level gate electrodes 146 comprise remaining portions of the continuous metallic material layer 146L.

Horizontal portions of the continuous metallic material layer 146L that overlie the memory opening fill structures 58 or located within areas of a respective uniform width between a respective pair of rows of memory opening fill structures 58 can be removed. Each of the drain-select-level gate electrodes 146 can include a planar portion having two sets of vertical sidewall segments and a set of cylindrical portions vertically protruding upward from the planar portion and laterally surrounding a respective one of the memory stack structures 55. Each set of vertical sidewall segments of a drain-select-level gate electrode 146 can be located within a respective vertical plane.

Referring to FIGS. 38A and 38B, a contact level dielectric layer 174 can be formed by depositing a dielectric material such as silicon oxide. The contact level dielectric layer 174 is formed in volumes from which portions of the continuous metallic material layer 146L are removed. The contact level dielectric layer 174 can include isolation dielectric portions (174L, 174P). Each isolation dielectric portion (174L, 174P) can include a dielectric line portion 174L laterally extending along the first horizontal direction hd1, contacting sidewall segments of two planar portions of the drain-select-level gate electrodes 146, and sidewalls of two rows of cylindrical portions of the drain-select-level gate electrodes 146. Each isolation dielectric portion (174L, 174P) can include a plurality of loop portions 174P adjoined to sides of the dielectric line portion 174L and overlying a respective cylindrical portion among the two rows of cylindrical portions of the drain-select-level gate electrodes 146.

In one embodiment, each sidewall of the plurality of loop portions 174P is vertically coincident with a sidewall of an underlying one of the plurality of cylindrical portions of the drain-select-level gate electrodes 146. The contact level dielectric layer 174 can include annular dielectric portions 174A overlying additional cylindrical portions of the drain-select-level gate electrodes 146. The annular dielectric portions 174A comprise a same material as the isolation dielectric portion (174L, 174P) and are laterally spaced from the isolation dielectric portion (174L, 174P).

Referring to FIGS. 39A and 39B, the processing steps of FIGS. 22A-22H, 23A, 23B, 24A, and 24B can be performed to replace the in-process source level material layers 10' with source level material layers 10, to replace the sacrificial material layers 42 with electrically conductive layers 46, to form dielectric wall structures 76, and to form drain contact via structures 88. Subsequently, additional contact via structures and metal interconnect structures can be formed as in the first embodiment.

In one embodiment, each memory opening fill structure 58 among the memory opening fill structures 58 comprises a vertical axis VA passing through a geometrical center GC of the memory opening fill structure 58. As used herein, a geometrical center of an element refers to the center of gravity of a hypothetical object occupying the same volume as the element and having a homogeneous composition throughout. An inner sidewall of a most proximal one of the cylindrical portions of the drain-select-level gate electrodes 146 can be more proximal to the vertical axis VA than the electrically conducive layers 46 are to the vertical axis VA due to the bottle-shaped profile of the memory opening fill structures 58. In one embodiment, an outer sidewall of the most proximal one of the cylindrical portions of the drain-select-level gate electrodes 146 can be more proximal to the vertical axis VA than the electrically conductive layers 46 are to the vertical axis VA.

In one embodiment, the continuous metallic material layer 146L can be formed by a conformal deposition process, and the lateral thickness of each of the cylindrical portions of the drain-select-level gate electrodes 146 can be the same as the vertical thickness of the planar portions of the drain-select-level gate electrodes 146. In one embodiment, vertical sidewall segments within each set of vertical sidewall segments of a drain-select-level gate electrode 146 can be adjoined to outer sidewalls of a row of cylindrical portions of the drain-select-level gate electrode 146.

Referring to FIGS. 40A and 40B, a third exemplary structure according to a third embodiment of the present disclosure can be derived from the second exemplary structure of FIGS. 26A and 26B. In the third embodiment, the charge storage layer 54 is removed from the drain select transistor, such that the gate dielectric of the drain select transistor lacks the charge storage layer 54. Specifically, a blocking dielectric 52 and a charge storage layer 54 can be formed as continuous material layers on the physically exposed surfaces of the second exemplary structure of FIGS. 26A and 26B employing conformal deposition processes. The blocking dielectric 52 can have the same composition and thickness as in the first and second embodiments. The charge storage layer 54 can have the same composition and thickness as in the first and second embodiments. A cover material layer 38L can be formed by conformally depositing a cover material, which is a sacrificial material that can be removed selective to the materials of the blocking dielectric 52 and the charge storage layer 54. The cover material layer 38L can include, for example, amorphous silicon, a silicon-germanium alloy, amorphous carbon, or a diamond-like carbon (DLC). In one embodiment, the cover material layer 38L may block the neck portions of the bottle-shaped memory cavities 49", and form temporary encapsulated cavities 69' at the levels of the sacrificial material layers 42.

Figure 41A:
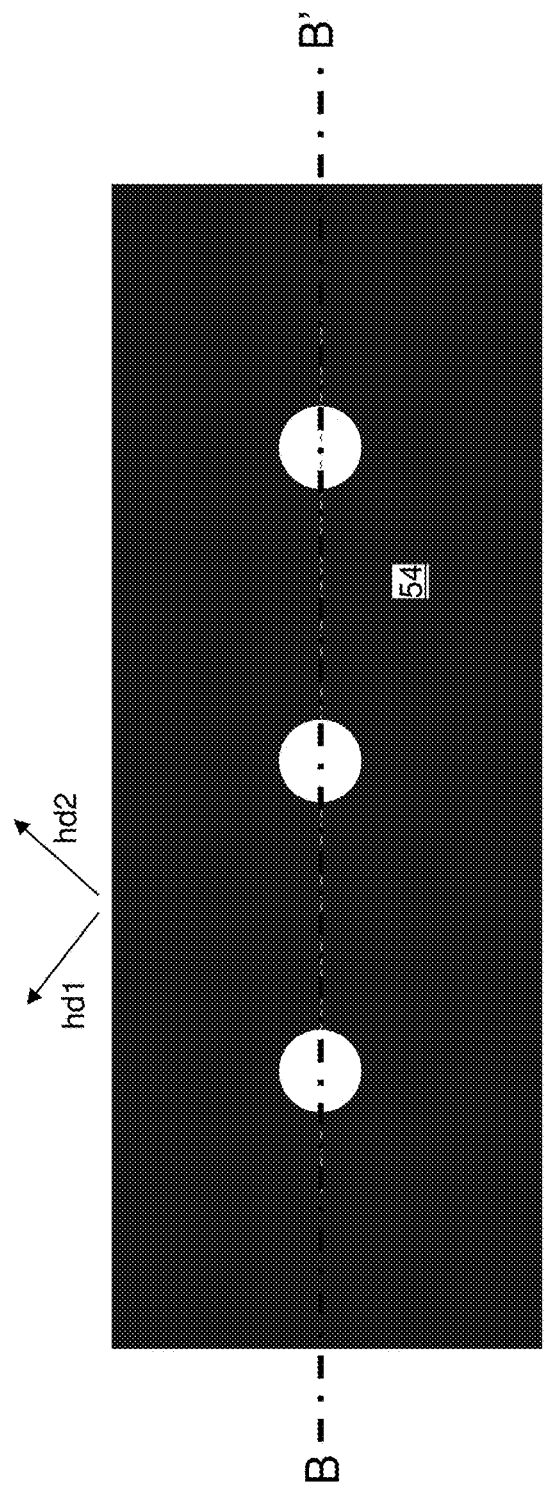
FIG. 41A is a top-down view of a region of the third exemplary structure after patterning the sacrificial cover material layer into sacrificial cover material spacers according to the third embodiment of the present disclosure.
Figure 41B:
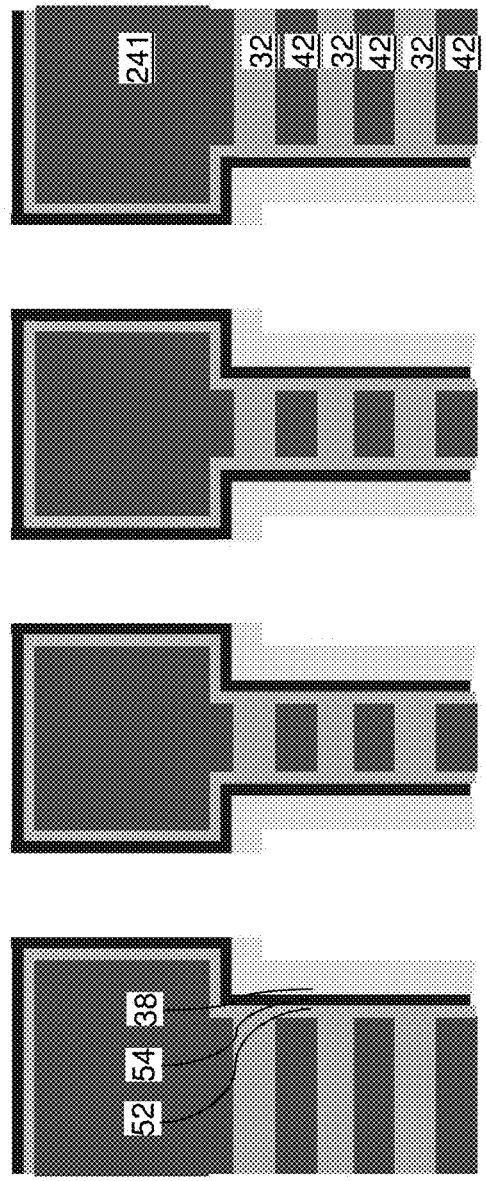
FIG. 41B is a vertical cross-sectional view of the third exemplary structure of FIG. 41A along the vertical plane B-B'.

Referring to FIGS. 41A and 41B, an anisotropic etch process can be performed to remove unmasked portions of the cover material layer 38L. Portions of the cover material layer 38L overlying the sacrificial template layer 241 or within the neck portions of the bottle-shaped memory cavities 49" are removed from inside the memory openings 49.

Each remaining portion of the cover material layer 38L within bulging portions of the bottle-shaped memory cavities 49" constitutes a cover material portion 38. Each cover material portion 38 can have a cylindrical configuration, and covers cylindrical portions of the charge storage layer 54 located at the levels of the alternating stack (32, 42) and underlies the sacrificial template layer 241.

Figure 42A:
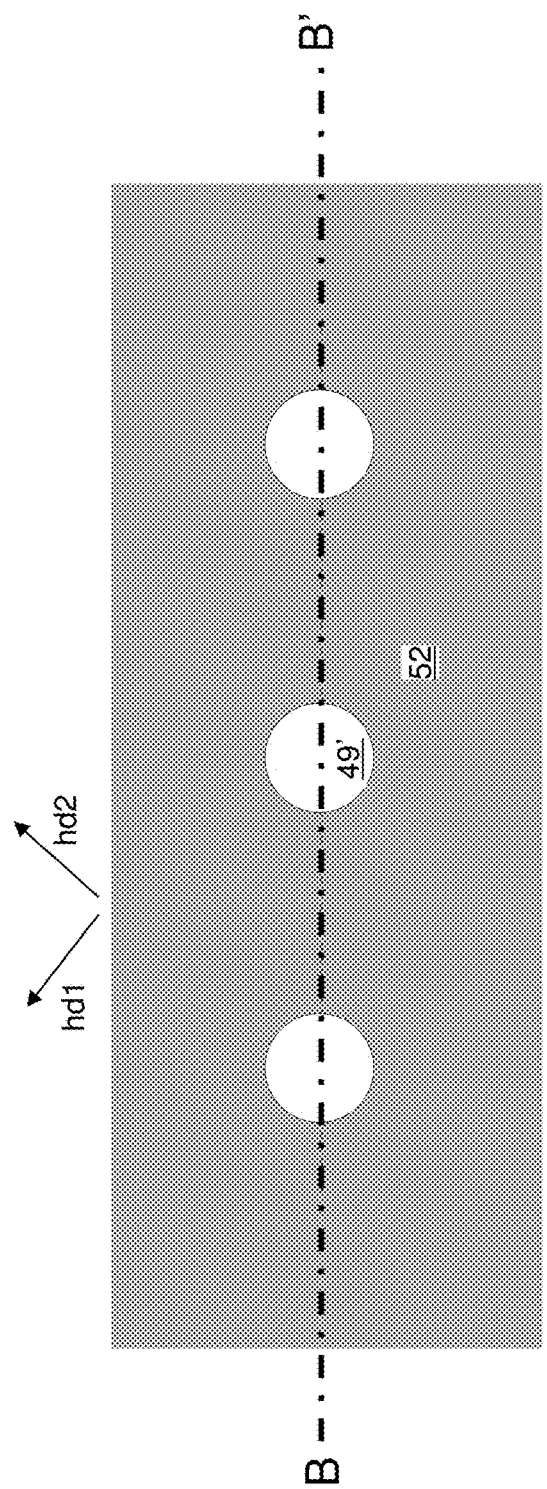
FIG. 42A is a top-down view of a region of the third exemplary structure after patterning the charge storage layer according to the third embodiment of the present disclosure.
Figure 42B:
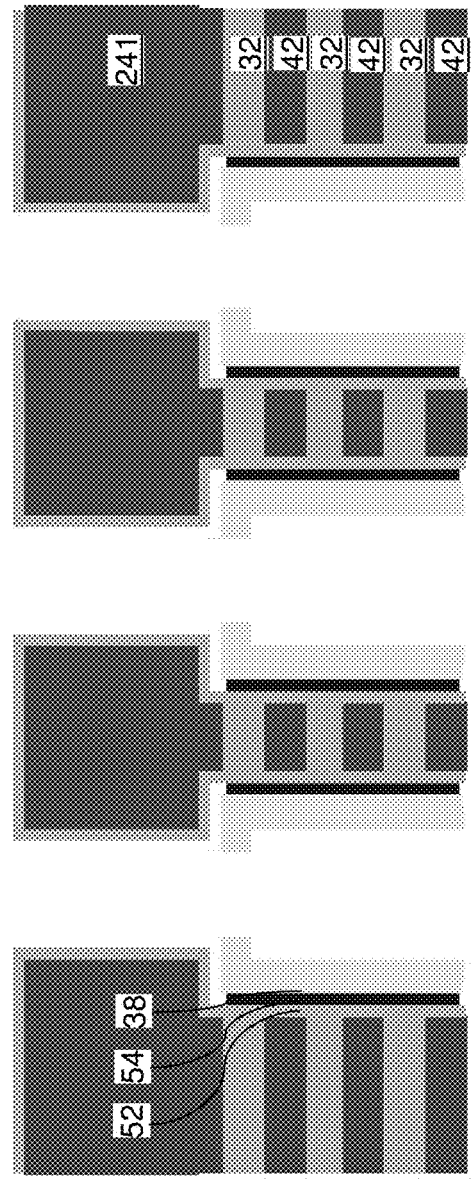
FIG. 42B is a vertical cross-sectional view of the third exemplary structure of FIG. 42A along the vertical plane B-B'.

Referring to FIGS. 42A and 42B, unmasked portions of the charge storage layer 54 can be removed selective to the blocking dielectric layer 52. Thus, upper portions of the charge storage layer 54 at the level of the combination of the sacrificial template layer 241 are removed without removing lower portions of the charge storage layer 54 located at the levels of the alternating stack (32, 42). For example, if the charge storage layer 54 comprises silicon nitride and if the blocking dielectric 52 comprises silicon oxide, the unmasked portions of the charge storage layer 54 can be removed selective to the blocking dielectric 52 employing a wet etch process that etches silicon nitride selective to silicon oxide. For example, a wet etch process employing hot phosphoric acid or a combination of $NH_4F$, NaOH, HF, glycerin, and/or $H_2O$ can be employed to remove the unmasked portions of the charge storage layer 54 selective to the blocking dielectric 52.

Figure 43A:
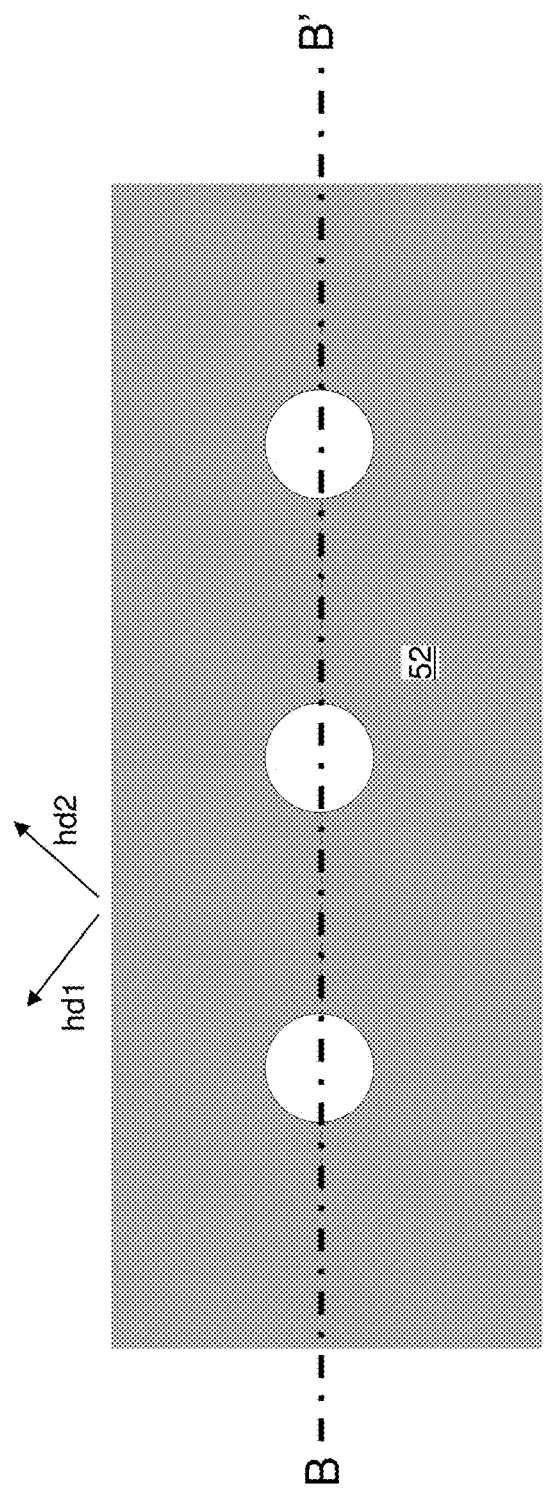
FIG. 43A is a top-down view of a region of the third exemplary structure after removal of the sacrificial cover material spacers according to the third embodiment of the present disclosure.
Figure 43B:
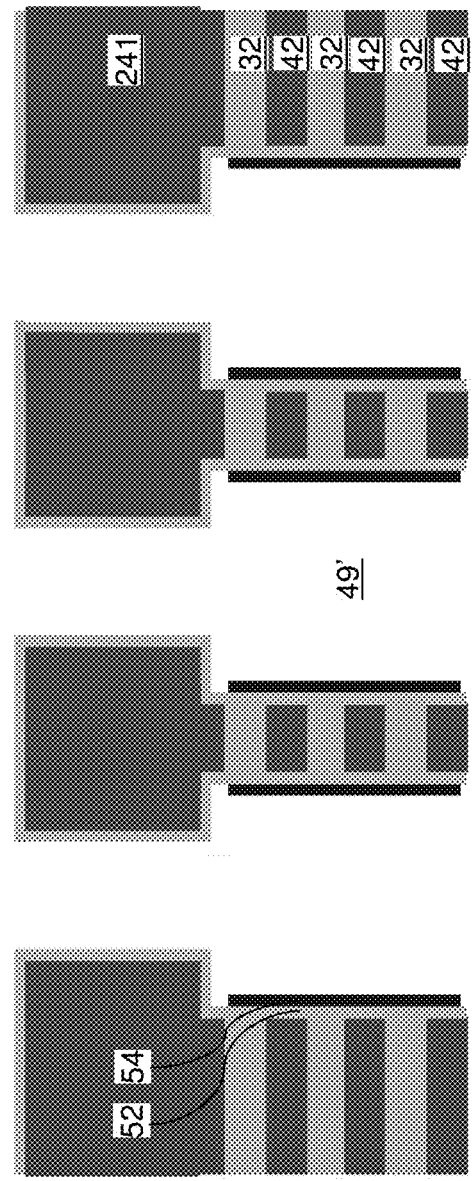
FIG. 43B is a vertical cross-sectional view of the third exemplary structure of FIG. 43A along the vertical plane B-B'.

Referring to FIGS. 43A and 43B, the cover material portions 38 can be removed selective to the materials of the charge storage layers 54 and the blocking dielectrics 52 to leave a memory cavity 49'. For example, if the cover material portions 38 include a semiconductor material such as amorphous silicon, a wet etch process employing hot trimethyl-2 hydroxyethyl ammonium hydroxide ("hot TMY") or tetramethyl ammonium hydroxide (TMAH) can be employed to remove the cover material portions 38. If the cover material portions 38 comprise carbon, the cover material portions 38 can be removed by ashing.

Figure 44A:
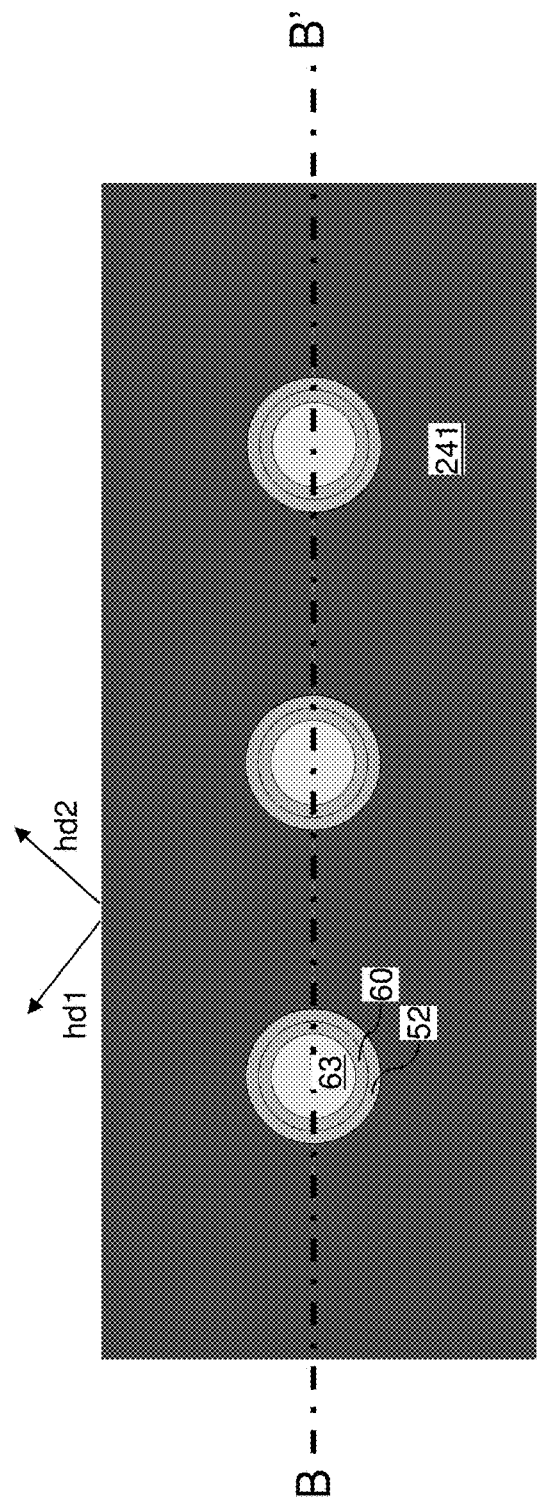
FIG. 44A is a top-down view of a region of the third exemplary structure after formation of tunneling dielectric layers, semiconductor channels, dielectric cores, and drain regions according to the third embodiment of the present disclosure.
Figure 44B:
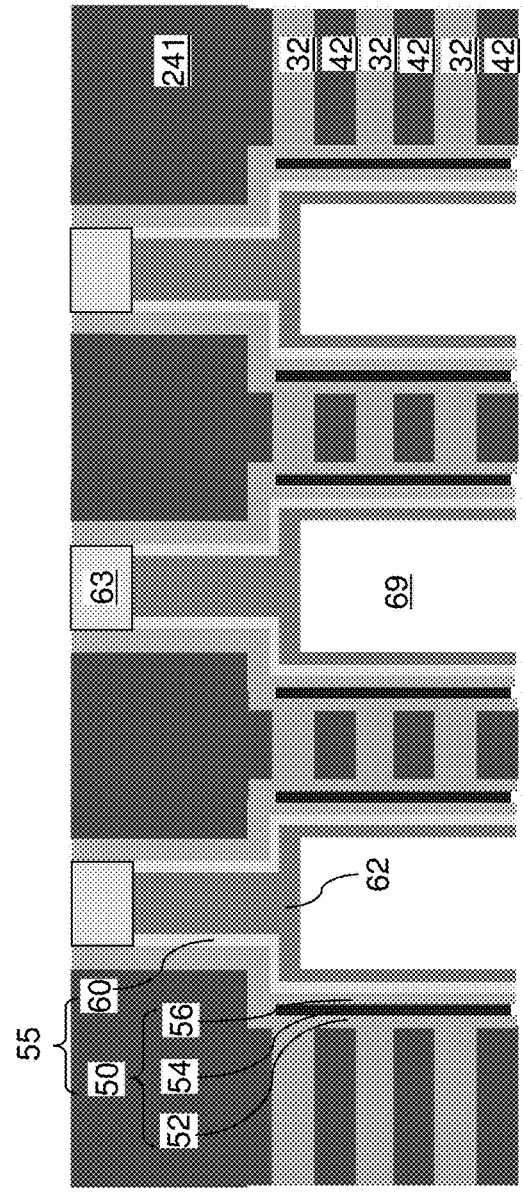
FIG. 44B is a vertical cross-sectional view of the third exemplary structure of FIG. 44A along the vertical plane B-B'.

Referring to FIGS. 44A and 44B, a tunneling dielectric 56 and a semiconductor channel material layer can be formed as continuous material layers at the periphery of each memory cavity 49' by conformal deposition processes. The semiconductor channel material layer can have a doping of the first conductivity type as in the first and second embodiments. A dielectric material is deposited on the semiconductor channel material layer and is vertically recessed to form dielectric cores 62. The top surfaces of the dielectric cores 62 can be located between the first horizontal plane including the top surface of the sacrificial template layer 241 and the second horizontal plane including the bottommost surface of the sacrificial template layer 241. Core cavities (i.e., air gaps) 69 can be formed in the volumes within the dielectric cores 62 that are not filled with the material of the dielectric cores 62. Each dielectric core 62 can embed a core cavity 69 that is devoid of any solid material therein. An upper cylindrical portion of each dielectric core 62 protrudes above the respective core cavity 69 above a horizontal plane including a bottom surface of the sacrificial template layer 241. Each core cavity 69 can have a maximum lateral dimension mldc that is greater than a maximum lateral dimension of the upper cylindrical portion of the dielectric core 62.

A semiconductor fill material can be deposited in recesses above the top surfaces of the dielectric cores 62. Portions of the blocking dielectric 52, the charge storage layer 54, the tunneling dielectric 56, the semiconductor channel material layer, and the semiconductor fill material located above the horizontal plane including the top surface of the sacrificial template layer 241 can be removed by a planarization process such as chemical mechanical planarization. Each remaining portion of the semiconductor fill material constitutes a drain region 63.

The continuous material layer of the blocking dielectric 52 is divided into multiple discrete blocking dielectrics 52 located within a respective one of the memory openings 49. The continuous material layer of the tunneling dielectric 56 is divided into multiple discrete tunneling dielectrics 56. Remaining portions of the semiconductor channel material layer include multiple discrete semiconductor channels 60. Each contiguous combination of a blocking dielectric 52, a charge storage layer 54, and a tunneling dielectric 56 constitutes a memory film 50. Each contiguous combination of a memory film 50 and a semiconductor channel 60 constitutes a memory stack structure 55. Each memory film 50 comprises a first vertically-extending portion that extends vertically through the alternating stack (32, 42) with a first sidewall (which may be an inner sidewall or an outer sidewall); a horizontally-extending portion that extends horizontally between the sacrificial template layer 241 and a topmost one of the sacrificial material layers 42; and a second vertically-extending portion that extends vertically through the sacrificial template layer 241.

Each sacrificial pillar structure 48 is replaced with a memory opening fill structure 58. Each memory opening structure 58 comprises a respective set of a memory film 50, a semiconductor channel 60, a dielectric core 62, a core cavity 69, and a drain region 63.

In one embodiment, each memory film 50 comprises a stack of a blocking dielectric 52, a charge storage layer 54, and a tunneling dielectric 56; and the entirety of the charge storage layer 54 is located below a bottom surface of the sacrificial template layer 241. Dielectric cores 62 can be embedded within a respective one of the semiconductor channels 60 and can include a respective upper cylindrical portion embedded within the sacrificial template layer 241. The core cavities 69 can be embedded within a respective one of the dielectric cores 62, and can have a maximum lateral dimension mldc that is greater than a maximum lateral dimension of an overlying one of the upper cylindrical portions of the dielectric cores 62.

In one embodiment, each memory film 50 can be formed as a stack of a blocking dielectric 52, a charge storage layer 54, and a tunneling dielectric 56, and the charge storage layer 54 can be patterned such that the charge storage layer 54 does not protrude above a horizontal plane including a bottom surface of the sacrificial template layer 241 while each of the blocking dielectric 52 and the tunneling dielectric 56 protrudes above the horizontal plane including the bottom surface of the sacrificial template layer 241.

Figure 45A:
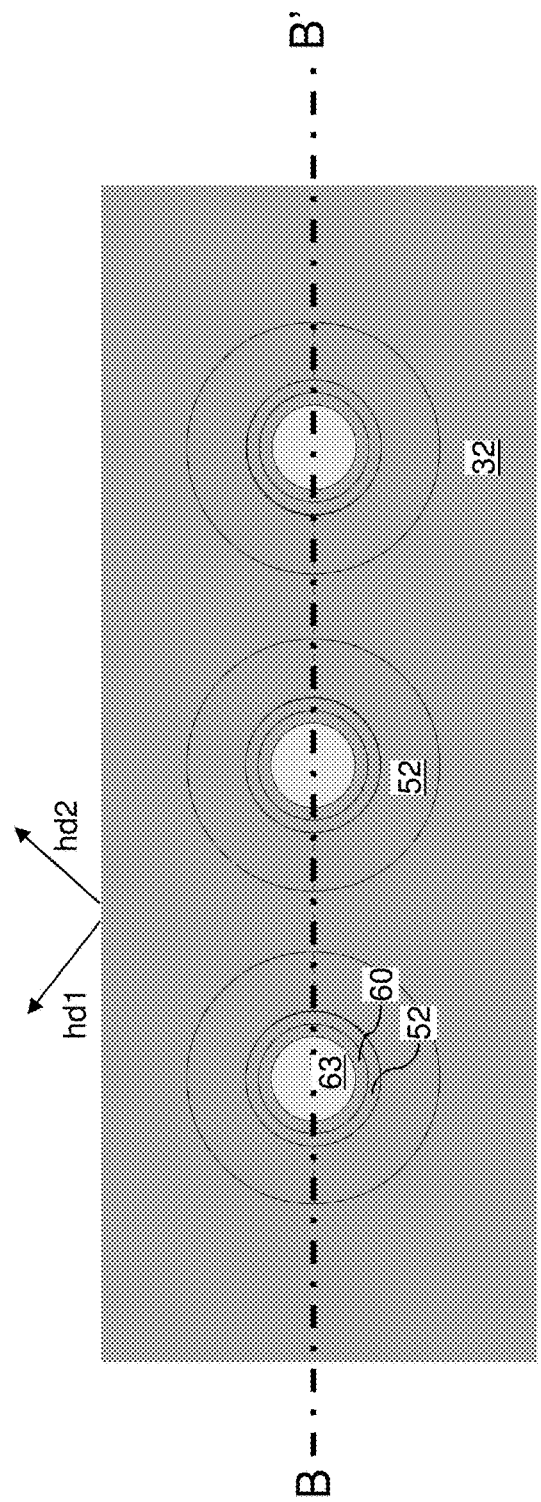
FIG. 45A is a top-down view of a region of the third exemplary structure after removal of the sacrificial template layer according to the third embodiment of the present disclosure.
Figure 45B:
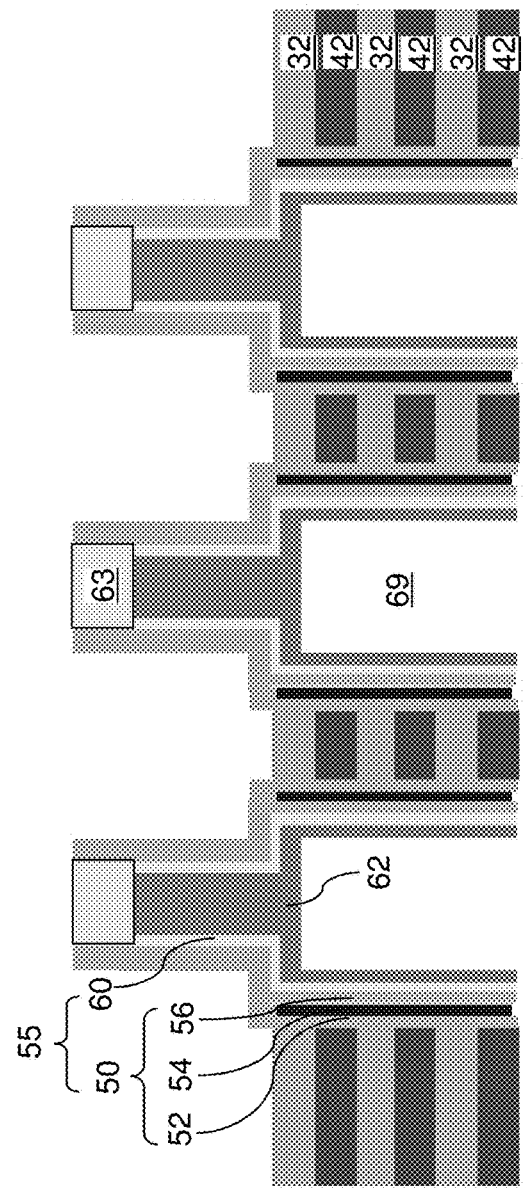
FIG. 45B is a vertical cross-sectional view of the third exemplary structure of FIG. 45A along the vertical plane B-B'.

Referring to FIGS. 45A and 45B, the processing steps of FIGS. 32A and 32B can be performed to remove the sacrificial template layer 241 selective to the memory films 50 and the drain regions 63. For example, if the sacrificial template layer 241 includes silicon nitride, a wet etch process employing hot phosphoric acid can be employed to remove the sacrificial template layer 241. Outer sidewalls of the upper portions of the memory films 50 and annular top surfaces of the memory films 50 (i.e., annular top surfaces of the tunneling dielectric layers 56 and annular top surfaces of the blocking dielectric layers 52) can be physically exposed after removal of the sacrificial template layer 241.

Referring to FIGS. 46A and 46B, the processing steps of FIGS. 16A and 16B can be performed to form a continuous metallic material layer 146L.

Figure 47A:
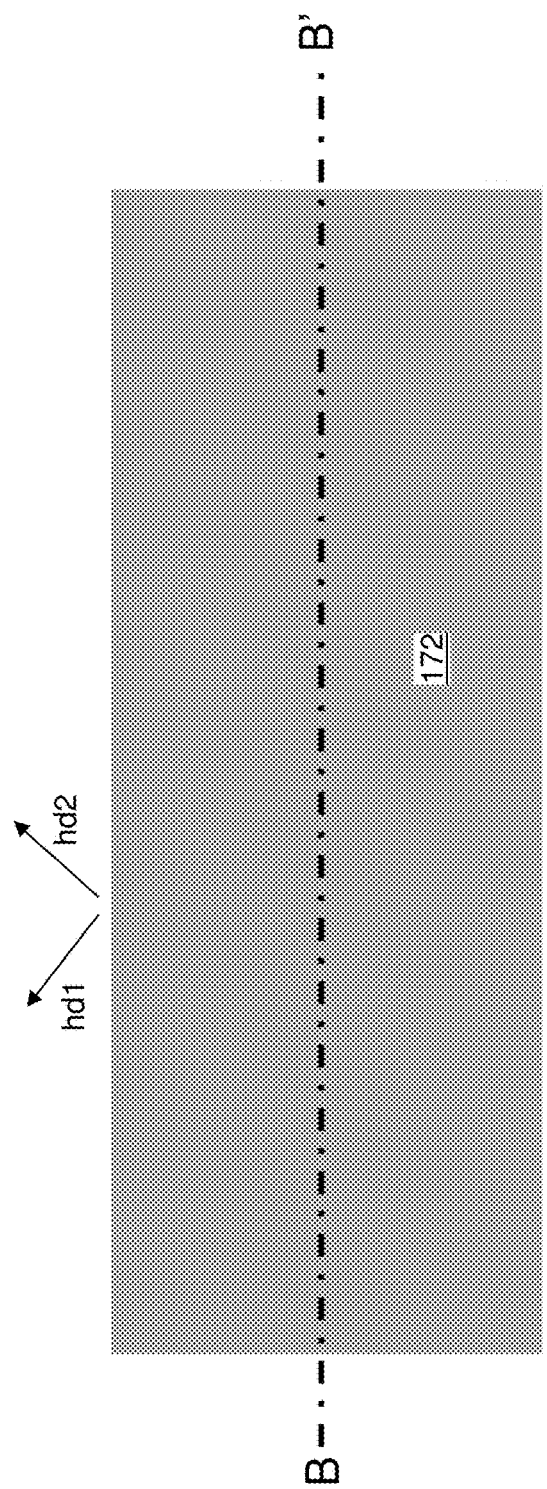
FIG. 47A is a top-down view of a region of the third exemplary structure after formation of a dielectric matrix layer according to the third embodiment of the present disclosure.
Figure 47B:
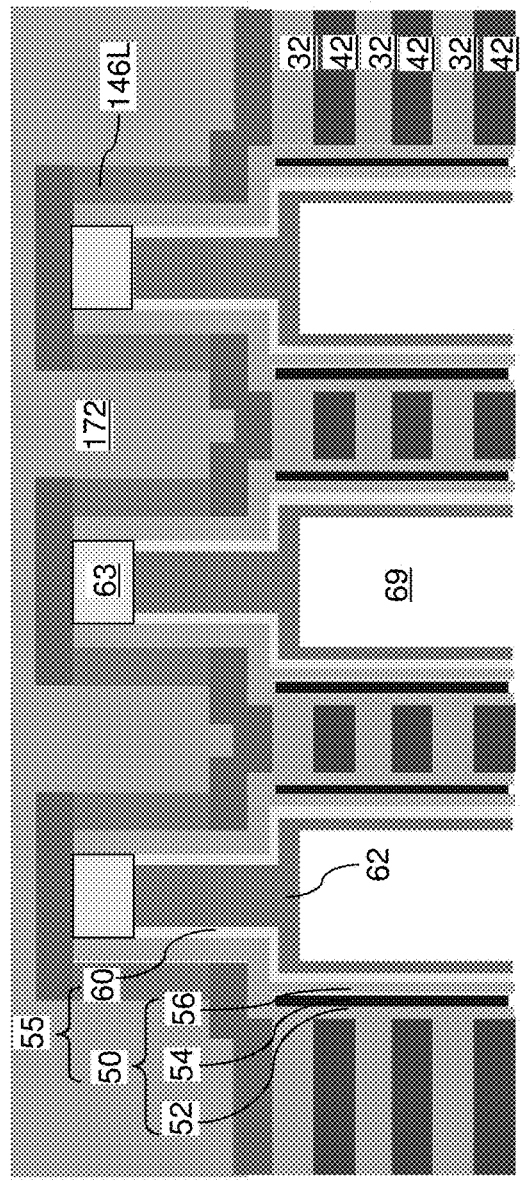
FIG. 47B is a vertical cross-sectional view of the third exemplary structure of FIG. 47A along the vertical plane B-B'.

Referring to FIGS. 47A and 47B, a dielectric material can be deposited over the continuous metallic material layer 146L by a conformal or non-conformal deposition process. A dielectric matrix layer 172 is formed. The dielectric material of the dielectric matrix layer 172 can include undoped silicate glass, doped silicate glass, organosilicate glass, or a combination thereof. For example, the dielectric matrix layer 172 can include silicon oxide.

Figure 48A:
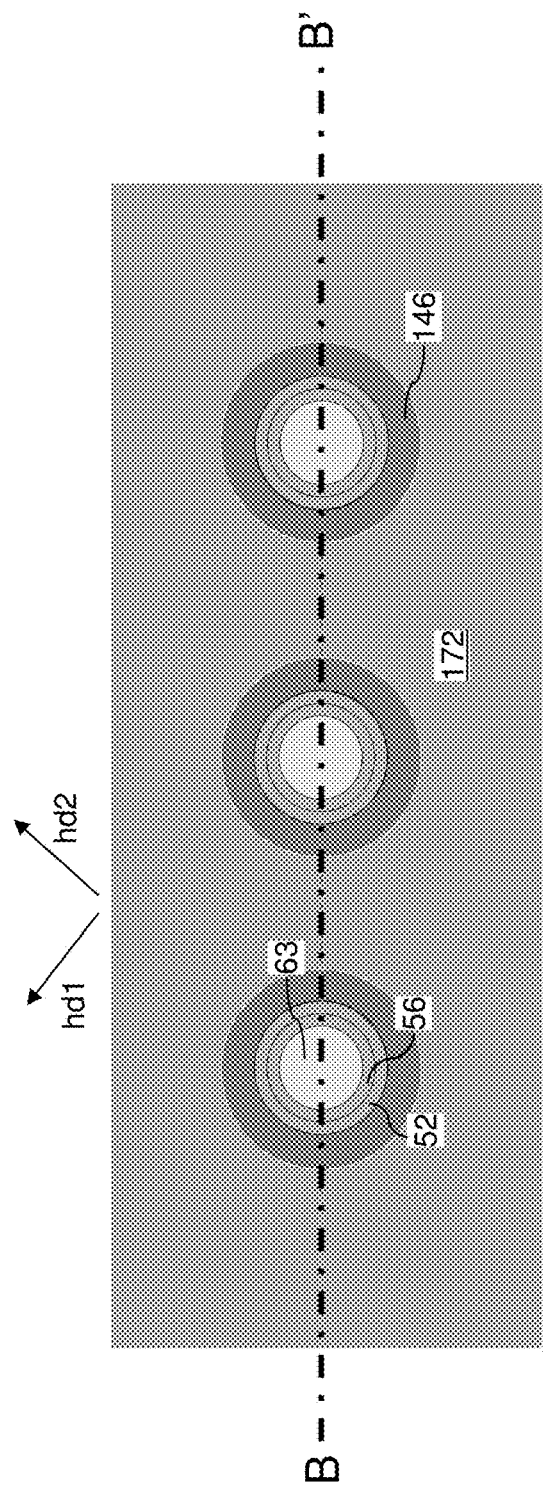
FIG. 48A is a top-down view of a region of the third exemplary structure after planarization of the dielectric matrix layer according to the third embodiment of the present disclosure.
Figure 48B:
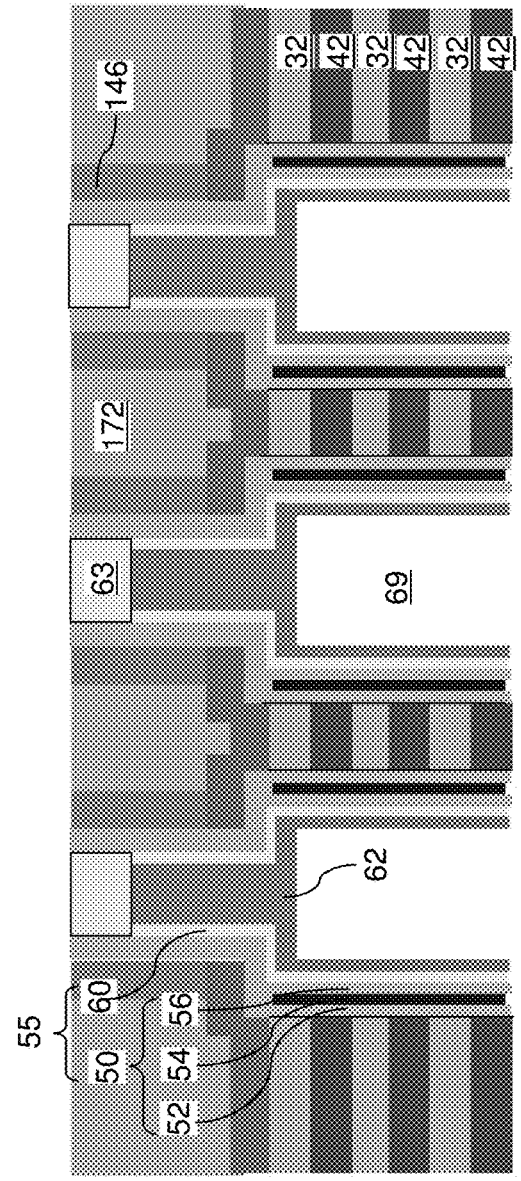
FIG. 48B is a vertical cross-sectional view of the third exemplary structure of FIG. 48A along the vertical plane B-B'.

Referring to FIGS. 48A and 48B, the processing steps of FIGS. 18A and 18B can be performed to planarize the dielectric matrix layer 172 and the continuous metallic material layer 146L. For example, portions of the dielectric matrix layer 172 and the continuous metallic material layer 146L that overlie the horizontal plane including the top surfaces of the drain regions 63 can be removed by chemical mechanical planarization. Top surfaces of the drain regions 63 can be physically exposed. Further, annular top surfaces of the continuous metallic material layer 146L can be physically exposed after the planarization process.

Figure 49A:
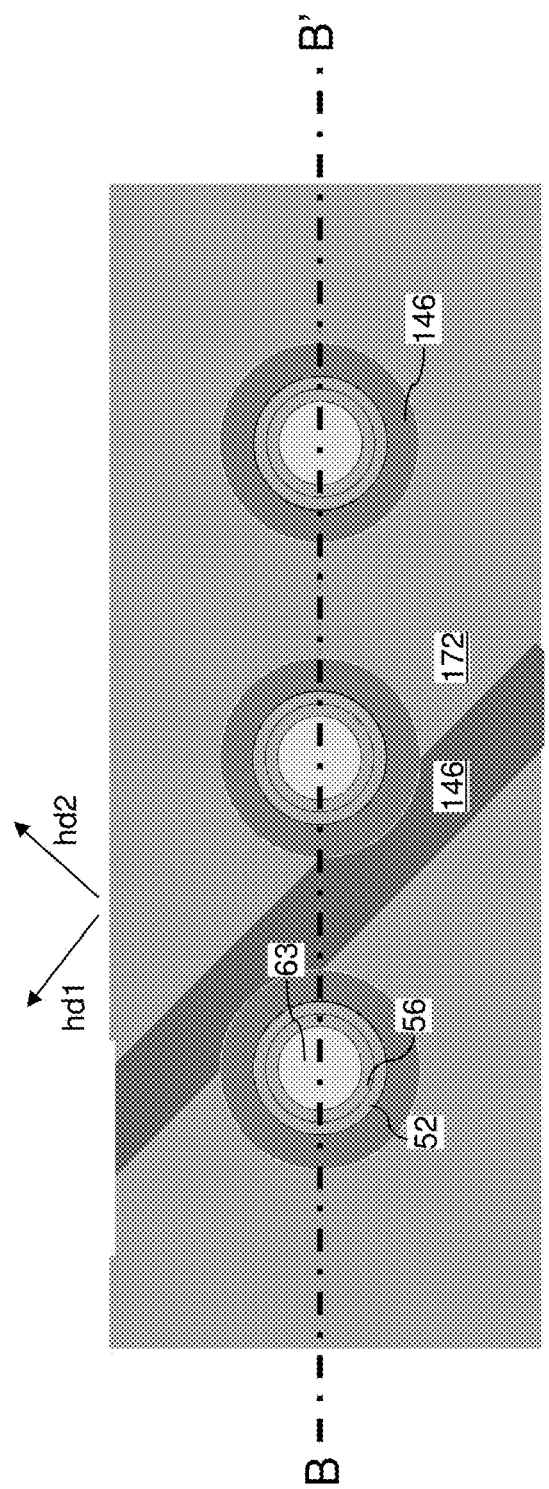
FIG. 49A is a top-down view of a region of the third exemplary structure after formation of drain-select-level line trenches according to the third embodiment of the present disclosure.
Figure 49B:
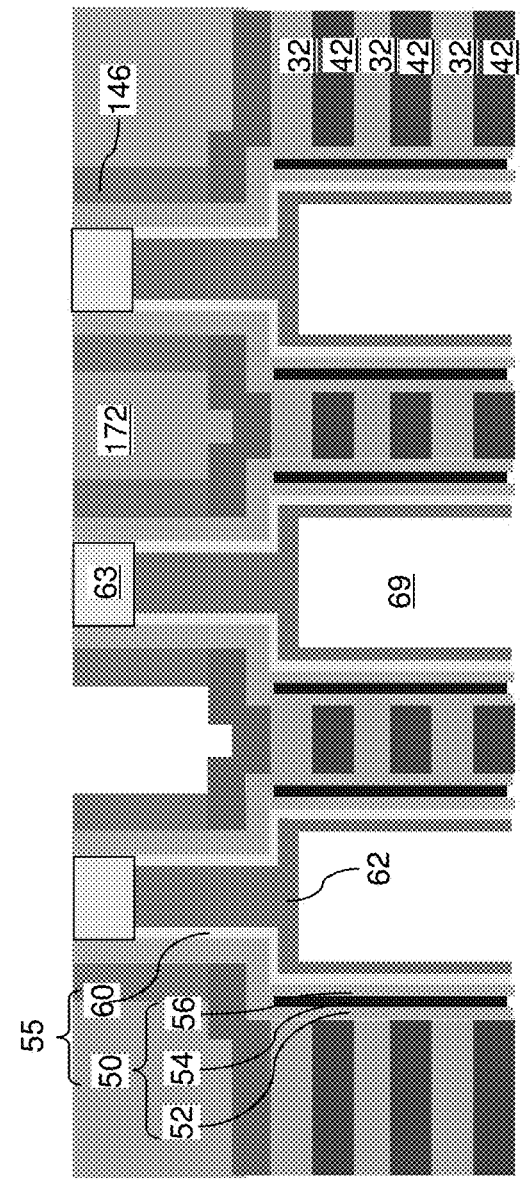
FIG. 49B is a vertical cross-sectional view of the third exemplary structure of FIG. 49A along the vertical plane B-B'.

Referring to FIGS. 49A and 49B, the processing steps of FIGS. 19A and 19B can be performed to form drain-select-level line trenches 179. The drain-select-level line trenches 179 include a respective pair of laterally undulating sidewalls that generally extend along the first horizontal direction hd1. Each of the drain-select-level line trenches 179 can have a laterally alternating sequence of vertical planar sidewall segments and vertical convex sidewall segments. The vertical planar sidewall segments of each laterally undulating sidewall can be sidewall segments of a patterned portion of the dielectric matrix layer 172, and can be located within a same vertical plane. The vertical convex sidewall segments of each laterally undulating sidewall can be physically exposed cylindrical sidewall segments of the continuous metallic material layer 146L. Each vertical convex sidewall segment has a convex profile in a horizontal cross-sectional view, and extends vertically along the vertical direction with the same horizontal cross-sectional profile.

Referring to FIGS. 50A and 50B, physically exposed portions of the continuous metallic material layer 146L can be anisotropically etched. Unmasked portions of the continuous metallic material layer 146L can be removed by the anisotropic etch process. The anisotropic etch process patterns the continuous metallic material layer 146L into drain-select-level gate electrodes 146. Thus, the drain-select-level gate electrodes 146 comprise remaining portions of the continuous metallic material layer 146L.

Horizontal portions of the continuous metallic material layer 146L that overlie the memory opening fill structures 58 or located within areas of a respective uniform width between a respective pair of rows of memory opening fill structures 58 can be removed. Each of the drain-select-level gate electrodes 146 can include a planar portion having two sets of vertical sidewall segments and a set of cylindrical portions vertically protruding upward from the planar portion and laterally surrounding a respective one of the memory stack structures 55. Each set of vertical sidewall segments of a drain-select-level gate electrode 146 can be located within a respective vertical plane.

Referring to FIGS. 51A and 51B, a contact level dielectric layer 174 can be formed by depositing a dielectric material such as silicon oxide. The contact level dielectric layer 174 is formed in volumes from which portions of the continuous metallic material layer 146L are removed. The contact level dielectric layer 174 can include isolation dielectric portions (174L, 174P). Each isolation dielectric portion (174L, 174P) can include a dielectric line portion 174L laterally extending along the first horizontal direction hd1, contacting sidewall segments of two planar portions of the drain-select-level gate electrodes 146, and sidewalls of two rows of cylindrical portions of the drain-select-level gate electrodes 146. Each isolation dielectric portion (174L, 174P) can include a plurality of loop portions 174P adjoined to sides of the dielectric line portion 174L and overlying a respective cylindrical portion among the two rows of cylindrical portions of the drain-select-level gate electrodes 146.

In one embodiment, each sidewall of the plurality of loop portions 174P is vertically coincident with a sidewall of an underlying one of the plurality of cylindrical portions of the drain-select-level gate electrodes 146. The contact level dielectric layer 174 can include annular dielectric portions 174A overlying additional cylindrical portions of the drain-select-level gate electrodes 146. The annular dielectric portions 174A comprise a same material as the isolation dielectric portion (174L, 174P) and are laterally spaced from the isolation dielectric portion (174L, 174P).

Referring to FIGS. 52A and 52B, the processing steps of FIGS. 22A-22H, 23A, 23B, 24A, and 24B can be performed to replace the in-process source level material layers 10' with source level material layers 10, to replace the sacrificial material layers 42 with electrically conductive layers 46, to form dielectric wall structures 76, and to form drain contact via structures 88. Subsequently, additional contact via structures and metal interconnect structures can be formed as in the first embodiment.

In one embodiment, each memory opening fill structure 58 among the memory opening fill structures 58 comprises a vertical axis VA passing through a geometrical center GC of the memory opening fill structure 58. As used herein, a geometrical center of an element refers to the center of gravity of a hypothetical object occupying the same volume as the element and having a homogeneous composition throughout. An inner sidewall of a most proximal one of the cylindrical portions of the drain-select-level gate electrodes 146 can be more proximal to the vertical axis VA than the electrically conducive layers 46 are to the vertical axis VA due to the bottle-shaped profile of the memory opening fill structures 58. In one embodiment, an outer sidewall of the most proximal one of the cylindrical portions of the drain-select-level gate electrodes 146 can be more proximal to the vertical axis VA than the electrically conductive layers 46 are to the vertical axis VA.

In one embodiment, the continuous metallic material layer 146L can be formed by a conformal deposition process, and the lateral thickness of each of the cylindrical portions of the drain-select-level gate electrodes 146 can be the same as the vertical thickness of the planar portions of the drain-select-level gate electrodes 146. In one embodiment, vertical sidewall segments within each set of vertical sidewall segments of a drain-select-level gate electrode 146 can be adjoined to outer sidewalls of a row of cylindrical portions of the drain-select-level gate electrode 146.

The embodiments of the present disclosure provide the following one or more non-limiting advantages. The drain select transistor comprising the drain-select-level gate electrode 146, the second vertically-extending portion of the semiconductor channel 60 and the gate dielectric comprising at least a portion of the memory film 50 located there between has a smaller width (e.g., smaller diameter) than prior art select transistors. This improves the transistor performance by providing a stronger curvature effect, shorter gate length, and smaller space occupied by the transistor. This permits a larger space for the isolation dielectric portion 174 which separates adjacent drain select transistors and improved process integration and accuracy. Finally, the air gap improves the select transistor performance.

Referring to all drawings and according to various embodiments of the present disclosure, a three-dimensional memory device is provided, which comprises: an alternating stack of insulating layers 32 and electrically conductive layers 46 located over a substrate 8; drain-select-level gate electrodes 46 located over the alternating stack (32, 46); memory openings (which has the same volume as the bottle-shaped memory cavities 49″) extending through the alternating stack (32, 46) and a respective one of the drain-select-level gate electrodes 146; and memory opening fill structures 58 located in the memory openings, wherein each of the memory opening fill structures 58 comprises a respective semiconductor channel 60. Each semiconductor channel 60 comprises: a respective first vertically-extending portion extending through levels of the electrically conductive layers 46 and having a first maximum lateral channel dimension mlcd1, and a respective second vertically-extending portion located at a level of the drain-select-level gate electrodes 146 and having a second maximum lateral channel dimension mlcd2 that is less than the first maximum lateral channel dimension mlcd1. Each of the drain-select-level gate electrodes 146 includes: a planar portion having two sets of vertical sidewall segments, wherein each set of vertical sidewall segments is located within a respective vertical plane; and a set of cylindrical portions vertically protruding upward from the planar portion and laterally surrounding a respective one of the memory opening fill structures 58.

In one embodiment, the three-dimensional memory device comprises an isolation dielectric portion (174L, 174P) that includes: a dielectric line portion 174L laterally extending along a first horizontal direction hd1, contacting sidewall segments of two planar portions of the drain-select-level gate electrodes 146, and sidewalls of two rows of cylindrical portions of the drain-select-level gate electrodes 146; and a plurality of loop portions 174P adjoined to sides of the dielectric line portion 174L and overlying a respective cylindrical portion among the two rows of cylindrical portions of the drain-select-level gate electrodes 146.

In one embodiment, each sidewall of the plurality of loop portions 174P is vertically coincident with a sidewall of an underlying one of the plurality of cylindrical portions of the drain-select-level gate electrodes 146.

In one embodiment, the three-dimensional memory device comprises annular dielectric portions 174A overlying additional cylindrical portions of the drain-select-level gate electrodes 146. The annular dielectric portions 174A comprise the same material as the isolation dielectric portion (174L, 174P) and are laterally spaced from the isolation dielectric portion (174L, 174P).

In one embodiment, a first memory opening fill structure 58 among the memory opening fill structures comprises a vertical axis VA passing through a geometrical center GC of the first memory opening fill structure; and an inner sidewall of a most proximal one of the cylindrical portions of the drain-select-level gate electrodes 146 is more proximal to the vertical axis VA than the electrically conducive layers 46 are to the vertical axis VA. In one embodiment, an outer sidewall of the most proximal one of the cylindrical portions of the drain-select-level gate electrodes 46 is more proximal to the vertical axis VA than the electrically conductive layers 46 are to the vertical axis VA.

In one embodiment, the lateral thickness of each of the cylindrical portions of the drain-select-level gate electrodes 146 is the same as the vertical thickness of the planar portions of the drain-select-level gate electrodes 146.

In one embodiment, vertical sidewall segments within each set of vertical sidewall segments of the drain-select-level gate electrodes 146 are adjoined to outer sidewalls of a row of cylindrical portions of one of the drain-select-level gate electrodes 146.

In one embodiment, each semiconductor channel 60 comprises a respective annular portion having an outer periphery that is adjoined to an upper end of the respective first vertically-extending portion and an inner periphery that is adjoined to a lower end of the respective second vertically-extending portion. In one embodiment, each semiconductor channel 60 is laterally surrounded by a memory film 50 that includes: a first vertical memory film portion that contacts, and laterally surrounds, the respective first vertically-extending portion of one of the semiconductor channels 60; a second vertical memory film portion that contacts, and laterally surrounds, the respective second vertically-extending portion of the one of the semiconductor channels 60; and an annular memory film portion that contacts, and overlies, the annular portion of the one of the semiconductor channels 60.

In some embodiments, each of the first vertical memory film portion and the second vertical memory film portion comprises a respective portion of a blocking dielectric layer 52, a respective portion of a charge storage layer 54, and a respective portion of a tunneling dielectric layer 56 as in the first and second exemplary structures. In some embodiments, the first vertical memory film portion comprises a portion of a blocking dielectric layer 52, a portion of a charge storage layer 54, and a portion of a tunneling dielectric layer 56; and the annular memory film portion comprises another portion of the blocking dielectric layer 52 in direct contact with another portion of the tunneling dielectric layer 56 as in the third exemplary structure.

In some embodiments, each of the memory opening fill structures 58 comprises an encapsulated cavity (i.e., a core cavity 69) that vertically extends through each level of the electrically conductive layers 46. In one embodiment, each of the memory opening fill structures 58 comprises a dielectric core 62; the dielectric core 62 includes a closed inner surface that defines an entire volume of the encapsulated cavity 69; and the dielectric core 62 includes a neck portion located above the encapsulated cavity 69 and protrudes through a respective one of the drain-select-level gate electrodes 146.

Each of the exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion 60 of each of the plurality of semiconductor channels 60 extends substantially perpendicular to a top surface of the substrate 8 and comprising a respective one of the semiconductor channels 60; and a plurality of charge storage elements (as embodied as portions of the memory films 50, i.e., portions of the charge storage layer 54). Each charge storage element can be located adjacent to a respective one of the plurality of semiconductor channels 60.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
an alternating stack of insulating layers and electrically conductive layers located over a substrate;
drain-select-level gate electrodes located over the alternating stack;
memory openings extending through the alternating stack and a respective one of the drain-select-level gate electrodes; and
memory opening fill structures located in the memory openings,
wherein each of the memory opening fill structures comprises a respective semiconductor channel;
wherein each semiconductor channel comprises:
a respective first vertically-extending portion extending through levels of the electrically conductive layers and having a first maximum lateral channel dimension, and
a respective second vertically-extending portion located at a level of the drain-select-level gate electrodes and having a second maximum lateral channel dimension that is less than the first maximum lateral channel dimension; and
wherein each of the drain-select-level gate electrodes comprises:
a planar portion having two sets of vertical sidewall segments; and a set of cylindrical portions vertically protruding upward from the planar portion and laterally surrounding a respective one of the memory opening fill structures.

2. The three-dimensional memory device of claim 1, further comprising an isolation dielectric portion that includes:
a dielectric line portion laterally extending along a first horizontal direction, contacting sidewall segments of two planar portions of the drain-select-level gate electrodes, and sidewalls of two rows of cylindrical portions of the drain-select-level gate electrodes; and
a plurality of loop portions adjoined to sides of the dielectric line portion and overlying a respective cylindrical portion of two rows of cylindrical portions of the drain-select-level gate electrodes.

3. The three-dimensional memory device of claim 2, wherein each sidewall of the plurality of loop portions is vertically coincident with a sidewall of an underlying one of the plurality of cylindrical portions of the drain-select-level gate electrodes.

4. The three-dimensional memory device of claim 2, further comprising annular dielectric portions overlying additional cylindrical portions of the drain-select-level gate electrodes, wherein the annular dielectric portions comprise a same material as the isolation dielectric portion and are laterally spaced from the isolation dielectric portion.

5. The three-dimensional memory device of claim 1, wherein:
a first memory opening fill structure among the memory opening fill structures comprises a vertical axis passing through a geometrical center of the first memory opening fill structure; and
an inner sidewall of a most proximal one of the cylindrical portions of the drain-select-level gate electrodes is more proximal to the vertical axis than the electrically conducive layers are to the vertical axis.

6. The three-dimensional memory device of claim 5, wherein an outer sidewall of the most proximal one of the cylindrical portions of the drain-select-level gate electrodes is more proximal to the vertical axis than the electrically conductive layers are to the vertical axis.

7. The three-dimensional memory device of claim 1, wherein a lateral thickness of each of the cylindrical portions of the drain-select-level gate electrodes is the same as a vertical thickness of the planar portions of the drain-select-level gate electrodes.

8. The three-dimensional memory device of claim 1, wherein vertical sidewall segments within each set of vertical sidewall segments are adjoined to outer sidewalls of a row of cylindrical portions of one of the drain-select-level gate electrodes.

9. The three-dimensional memory device of claim 1, wherein each semiconductor channel comprises a respective annular portion having an outer periphery that is adjoined to an upper end of the respective first vertically-extending portion and an inner periphery that is adjoined to a lower end of the respective second vertically-extending portion.

10. The three-dimensional memory device of claim 9, wherein each semiconductor channel is laterally surrounded by a memory film that includes:
a first vertical memory film portion that contacts, and laterally surrounds, the respective first vertically-extending portion of one of the semiconductor channels;
a second vertical memory film portion that contacts, and laterally surrounds, the respective second vertically-extending portion of the one of the semiconductor channels; and
an annular memory film portion that contacts, and overlies, the annular portion of the one of the semiconductor channels.

11. The three-dimensional memory device of claim 10, wherein each of the first vertical memory film portion and the second vertical memory film portion comprises a respective portion of a blocking dielectric layer, a respective portion of a charge storage layer, and a respective portion of a tunneling dielectric layer.

12. The three-dimensional memory device of claim 10, wherein:
the first vertical memory film portion comprises a portion of a blocking dielectric layer, a portion of a charge storage layer, and a portion of a tunneling dielectric layer; and
the annular memory film portion comprises another portion of the blocking dielectric layer in direct contact with another portion of the tunneling dielectric layer.

13. The three-dimensional memory device of claim 1, wherein each of the memory opening fill structures further comprises an encapsulated cavity that vertically extends through each level of the electrically conductive layers.

14. The three-dimensional memory device of claim 13, wherein:
each of the memory opening fill structures comprises a dielectric core;
the dielectric core includes a closed inner surface that defines an entire volume of the encapsulated cavity; and
the dielectric core includes a neck portion located above the encapsulated cavity and protrudes through a respective one of the drain-select-level gate electrodes.

* * * * *